United States Patent
Kajiwara et al.

(10) Patent No.: US 12,094,737 B2
(45) Date of Patent: Sep. 17, 2024

(54) SUBSTRATE PROCESSING APPARATUS, CONTROL METHOD, AND COMPUTER-READABLE STORAGE MEDIUM

(71) Applicant: Tokyo Electron Limited, Tokyo (JP)

(72) Inventors: Masayuki Kajiwara, Koshi (JP); Katsunori Ichino, Koshi (JP); Daisuke Ishimaru, Koshi (JP); Takuya Tajiri, Koshi (JP); Atsushi Yamamoto, Koshi (JP); Masato Imamura, Koshi (JP); Tomohiko Muta, Koshi (JP); Tetsuro Iriyama, Koshi (JP); Takeaki Sakamoto, Koshi (JP); Hiroki Okaguchi, Koshi (JP); Kenji Adachi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 801 days.

(21) Appl. No.: 16/930,959

(22) Filed: Jul. 16, 2020

(65) Prior Publication Data

US 2021/0020464 A1  Jan. 21, 2021

(30) Foreign Application Priority Data

Jul. 19, 2019 (JP) .................................. 2019-133616
May 21, 2020 (JP) .................................. 2020-089134

(51) Int. Cl.
*H01L 21/67* (2006.01)
*B05B 1/30* (2006.01)
(Continued)

(52) U.S. Cl.
CPC ............ *H01L 21/6715* (2013.01); *B05B 1/30* (2013.01); *B05B 9/0406* (2013.01); *B05B 15/40* (2018.02)

(58) Field of Classification Search
CPC .......... H01L 21/6715; H01L 21/67017; H01L 21/0271; B05B 1/30; B05B 9/0406;
(Continued)

(56) References Cited

U.S. PATENT DOCUMENTS

2018/0065065 A1 *  3/2018  Sasa ......................... G03F 7/16

FOREIGN PATENT DOCUMENTS

| JP | 3025566 B2 * | 3/2000 | ............ B01D 53/04 |
| JP | 2017220547 A * | 12/2017 | ........... B05B 9/0406 |
| JP | 2018-46269 A | 3/2018 | |

* cited by examiner

*Primary Examiner* — Patrick Orme
(74) *Attorney, Agent, or Firm* — Nath, Goldberg & Meyer; Jerald L. Meyer; Tanya E. Harkins

(57) ABSTRACT

A substrate processing apparatus includes a discharge part including a nozzle configured to discharge a processing liquid onto a substrate; a liquid feeder configured to feed the processing liquid to the discharge part; a replenishment part configured to replenish the liquid feeder with the processing liquid to be fed to the discharge part; a connector including a switching valve configured to open/close a flow path between the replenishment part and the liquid feeder; a filter configured to remove foreign matters contained in the processing liquid; a replenishment preparation part configured to open the switching valve after reducing a pressure difference between the inside of the replenishment part and the liquid feeder; and a replenishment controller configured to start replenishment of the processing liquid from the replenishment part to the liquid feeder in a state in which the switching valve is opened by the replenishment preparation part.

12 Claims, 36 Drawing Sheets

(51) Int. Cl.
*B05B 9/04* (2006.01)
*B05B 15/40* (2018.01)

(58) Field of Classification Search
CPC ........... B05B 15/40; G03F 7/16; G03F 7/162; G03F 7/3021; B01D 35/02
See application file for complete search history.

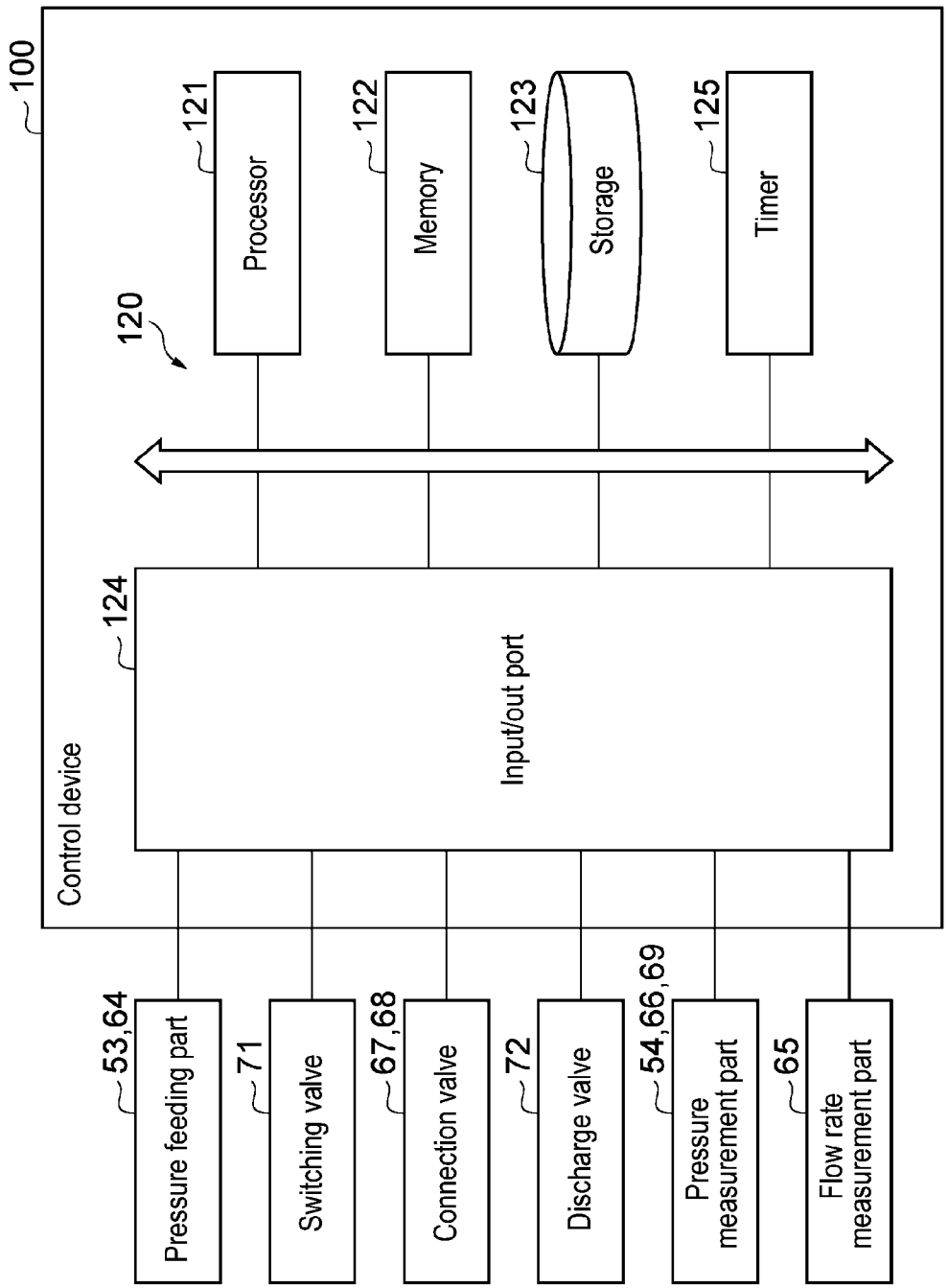

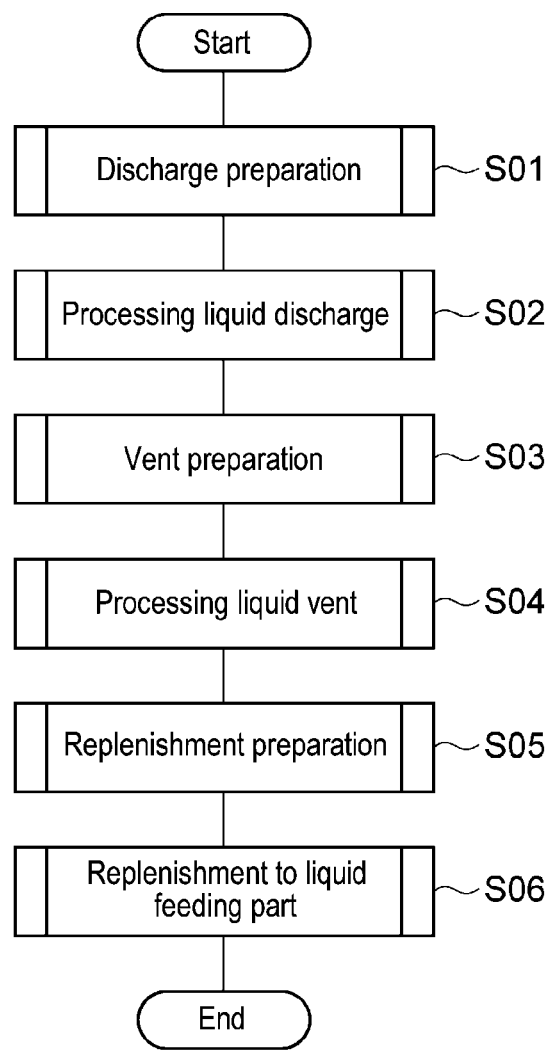

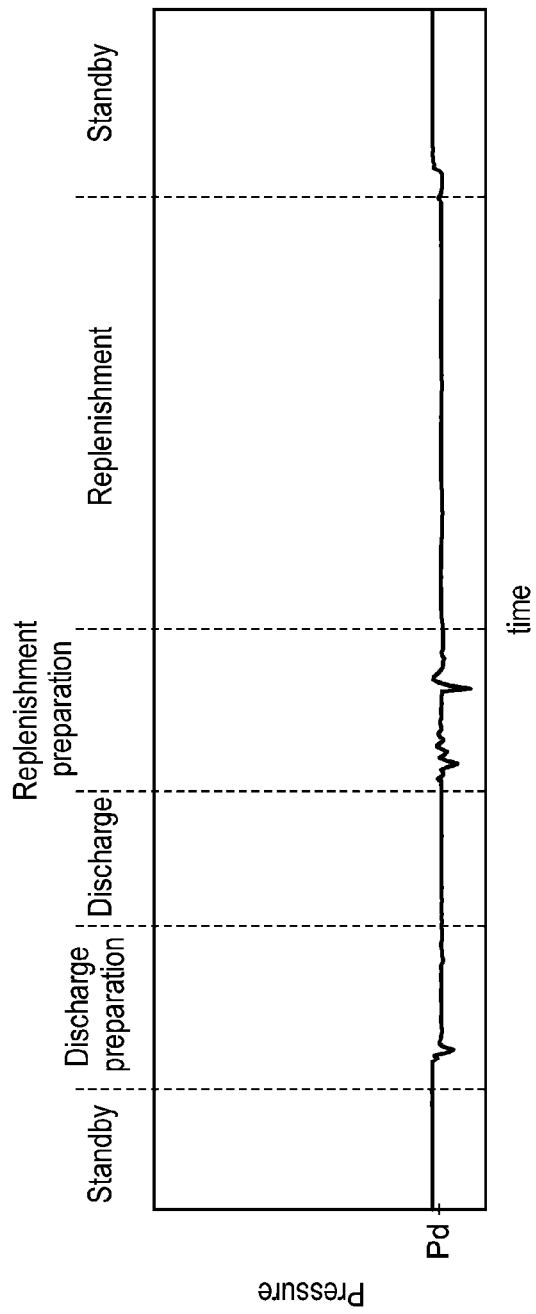

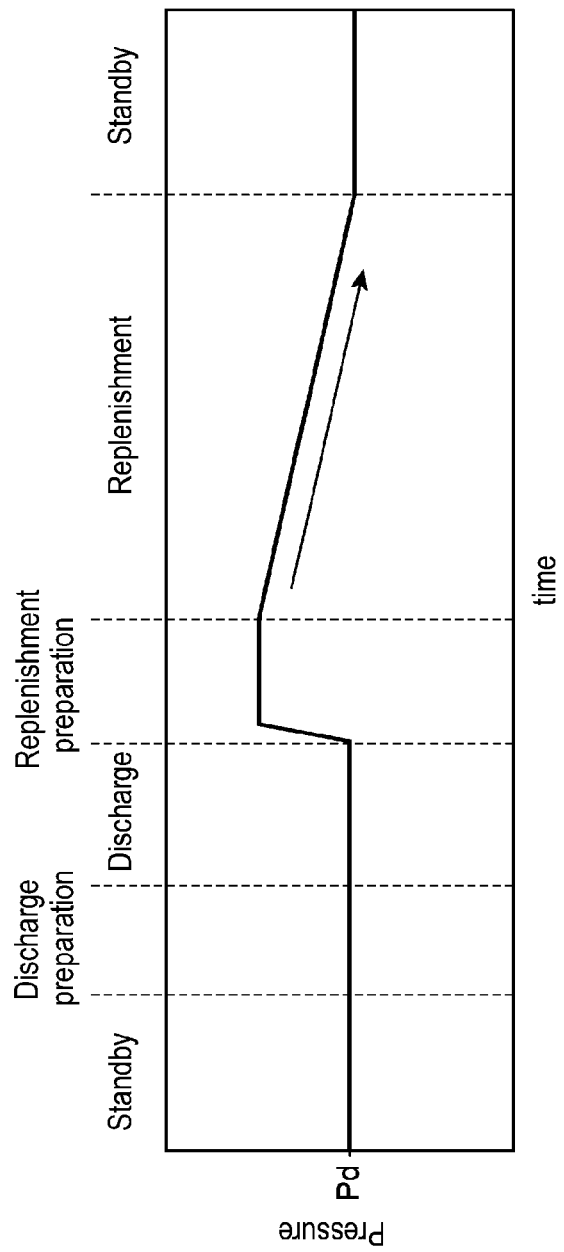

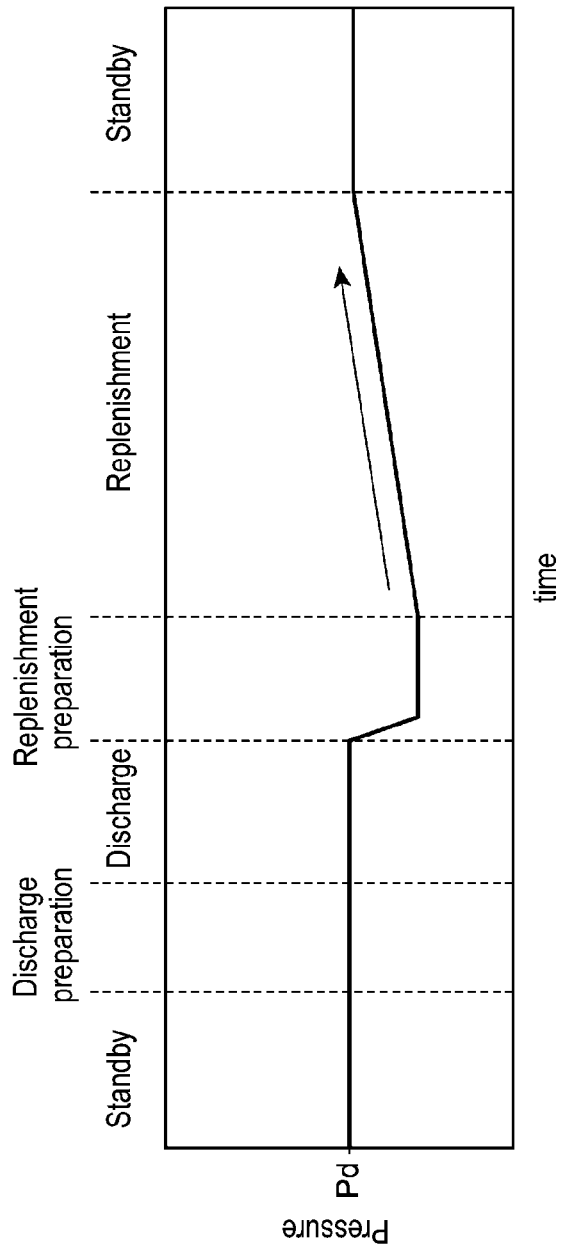

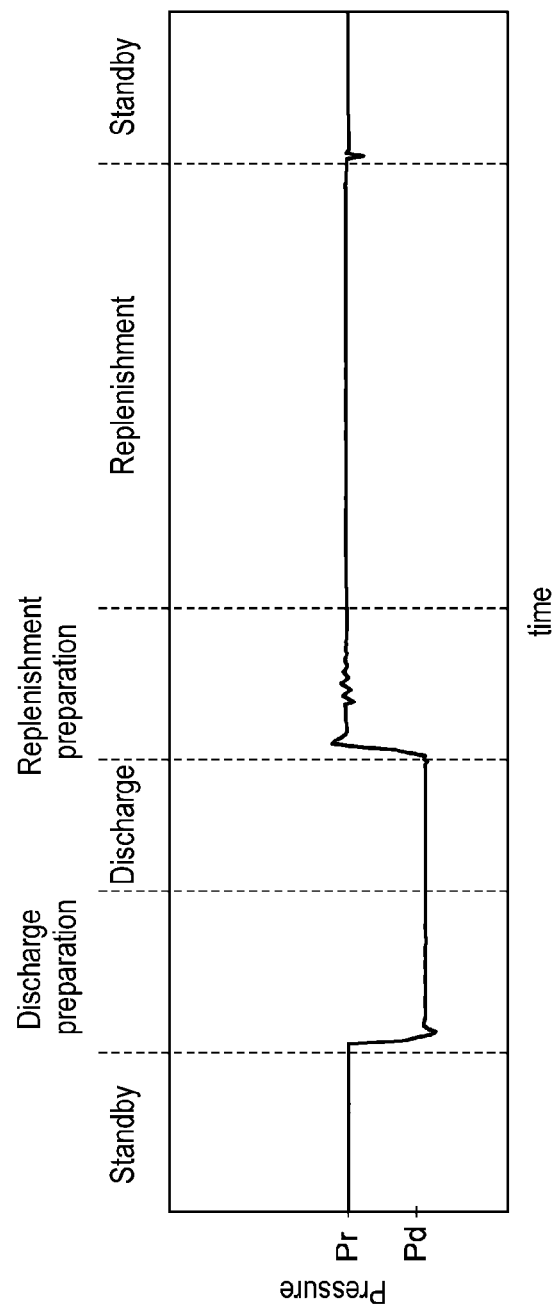

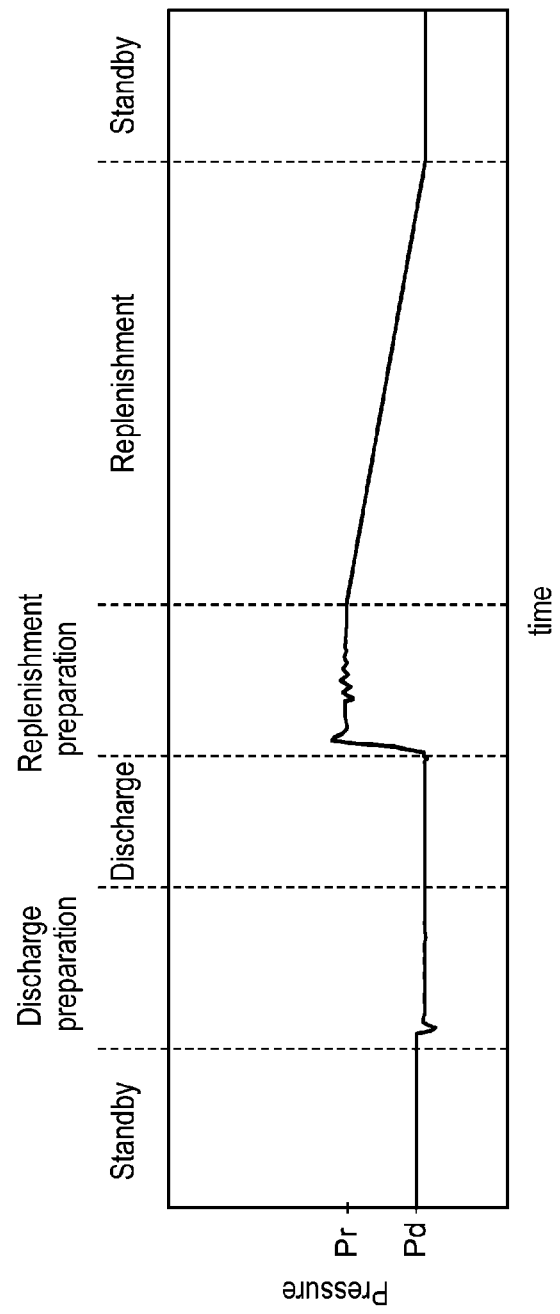

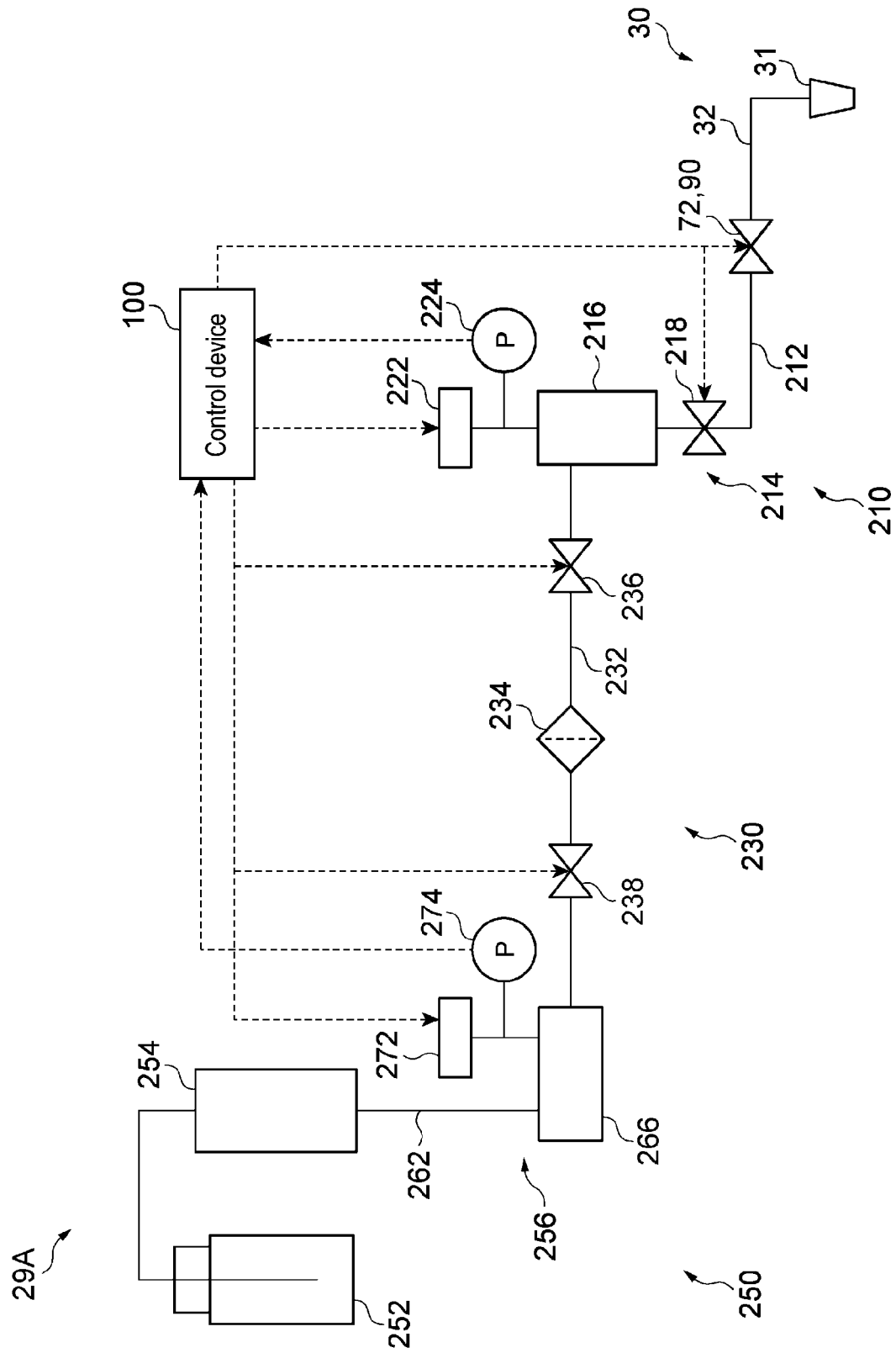

SUBSTRATE PROCESSING APPARATUS, CONTROL METHOD, AND COMPUTER-READABLE STORAGE MEDIUM

CROSS-REFERENCE TO RELATED APPLICATIONS

This application is based upon and claims the benefit of priority from Japanese Patent Application Nos. 2019-133616 and 2020-089134, filed on Jul. 19, 2019 and May 21, 2020, respectively, the entire contents of which are incorporated herein by reference.

TECHNICAL FIELD

The present disclosure relates to a substrate processing apparatus, a control method, and a computer-readable storage medium.

BACKGROUND

Patent Document 1 discloses a processing liquid supply device that supplies a processing liquid from a processing liquid supply source to a processing target object through a discharge part. This processing liquid supply device includes a first pump provided on the downstream side of the processing liquid supply source, a filter part provided on the secondary side of the first pump and configured to remove foreign matters in the processing liquid, and a second pump provided on the secondary side of the filter part. Further, the processing liquid supply device includes a controller that executes a step of allowing the processing liquid introduced into the first pump to pass through the filter part and supplying the processing liquid to the second pump.

PRIOR ART DOCUMENT

Patent Document (Patent Document 1) Japanese Patent Application Publication No. 2017-220547

SUMMARY

According to one embodiment of the present disclosure, there is provided a substrate processing apparatus, including: a discharge part including a nozzle configured to discharge a processing liquid onto a substrate; a liquid feeder configured to feed the processing liquid to the discharge part; a replenishment part configured to replenish the liquid feeder with the processing liquid to be fed to the discharge part; a connector including a switching valve configured to open and close a flow path between the replenishment part and the liquid feeder; a filter configured to remove foreign matters contained in the processing liquid replenished from the replenishment part to the liquid feeder; a replenishment preparation part configured to open the switching valve after reducing a pressure difference between the inside of the replenishment part and the inside of the liquid feeder; and a replenishment controller configured to start replenishment of the processing liquid from the replenishment part to the liquid feeder in a state in which the switching valve is opened by the replenishment preparation part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a block diagram showing an example of a hardware configuration of the control device.

FIG. 7 is a flowchart showing an example of a liquid processing procedure.

FIG. 16A and FIG. 16B are graphs showing an example of a time-dependent variation of a liquid pressure.

FIGS. 18A and 18B are graphs for explaining another example of a method of adjusting a replenishment pressure.

FIGS. 23A and 23B are graphs showing an example of the time-dependent variation of a liquid pressure.

FIG. 24 is a schematic diagram showing an example of a processing liquid supply part according to a third embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Various exemplary embodiments will be described below with reference to the drawings. In the description, the same elements or elements having the same function will be denoted by the same reference symbols, and the redundant description thereof will be omitted.

First Embodiment

First, a substrate processing system according to a first embodiment will be described with reference to FIGS. 1 to 18B.

[Substrate Processing System]

Figure 1:
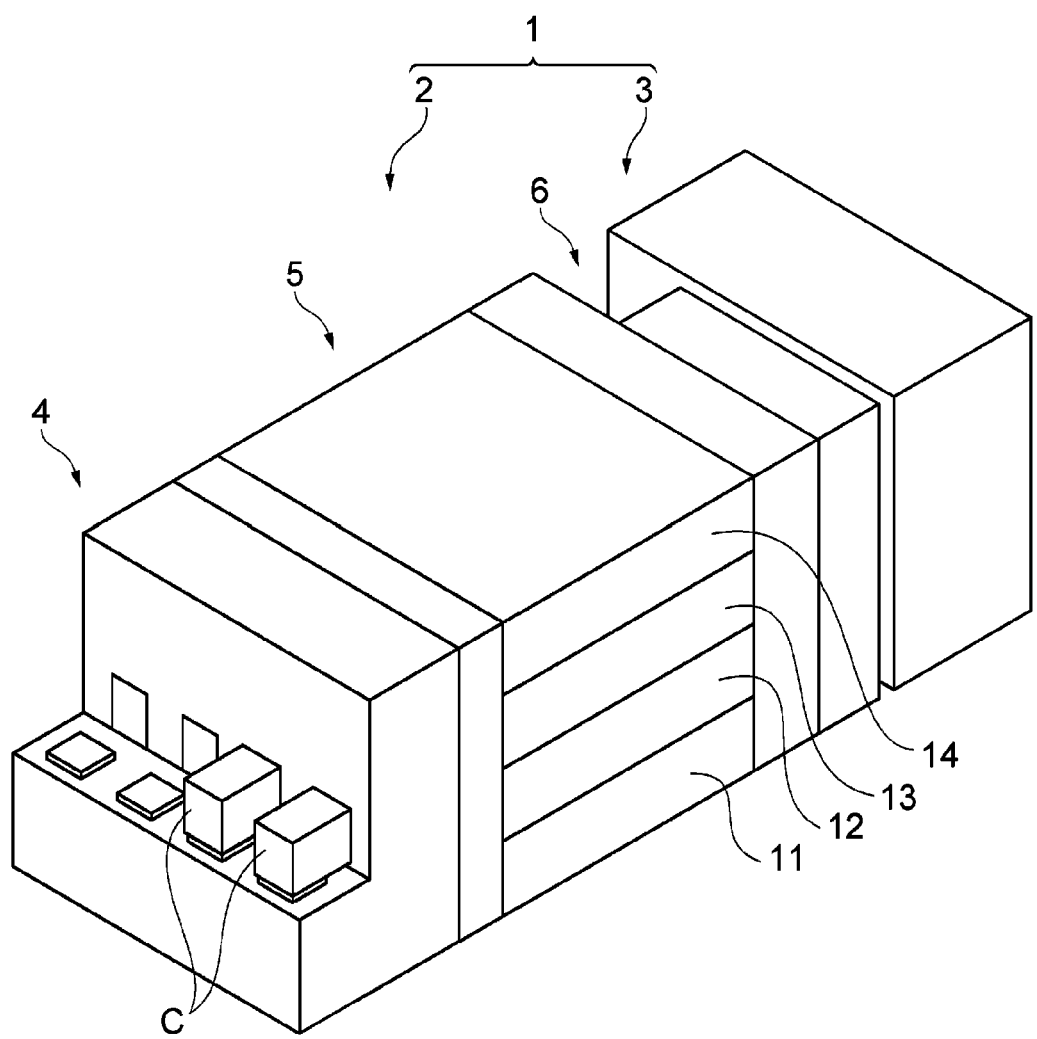
FIG. 1 is a schematic diagram showing an example of a schematic configuration of a substrate processing system.

The substrate processing system 1 shown in FIG. 1 is a system that forms a photosensitive film on a substrate, exposes the photosensitive film, and develops the photosensitive film. The processing target substrate is, for example, a semiconductor wafer W. The processing target substrate is not limited to the semiconductor wafer, and may be, for example, a glass substrate, a mask substrate, an FPD (Flat Panel Display), or the like. The photosensitive film is, for example, a resist film. The substrate processing system 1 includes a coating and developing apparatus 2 and an exposure apparatus 3. The exposure apparatus 3 performs an exposure process on a resist film (photosensitive film) formed on the wafer W (substrate). Specifically, the exposure target portion of the resist film is irradiated with energy rays by a method such as liquid immersion exposure or the like. The coating and developing apparatus 2 performs a process of forming the resist film on the surface of the wafer W (substrate) before the exposure process performed by the exposure apparatus 3 and performs a process of developing the resist film after the exposure process.

[Substrate Processing Apparatus]

Figure 2:
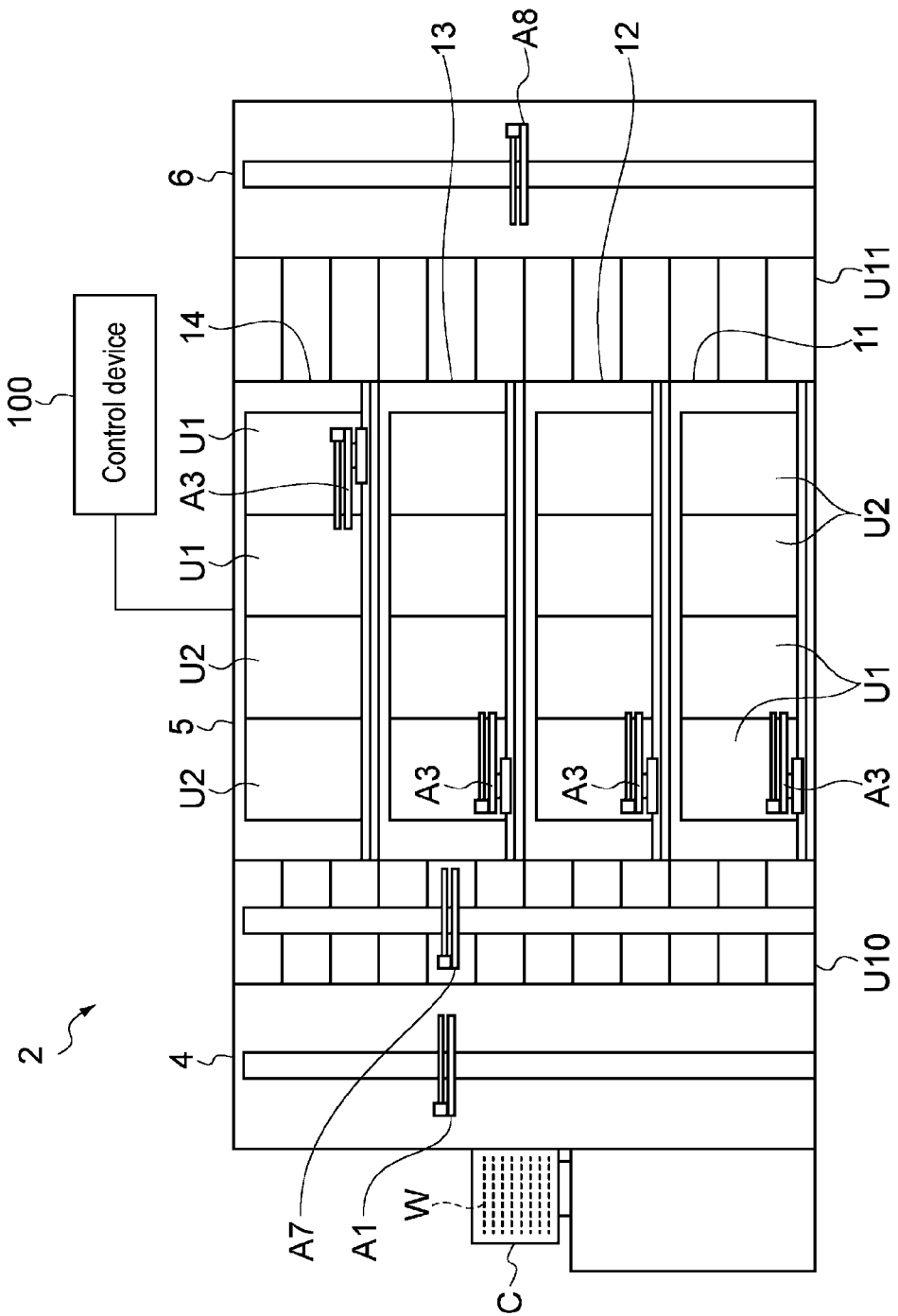
FIG. 2 is a schematic diagram showing an example of an internal configuration of a coating and developing apparatus.

The configuration of the coating and developing apparatus 2 will be described below as an example of the substrate processing apparatus. As shown in FIGS. 1 and 2, the coating and developing apparatus 2 includes a carrier block 4, a processing block 5, an interface block 6, and a control device 100.

The carrier block 4 loads the wafer W into the coating and developing apparatus 2 and unloads the wafer W from the coating and developing apparatus 2. For example, the carrier block 4 can support a plurality of carriers C for the wafer W, and includes a built-in transfer device A1 having a transfer arm. The carrier C accommodates, for example, a plurality of circular wafers W. The transfer device A1 takes out the wafer W from the carrier C, and delivers the wafer W to the processing block 5. The transfer device A1 receives the wafer W from the processing block 5, and returns the wafer W into the carrier C.

The processing block 5 includes a plurality of processing modules 11, 12, 13 and 14. Each of the processing modules 11, 12, 13 and 14 includes a liquid processing unit (or a liquid processor) U1, a thermal processing unit (or a thermal processor) U2, and a transfer device A3 including a transfer arm that transfers the wafer W to the liquid processing unit U1 and the thermal processing unit U2.

The processing module 11 forms a lower layer film on the surface of the wafer W by the liquid processing unit U1 and the thermal processing unit U2. The liquid processing unit U1 of the processing module 11 applies a processing liquid for forming the lower layer film onto the wafer W. The thermal processing unit U2 of the processing module 11 performs various thermal processes associated with the formation of the lower layer film.

The processing module 12 forms a resist film on the lower layer film by the liquid processing unit U1 and the thermal processing unit U2. The liquid processing unit U1 of the processing module 12 applies a processing liquid for forming the resist film onto the lower layer film. The thermal processing unit U2 of the processing module 12 performs various thermal processes associated with the formation of the resist film.

The processing module 13 forms an upper layer film on the resist film by the liquid processing unit U1 and the thermal processing unit U2. The liquid processing unit U1 of the processing module 13 applies a liquid for forming the upper layer film onto the resist film. The thermal processing unit U2 of the processing module 13 performs various thermal processes associated with the formation of the upper layer film.

The processing module 14 develops the exposed resist film by the liquid processing unit U1 and the thermal processing unit U2. The liquid processing unit U1 applies a developing liquid onto the exposed surface of the wafer W. Further, the liquid processing unit U1 rinses the applied developing liquid with a rinsing liquid. The thermal processing unit U2 performs various thermal processes associated with the developing process. Specific examples of the thermal processes include a thermal process before the developing process (PEB: Post Exposure Bake), a thermal process after the developing process (PB: Post Bake), and the like.

A shelf unit U10 is provided near the carrier block 4 in the processing block 5. The shelf unit U10 is divided into a plurality of cells arranged in a vertical direction. A transfer device A7 having a lifting arm is provided near the shelf unit U10. The transfer device A7 moves the wafer W up and down between the cells of the shelf unit U10.

A shelf unit U11 is provided near the interface block 6 in the processing block 5. The shelf unit U11 is divided into a plurality of cells arranged in the vertical direction.

The interface block 6 transfers the wafer W to and from the exposure apparatus 3. For example, the interface block 6 includes a built-in transfer device A8 having a delivery arm and is connected to the exposure apparatus 3. The transfer device A8 delivers the wafer W placed on the shelf unit U11 to the exposure apparatus 3. The transfer device A8 receives the wafer W from the exposure apparatus 3 and returns the wafer W to the shelf unit U11.

The control device 100 controls the coating and developing apparatus 2 so as to execute a coating developing process, for example, in the following procedure. First, the control device 100 controls the transfer device A1 to transfer the wafer W in the carrier C to the shelf unit U10, and controls the transfer device A7 to place the wafer W in the cell for the processing module 11.

Next, the control device 100 controls the transfer device A3 so as to transfer the wafer W of the shelf unit U10 to the liquid processing unit U1 and the thermal processing unit U2 in the processing module 11. Further, the control device 100 controls the liquid processing unit U1 and the thermal processing unit U2 so as to form the lower layer film on the surface of the wafer W. Thereafter, the control device 100 controls the transfer device A3 so as to return the wafer W, on which the lower layer film is formed, to the shelf unit U10, and controls the transfer device A7 so as to arrange the wafer W in the cell for the processing module 12.

Next, the control device 100 controls the transfer device A3 so as to transfer the wafer W of the shelf unit U10 to the liquid processing unit U1 and the thermal processing unit U2 in the processing module 12. Further, the control device 100 controls the liquid processing unit U1 and the thermal processing unit U2 so as to form a resist film on the lower layer film of the wafer W. Thereafter, the control device 100 controls the transfer device A3 so as to return the wafer W to the shelf unit U10, and controls the transfer device A7 so as to arrange the wafer W in the cell for the processing module 13.

Next, the control device 100 controls the transfer device A3 so as to transfer the wafer W of the shelf unit U10 to each unit in the processing module 13. Further, the control device 100 controls the liquid processing unit U1 and the thermal processing unit U2 so as to form an upper layer film on the resist film of the wafer W. Thereafter, the control device 100 controls the transfer device A3 so as to transfer the wafer W to the shelf unit U11.

Next, the control device 100 controls the transfer device A8 so as to transfer the wafer W on the shelf unit U11 to the exposure apparatus 3. Thereafter, the control device 100 receives the wafer W that has been subjected to the exposure process from the exposure apparatus 3 and controls the transfer device A8 to arrange the wafer W in the cell of the shelf unit U11 for the processing module 14.

Next, the control device 100 controls the transfer device A3 so as to transfer the wafer W of the shelf unit U11 to each unit in the processing module 14, and controls the liquid processing unit U1 and the thermal processing unit U2 so as to perform a developing process on the resist film of the wafer W. Thereafter, the control device 100 controls the transfer device A3 to return the wafer W to the shelf unit U10, and controls the transfer devices A7 and A1 so as to return the wafer W into the carrier C. Thus, the coating and developing process is completed.

The specific configuration of the substrate processing apparatus is not limited to the configuration of the coating and developing apparatus 2 illustrated above. The substrate processing apparatus may be any apparatus as long as it includes a liquid processing unit that discharges a processing liquid onto the wafer W to perform liquid processing and a control device that can control the liquid processing unit.

(Liquid Processing Unit)

Figure 3:
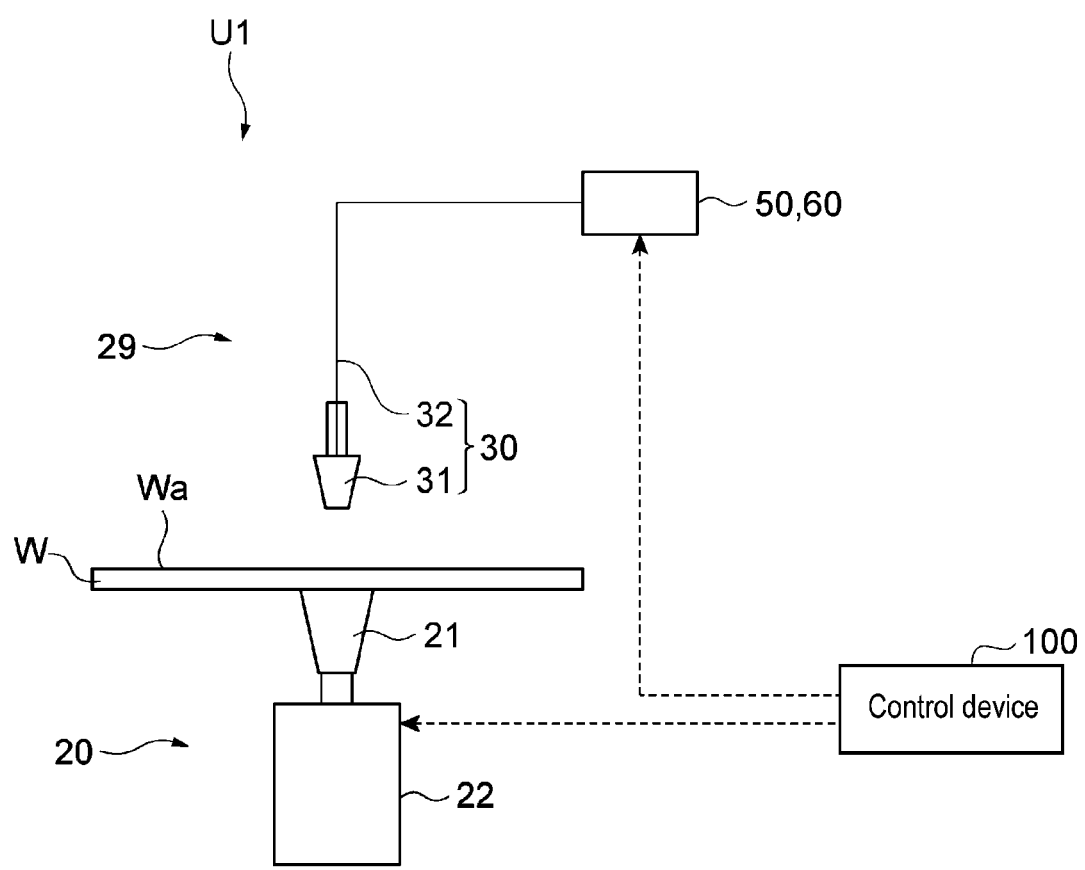
FIG. 3 is a schematic diagram showing an example of a configuration of a liquid processing unit.

Next, an example of the liquid processing unit U1 in the processing module 12 will be described in detail with reference to FIGS. 3 and 4. The liquid processing unit U1 includes a rotary holding part (or a rotary holder) 20 and a processing liquid supply part (or a processing liquid supply) 29.

The rotary holding part 20 holds and rotates the wafer W based on the operation command of the control device 100. The rotary holding part 20 includes a holding part 21 and a driving part 22. The holding part 21 supports the central portion of the wafer W horizontally arranged with the front surface Wa thereof facing upward, and holds the wafer W by suction (e.g., vacuum suction) or the like. The driving part 22 is, for example, a rotary actuator that uses an electric motor or the like as a power source, and rotates the holding part 21 about a vertical rotation axis. As a result, the wafer W rotates about the vertical rotation axis.

The processing liquid supply part 29 supplies a processing liquid to the wafer W rotationally held by the rotary holding part 20. As shown in FIGS. 3 and 4, the processing liquid supply part 29 includes a discharge part 30, a liquid feeding part (or a liquid feeder) 60, a replenishment part 50, a first connection part (or a first connector) 80 (connection part), and a second connection part (or a second connector) 90.

The discharge part 30 discharges the processing liquid toward the front surface Wa of the wafer W. The discharge part 30 includes a nozzle 31 and a liquid feeding pipe 32. The nozzle 31 discharges the processing liquid onto the wafer W. As shown in FIG. 3, for example, the nozzle 31 is disposed above the wafer W, and discharges the processing liquid downward. The liquid feeding pipe 32 guides the processing liquid to the nozzle 31. The processing liquid is applied (supplied) to the wafer W by being discharged from the nozzle 31 toward the wafer W.

Figure 4:
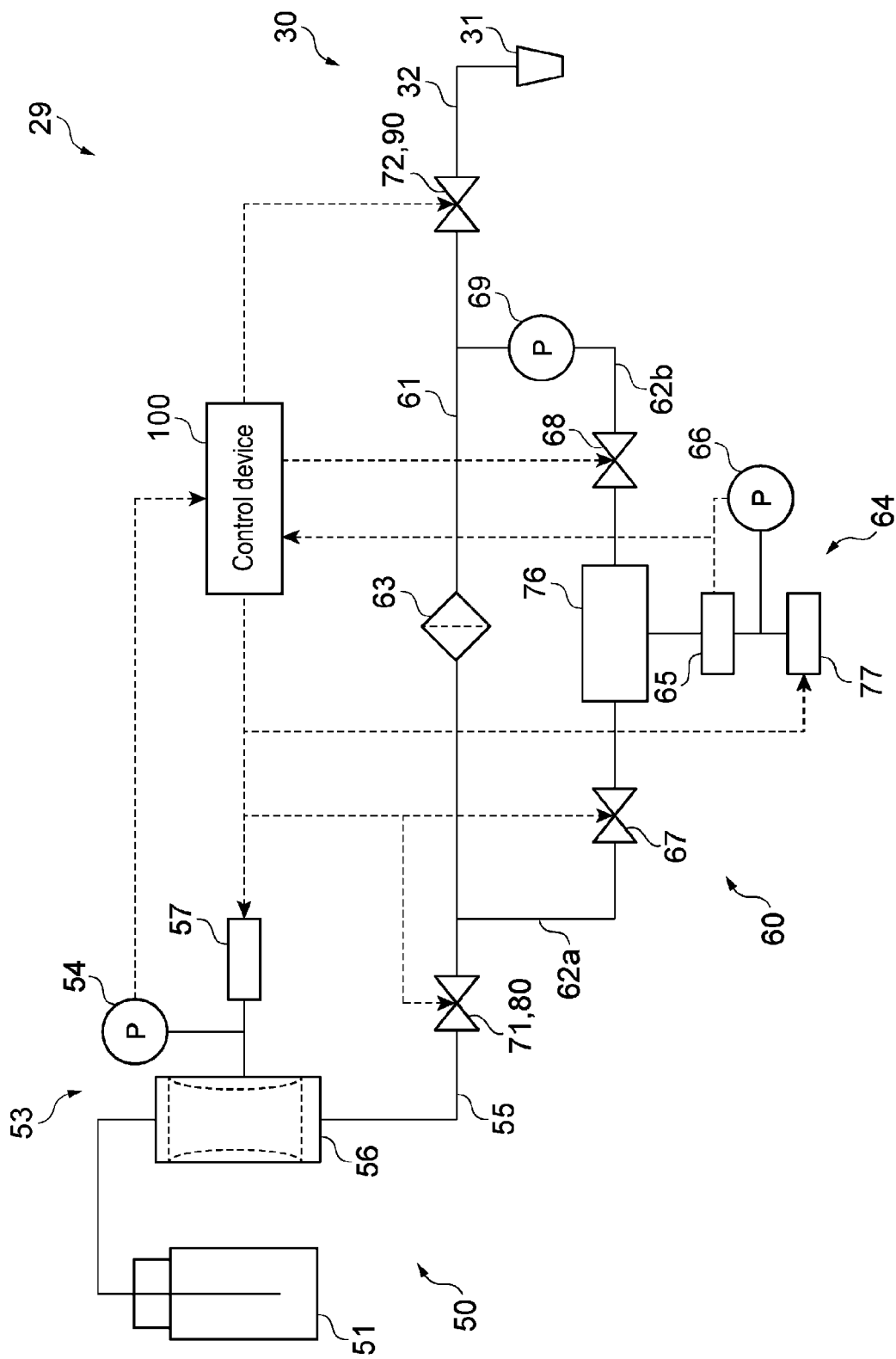
FIG. 4 is a schematic diagram showing an example of a processing liquid supply unit.

As shown in FIG. 4, the liquid feeding part 60 feeds the processing liquid to the discharge part 30. Specifically, the liquid feeding part 60 feeds the processing liquid toward the discharge part 30 (the nozzle 31) at a predetermined pressure. The liquid feeding part 60 includes a liquid feeding pipe 61, a filter 63, a pressure feeding part (or a pressure feeder) 64 (a discharge pressure feeding part), branch pipes 62a and 62b, a first connection valve 67, a second connection valve 68, and a pressure measurement part 69.

The liquid feeding pipe 61 guides the processing liquid to the discharge part 30. Specifically, the liquid feeding pipe 61 is connected to the end of the discharge part 30 on the upstream side of the liquid feeding pipe 32. The filter 63 is provided in the liquid feeding pipe 61 and removes foreign matters contained in the processing liquid. The filter 63 collects foreign matters contained in the processing liquid passing through the liquid feeding pipe 61.

The pressure feeding part 64 receives the processing liquid via the liquid feeding pipe 61, pressurizes the received processing liquid, and feeds the pressurized processing liquid to the discharge part 30. The pressure feeding part 64 includes, for example, a pump 76, a pump driving part 77, a flow rate measurement part 65, and a pressure measurement part 66.

The pump 76 includes a storage chamber that stores the processing liquid, and a contraction part that contracts the storage chamber. The pump 76 expands the storage chamber by the contraction part to receive the processing liquid, and contracts the storage chamber by the contraction part to feed the processing liquid. As the pump 76, for example, a tube diaphragm pump, a diaphragm pump, or a bellows pump may be used.

The pump driving part 77 drives the pump 76 based on the operation command of the control device 100. Specifically, the pump driving part 77 operates (drives) the contraction part so as to contract the storage chamber of the pump 76.

For example, the pump driving part 77 is an air operation type driving part that operates the contraction part with a gas. The pump driving part 77 may contract the storage chamber of the pump 76 by adjusting the pressure (driving pressure) of the gas.

The flow rate measurement part 65 acquires information regarding the inflow/outflow amount of the processing liquid to/from the pump 76. The flow rate of the gas for driving the pump 76 correlates with the inflow/outflow amount of the processing liquid to/from the pump 76 and, therefore, corresponds to the information on the inflow/outflow amount of the processing liquid to/from the pump 76. For example, the flow rate measurement part 65 measures the flow rate of the gas flowing in the connection pipe between the pump 76 and the pump driving part 77. The flow rate measurement part 65 outputs the measurement value to the control device 100. The pressure measurement part 66 acquires information about the pressure inside the pump 76. For example, the pressure measurement part 66 measures the pressure in the connection pipe between the pump 76 and the pump driving part 77. The pressure measurement part 66 outputs the measurement value to the control device 100.

The branch pipe 62a branches from the liquid feeding pipe 61 on the upstream side of the filter 63, and connects the liquid feeding pipe 61 and the pump 76. The branch pipe 62b branches from the liquid feeding pipe 61 on the downstream side of the filter 63, and connects the liquid feeding pipe 61 and the pump 76.

The first connection valve 67 is provided in the branch pipe 62a to open and close a flow path between the liquid feeding pipe 61 and the pressure feeding part 64 based on an operation command of the control device 100. The first connection valve 67 is, for example, an air operation valve. The second connection valve 68 is provided in the branch pipe 62b to open and close a flow path between the liquid feeding pipe 61 and the pressure feeding part 64 based on an operation command of the control device 100. The second connection valve 68 is, for example, an air operation valve.

The pressure measurement part 69 measures the pressure of the processing liquid flowing through the pipe in the liquid feeding part 60. For example, the pressure measurement part 69 measures the pressure in a flow path between the filter 63 and the pressure feeding part 64. Specifically, the pressure measurement part 69 is provided in the branch pipe 62b to measure the pressure of the processing liquid (liquid pressure) in the branch pipe 62b. The pressure measurement part 69 outputs the measurement value to the control device 100.

The replenishment part 50 replenishes the liquid feeding part 60 with the processing liquid to be fed to the discharge part 30. The replenishment part 50 includes a liquid source 51, a pressure feeding part (or a pressure feeder) 53 (replenishment pressure feeding part), and a feeding pipe 55.

The liquid source 51 is a supply source of the processing liquid to be replenished to the liquid feeding part 60. The pressure feeding part 53 feeds the processing liquid from the liquid source 51 to the liquid feeding part 60. For example, the pressure feeding part 53 temporarily stores the processing liquid supplied from the liquid source 51, and feeds the processing liquid to the liquid feeding part 60 in a pressurized state. Alternatively, the pressure feeding part 53 may receive the processing liquid by, for example, suctioning the processing liquid in the liquid source 51, and may feed the received processing liquid to the liquid feeding part 60. The pressure feeding part 53 includes, for example, a pump 56, a pump driving part 57, and a pressure measurement part 54.

The pump 56 suctions the processing liquid in the liquid source 51, and feeds the suctioned processing liquid toward the discharge part 30. The pump 56 includes a storage chamber that stores the processing liquid, and a contraction part that contracts the storage chamber. The pump 56 expands the storage chamber by the contraction part to receive the processing liquid, and contracts the storage chamber by the contraction part to feed the processing liquid. As the pump 56, for example, a tube diaphragm pump, a diaphragm pump, or a bellows pump may be used.

The pump driving part 57 drives the pump 56 based on the operation command of the control device 100. Specifically, the pump driving part 57 operates (drives) the contraction part so as to contract the storage chamber of the pump 56. For example, the pump driving part 57 is an air operation type driving part that operates the contraction part with a gas. The pump driving part 57 may contract the storage chamber of the pump 56 by adjusting the pressure of the gas (hereinafter referred to as "driving pressure").

The pressure measurement part 54 acquires information regarding the pressure inside the pump 56. For example, the pressure measurement part 54 is connected to a connecting pipe between the pump 56 and the pump driving part 57 to measure the pressure inside the connection pipe. The pressure measurement part 54 measures, for example, the pressure of the gas for driving the pump 56. The pressure measurement part 54 outputs the measurement value to the control device 100.

The feeding pipe 55 guides the processing liquid from the pressure feeding part 53 (the pump 56) to the liquid feeding part 60. Specifically, the feeding pipe 55 is connected to the end of the liquid feeding part 60 on the upstream side of the liquid feeding pipe 61. That is, the liquid feeding pipe 61 connects the replenishment part 50 and the liquid feeding part 60 via the filter 63. The filter 63 removes foreign matters contained in the processing liquid (the processing liquid replenished from the replenishment part 50 to the liquid feeding part 60) flowing through the flow path in the liquid feeding pipe 61.

The first connection part 80 connects the replenishment part 50 and the liquid feeding part 60. The first connection part 80 includes, for example, a switching valve 71. The switching valve 71 opens and closes a flow path between the replenishment part 50 and the liquid feeding part 60 based on an operation command of the control device 100. The switching valve 71 is provided at a connection point between the feeding pipe 55 of the replenishment part 50 and the liquid feeding pipe 61 of the liquid feeding part 60. The switching valve 71 is, for example, an air operation valve.

The switching valve 71 may be opened and closed at an opening degree change rate smaller than the opening degree change rate of at least one of the first connection valve 67 and the second connection valve 68. The opening degree change rate refers to a rate of change in an opening degree of a valve per unit time. When a valve is switched from a closed state to an open state, the opening degree change rate is an increase rate of the opening degree of the valve. When a valve is switched from an open state to a closed state, the opening degree change rate is a reduction rate of the opening degree of the valve. For example, as the switching valve 71, a valve opened and closed at an operation speed slower than the operation speed of at least one of the first connection valve 67 and the second connection valve 68 may be used. Alternatively, the control device 100 may control the opening/closing operation of the switching valve 71 so as to be slower than the operation speed of at least one of the first connection valve 67 and the second connection valve 68.

The control device 100 may control the opening/closing operation of the switching valve 71 so that the opening degree is gradually changed, whereby the relationship of the opening degree change rates described above may be satisfied.

The second connection part 90 connects the liquid feeding part 60 and the discharge part 30. The second connection part 90 includes, for example, a discharge valve 72. The discharge valve 72 opens and closes a flow path between the liquid feeding part 60 and the discharge part 30 based on an operation command of the control device 100. The discharge valve 72 is provided at a connection point between the liquid feeding pipe 61 of the liquid feeding part 60 and the liquid feeding pipe 32 of the discharge part 30. The discharge valve 72 is, for example, an air operation valve.

The relationship of the opening degree change rate between the discharge valve 72 and the first connection valve 67 (the second connection valve 68) may be similar to the relationship of the opening degree change rate between the switching valve 71 and the first connection valve 67 (the second connection valve 68). That is, the discharge valve 72 may be opened and closed at an opening degree change rate smaller than the opening degree change rate of at least one of the first connection valve 67 and the second connection valve 68.

(Control Device)

Next, the control device 100 will be described in detail with reference to FIGS. 5 and 6. The control device 100 is configured to execute: opening the switching valve 71 after reducing the pressure difference between the inside of the replenishment part 50 and the inside of the liquid feeding part 60; and starting the replenishment of the processing liquid from the replenishment part 50 to the liquid feeding part 60 in a state in which the switching valve 71 is opened.

Figure 5:
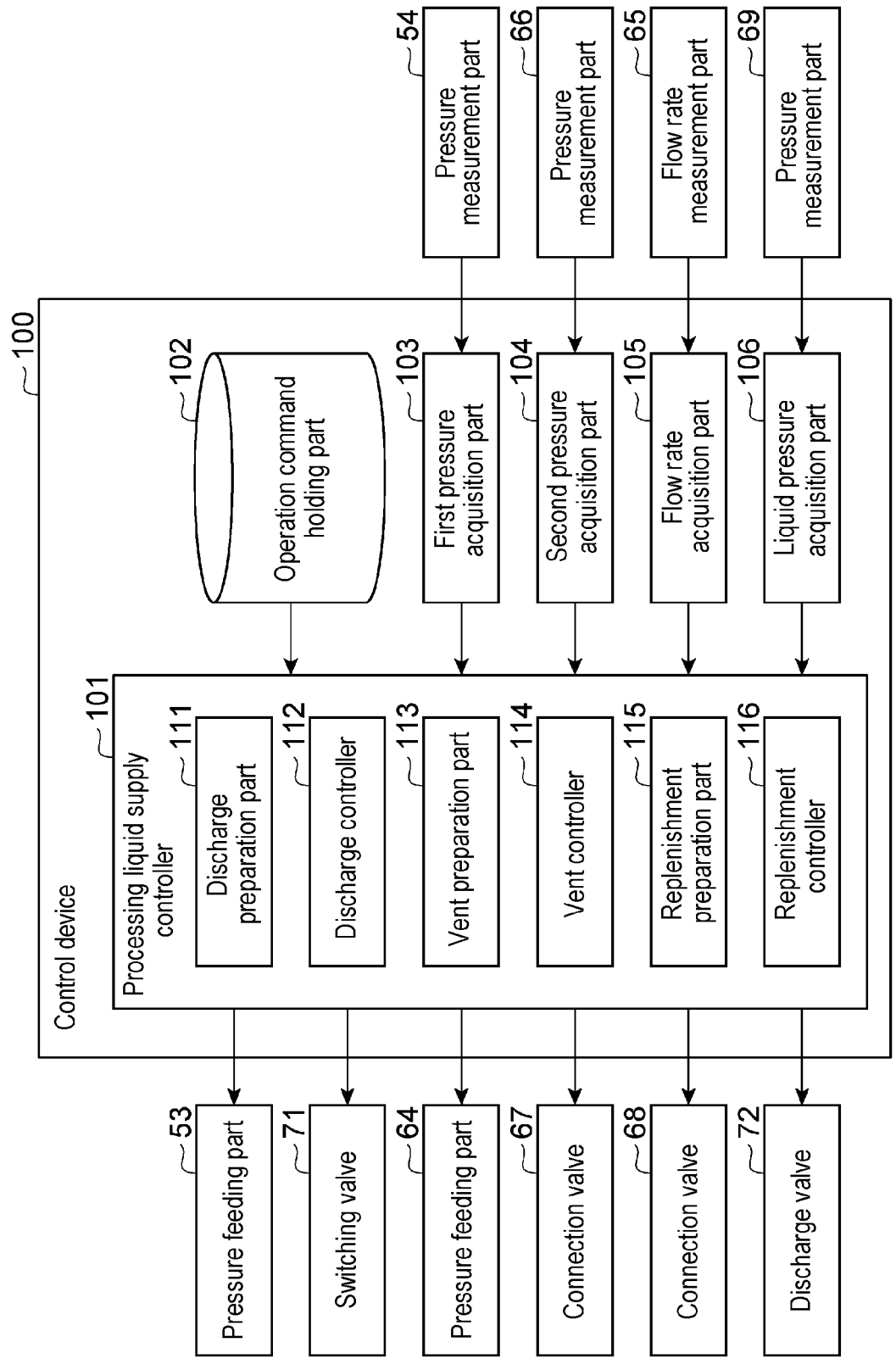
FIG. 5 is a block diagram showing an example of a functional configuration of a control device.

As shown in FIG. 5, the control device 100 includes, as modules in terms of functions (hereinafter referred to as "functional modules"), an operation command holding part 102, a first pressure acquisition part 103, a second pressure acquisition part 104, a flow rate acquisition part 105, a liquid pressure acquisition part 106, and a processing liquid supply controller 101.

The operation command holding part 102 holds an operation command that defines a liquid processing procedure executed in the liquid processing unit U1. The operation command may include a target value (set value) of the discharge pressure when the processing liquid is discharged from the nozzle 31, an execution time for discharging the processing liquid from the nozzle 31, target values (set values) of the replenishment pressure and the replenishment flow rate, an execution time for replenishing the processing liquid from the replenishment part 50 to the liquid feeding part 60, and the like.

The first pressure acquisition part 103 acquires a measurement value from the pressure measurement part 54. Specifically, the first pressure acquisition part 103 acquires a measurement value indicating the pressure in the connection pipe between the pump 56 and the pump driving part 57 (the driving pressure to the pump 56) in the replenishment part 50. The first pressure acquisition part 103 outputs the acquired measurement value to the processing liquid supply controller 101.

The second pressure acquisition part 104 acquires a measurement value from the pressure measurement part 66. Specifically, the second pressure acquisition part 104 acquires a measurement value indicating the pressure in the connection pipe between the pump 76 and the pump driving part 77 (the driving pressure to the pump 76) in the liquid feeding part 60. The second pressure acquisition part 104 outputs the acquired measurement value to the processing liquid supply controller 101.

The flow rate acquisition part 105 acquires a measurement value from the flow rate measurement part 65. Specifically, the flow rate acquisition part 105 acquires a measurement value indicating the flow rate of the gas for driving the pump 76 in the connection pipe between the pump 76 and the pump driving part 77. The flow rate acquisition part 105 outputs the acquired measurement value to the processing liquid supply controller 101.

The liquid pressure acquisition part 106 acquires a measurement value from the pressure measurement part 69. Specifically, the liquid pressure acquisition part 106 acquires a measurement value indicating the pressure of the processing liquid between the filter 63 and the pressure feeding part 64 (the pump 76). The liquid pressure acquisition part 106 outputs the acquired measurement value to the processing liquid supply controller 101.

The processing liquid supply controller 101 controls the processing liquid supply part 29 so that the processing liquid is discharged from the nozzle 31. The processing liquid supply controller 101 includes, for example, a discharge preparation part 111, a discharge controller 112, a vent preparation part 113, a vent controller 114, a replenishment preparation part 115, and a replenishment controller 116, as functional modules.

The discharge preparation part 111 is configured to perform preparation for discharging the processing liquid from the nozzle 31. Specifically, the discharge preparation part 111 adjusts the pressure of the processing liquid in the liquid feeding part 60 (hereinafter referred to as "the pressure in the liquid feeding part 60") before starting the discharge of the processing liquid from the nozzle 31. The discharge preparation part 111 changes the pressure in the liquid feeding part 60 so as to reduce the pressure difference between the inside of the liquid feeding part 60 and the inside of the discharge part 30 in a state in which the discharge valve 72 is closed. The discharge preparation part 111 controls the pump driving part 77 so that the pressure in the liquid feeding part 60 approaches the set value based on, for example, the measurement value acquired from the pressure measurement part 69. The discharge preparation part 111 may adjust the driving pressure from the pump driving part 77 to the pump 76 according to a deviation between the measurement value of the pressure measurement part 69 and the set value so that the deviation approaches zero. The discharge preparation part 111 opens the discharge valve 72 in a state in which the pressure difference between the liquid feeding part 60 and the discharge part 30 is reduced.

The discharge controller 112 is configured to cause the processing liquid to be discharged from the nozzle 31 toward the wafer W. Specifically, the discharge controller 112 causes the processing liquid to be discharged from the nozzle 31 toward the wafer W in a state in which the pressure difference between the inside of the liquid feeding part 60 and the inside of the discharge part 30 is reduced and the discharge valve 72 is opened by the discharge preparation part 111. The discharge controller 112 controls the pressure feeding part 64 (the pump driving part 77) so that the pressure of the processing liquid fed to the nozzle 31 (hereinafter referred to as "discharge pressure") follows a target value. The discharge controller 112 maintains the target value at a constant set value Pd to allow the processing liquid to be discharged from the nozzle 31 toward the wafer W at a substantially constant flow rate. The discharge controller 112 may adjust the driving pressure from the pump driving part 77 to the pump 76 according to a deviation between the measurement value of the pressure measurement part 69 and the set value Pd so that the deviation approaches zero.

The vent preparation part 113 is configured to perform preparation for a process of returning the processing liquid from the liquid feeding part 60 to the replenishment part 50 (hereinafter referred to as "vent"). Specifically, the vent preparation part 113 adjusts the pressure of the processing liquid in the replenishment part 50 (hereinafter referred to as "the pressure in the replenishment part 50") and the pressure in the liquid feeding part 60 before starting the vent, thereby reducing the pressure difference between the inside of the replenishment part 50 and the inside of the liquid feeding part 60. The vent preparation part 113 opens the switching valve 71 while reducing the pressure difference between the inside of the replenishment part 50 and the inside of the liquid feeding part 60.

The vent controller 114 is configured to perform a vent for returning the processing liquid from the liquid feeding part 60 to the replenishment part 50. The vent controller 114 starts a vent for feeding the processing liquid from the pressure feeding part 64 (the pump 76) to the pressure feeding part 53 (the pump 56) in a state in which the pressure difference between the inside of the replenishment part 50 and the inside of the liquid feeding part 60 is reduced by the vent preparation part 113. The vent controller 114 may control the pressure feeding part 64 (the pump driving part 77) and the pressure feeding part 53 (the pump driving part 57) so that, for example, the pressure (hereinafter referred to as "vent pressure") of the processing liquid fed from the pressure feeding part 64 to the pressure feeding part 53 is maintained substantially constant and the flow rate (hereinafter referred to as "vent flow rate") of the processing liquid per unit time is maintained substantially constant.

The replenishment preparation part 115 is configured to perform preparation for replenishing the processing liquid from the replenishment part 50 to the liquid feeding part 60. Specifically, the replenishment preparation part 115 reduces the pressure difference between the inside of the replenishment part 50 and the inside of the liquid feeding part 60 before replenishing the processing liquid from the replenishment part 50 to the liquid feeding part 60, and opens the switching valve 71 in the state in which the pressure difference is reduced. The replenishment preparation part 115 changes the pressure inside the replenishment part 50 so as to reduce the pressure difference between the inside of the replenishment part 50 and the inside of the liquid feeding part 60, for example, in a state in which the switching valve 71 is closed. The replenishment preparation part 115 needs only to at least reduce the pressure difference after the replenishment preparation as compared with the pressure difference between the inside of the replenishment part 50 and the inside of the liquid feeding part 60 before the start of the replenishment preparation. As an example, the replenishment preparation part 115 changes the pressure in the replenishment part 50 so that the pressure in the replenishment part 50 substantially matches the pressure in the liquid feeding part 60.

As an example of the replenishment preparation, the replenishment preparation part 115 first controls the pressure feeding part 53 (the pump driving part 57) so as to reduce the pressure difference between the inside of the replenishment part 50 and the inside of the liquid feeding part 60 in a state in which the switching valve 71 is closed. The replenishment preparation part 115 may control the pump driving part 57 so that the measurement value of the pressure measurement part 54 approaches the set value Pd. For example, the replenishment preparation part 115 adjusts the driving pressure from the pump driving part 57 to the pump 56 according to a deviation between the measurement value of the pressure measurement part 54 and the set value Pd so that the deviation approaches zero. Next, the replenishment preparation part 115 controls the pressure feeding part 53 based on the measurement value of the pressure measurement part 69 while keeping the switching valve 71 opened and keeping the discharge valve 72 and the second connection valve 68 closed, so that the pressure between the pressure feeding part 53 and the pressure feeding part 64 approaches a set value (e.g., a set value Pd). For example, the replenishment preparation part 115 adjusts the driving pressure from the pump driving part 57 to the pump 56 according to the deviation between the measurement value of the pressure measurement part 69 and the set value Pd so that the deviation approaches zero.

Next, the replenishment preparation part 115 controls the pressure feeding part 64 based on the measurement value of the pressure measurement part 69 while keeping the switching valve 71 and the discharge valve 72 closed and keeping the second connection valve 68 opened, so that the pressure in the liquid feeding part 60 approaches the set value (e.g., the set value Pd). For example, the replenishment preparation part 115 adjusts the driving pressure from the pump driving part 77 to the pump 76 according to the deviation between the measurement value of the pressure measurement part 69 and the set value Pd so that the deviation approaches zero.

The replenishment controller 116 is configured to replenish the processing liquid from the replenishment part 50 to the liquid feeding part 60. Specifically, the replenishment controller 116 starts replenishing the processing liquid from the replenishment part 50 to the liquid feeding part 60 in a state in which the switching valve 71 is opened by the replenishment preparation part 115 (after the switching valve 71 is opened). As an example, the replenishment controller 116 causes the replenishment of the processing liquid to the liquid feeding part 60 to be started after the switching valve 71 is opened by the replenishment preparation part 115 and after the adjustment of the pressure in the replenishment part 50, the adjustment of the pressure in the liquid feeding part 60, and the re-switching of the switching valve 71 to the open state are sequentially performed. The replenishment controller 116 replenishes the processing liquid from the replenishment part 50 to the liquid feeding part 60 in a state in which the replenishment preparation part 115 reduces the pressure difference between the inside of the replenishment part 50 and the inside of the liquid feeding part 60.

The replenishment controller 116 controls one of the pressure feeding part 53 and the pressure feeding part 64 so as to cause the pressure of the processing liquid fed from the pressure feeding part 53 to the pressure feeding part 64 (hereinafter referred to as "replenishment pressure") to follow the target value of the replenishment pressure. While executing the follow-up control of the replenishment pressure to the target value, the replenishment controller 116 controls the other of the pressure feeding part 53 (the pump driving part 57) and the pressure feeding part 64 (the pump driving part 77) so as to cause the flow rate of the processing liquid per unit time (hereinafter referred to as "replenishment flow rate") to follow a target value. The replenishment controller 116 performs the follow-up control of the replenishment pressure and the follow-up control of the replenishment flow rate by controlling the pressure feeding part 53 and the pressure feeding part 64 from the start of replenishment to the end of replenishment. The execution period of the follow-up control of the replenishment pressure and the execution period of the follow-up control of the replenishment flow rate may at least partially overlap with each other. As an example, the replenishment controller 116 may control the pressure feeding part 53 so that the replenishment pressure follows the target value, while controlling the pressure feeding part 64 so that the replenishment flow rate follows the target value.

In the control for causing the replenishment pressure to follow the target value, the replenishment controller 116 may set the target value of the replenishment pressure to the target value of the discharge pressure (the set value Pd) from the start of replenishment to the end of the replenishment. For example, the replenishment controller 116 adjusts the driving pressure from the pump driving part 57 to the pump 56 according to a deviation between the measurement value of the pressure measurement part 69 and the set value Pd so that the deviation approaches zero. In the control for causing the replenishment flow rate to follow the target value, the replenishment controller 116 may set the target value of the replenishment flow rate to a constant value from the start of the replenishment to the end of the replenishment. For example, the replenishment controller 116 may adjust the driving pressure from the pump driving part 77 to the pump 76 based on the measurement value of the flow rate measurement part 65 so that the replenishment flow rate follows the target value. In addition, the replenishment controller 116 may perform the follow-up control of the replenishment flow rate using a flow meter provided in the liquid feeding pipe 61 or the branch pipe 62b instead of the flow rate measurement part 65.

The control device 100 is constituted with one or more control computers. For example, the control device 100 includes a circuit 120 shown in FIG. 6. The circuit 120 includes one or more processors 121, a memory 122, a storage 123, an input/output port 124, and a timer 125.

The storage 123 includes a non-transitory computer-readable storage medium such as a hard disk or the like. The storage medium stores a program for causing the coating and developing apparatus 2 to execute a liquid processing procedure described later. The storage medium may be a removable medium such as a non-volatile semiconductor memory, a magnetic disk, or an optical disk. The memory 122 temporarily records the program loaded from the storage medium of the storage 123 and the calculation results obtained by the processor 121. The processor 121 forms the respective functional modules described above by executing the above program in cooperation with the memory 122. The input/output port 124 inputs or outputs electrical signals to or from the pressure feeding part 53 and 64, the switching valve 71, the first connection valve 67, the second connection valve 68, the discharge valve 72, the pressure measurement parts 54, 66 and 69, the flow rate measurement part 65, and the like. The timer 125 measures the elapsed time by counting, for example, a reference pulse having a constant cycle.

The hardware configuration of the control device 100 is not necessarily limited to one that forms the respective functional modules by the program. For example, the respective functional modules of the control device 100 may be formed by a dedicated logic circuit or an ASIC (Application Specific Integrated Circuit) in which the logic circuit is integrated.

[Processing Liquid Supply Procedure]

Next, with reference to FIGS. 7 to 14D, a liquid processing procedure executed by the control device 100 will be described as an example of a method of controlling the substrate processing apparatus. FIG. 7 is a flowchart showing an example of a liquid processing procedure.

As shown in FIG. 7, the control device 100 first executes steps S01 and S02 in order. In step S01, for example, the discharge preparation part 111 controls the processing liquid supply part 29 so as to reduce the pressure difference between the inside of the liquid feeding part 60 and the inside of the discharge part 30 in preparation for the discharge of the processing liquid from the nozzle 31. In step S02, for example, the discharge controller 112 controls the processing liquid supply part 29 so that the processing liquid is discharged from the nozzle 31 toward the wafer W in a state in which the pressure difference between the inside of the liquid feeding part 60 and the inside of the discharge part 30 is reduced. Details of the discharge preparation process and the discharge process will be described later.

Next, the control device 100 sequentially executes steps S03 and S04. In step S03, for example, the vent preparation part 113 controls the processing liquid supply part 29 so as to reduce the pressure difference between the inside of the replenishment part 50 and the inside of the liquid feeding part 60 in preparation for the vent for returning the processing liquid from the liquid feeding part 60 to the replenishment part 50. In step S04, for example, the vent controller 114 controls the processing liquid supply part 29 so as to return the processing liquid from the liquid feeding part 60 to the replenishment part 50 (so as to perform a vent) in a state in which the pressure difference between the inside of the replenishment part 50 and the inside of the liquid feeding part 60 is reduced. Details of the vent preparation process and the vent process will be described later.

Next, the control device 100 sequentially executes steps S05 and S06. In step S05, for example, the replenishment preparation part 115 controls the processing liquid supply part 29 so as to reduce the pressure difference between the inside of the replenishment part 50 and the inside of the liquid feeding part 60 in preparation for the replenishment of the processing liquid from the replenishment part 50 to the liquid feeding part 60. In step S06, for example, the replenishment controller 116 controls the processing liquid supply part 29 so as to replenish the processing liquid from the replenishment part 50 to the liquid feeding part 60 in a state in which the pressure difference between the inside of the replenishment part 50 and the inside of the liquid feeding part 60 is reduced. Details of the replenishment preparation process and the replenishment process will be described later. Thus, a series of liquid processing procedures is completed. In the liquid processing procedure, the vent preparation process and the vent process of steps S03 and S04 may be omitted, and the vent may be performed once for each of the plurality of liquid processes.

(Discharge Preparation Procedure)

Figure 8A:
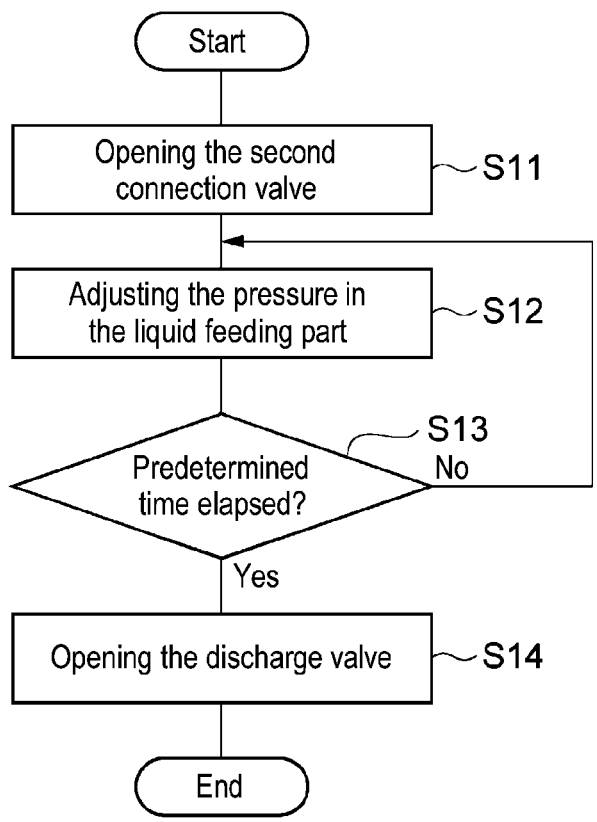
FIG. 8A is a flowchart showing an example of a discharge preparation procedure.

FIG. 8A is a flowchart showing an example of the discharge preparation process of step S01. As shown in FIG. 8A, the control device 100 first executes step S11. In step S11, the discharge preparation part 111 switches the second connection valve 68 from the closed state to the opened state in a state in which the switching valve 71, the discharge valve 72, the first connection valve 67, and the second connection valve 68 are closed.

Figure 9A:
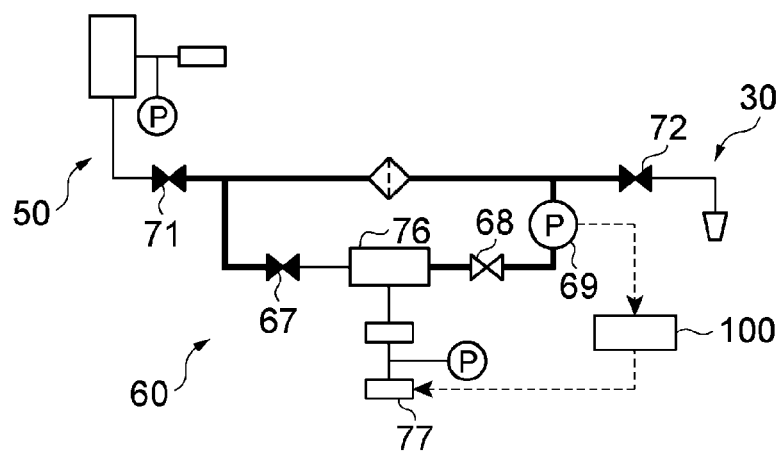
FIG. 9A is a schematic diagram for explaining an example of the discharge preparation procedure.

Next, the control device 100 executes steps S12 and S13. In step S12, the discharge preparation part 111 adjusts the pressure inside the liquid feeding part 60. For example, as shown in FIG. 9A, the discharge preparation part 111 adjusts the pressure in the liquid feeding part 60 based on the measurement value of the pressure measurement part 69. The discharge preparation part 111 may control the pump driving part 77 so that the measurement value measured by the pressure measurement part 69 follows (approaches) the set value Pd of the discharge pressure. For example, the discharge preparation part 111 may adjust the driving pressure from the pump driving part 77 to the pump 76 according to a deviation between the measurement value of the pressure measurement part 69 and the set value Pd so that the deviation approaches zero. In FIG. 9A, the conduits directly and indirectly connected to the pressure measurement part 69 are indicated by thick lines, the valves in the opened state are indicated in white, and the valves in the closed state are indicated in black.

The discharge preparation part 111 repeats steps S12 and S13 until a predetermined time elapses from the start of execution of step S12. The predetermined time is set in advance such that the adjustment of the pressure in the liquid feeding part 60 is repeated until the measurement value of the pressure measurement part 69 substantially matches the set value Pd, and is stored in the operation command holding part 102. The discharge preparation part 111 may repeat the process of step S12 until the pressure in the liquid feeding part 60 reaches a set range including the set value Pd, instead of the elapse of the predetermined time. By performing steps S12 and S13, the discharge preparation part 111 reduces the pressure difference between the inside of the liquid feeding part 60 and the inside of the discharge part 30 in a state in which the discharge valve 72 is closed.

When it is determined that the predetermined time has elapsed, the discharge preparation part 111 executes step S14. In step S14, for example, the discharge preparation part 111 switches the discharge valve 72 from the closed state to the opened state while keeping the switching valve 71 and the first connection valve 67 in the closed state and keeping the second connection valve 68 in the opened state. At this time, the discharge preparation part 111 may switch the discharge valve 72 from the closed state to the opened state at an opening degree change rate (operation speed) smaller than that of the second connection valve 68. Thus, the discharge preparation part 111 completes the discharge preparation process.

(Discharge Procedure)

Figure 8B:
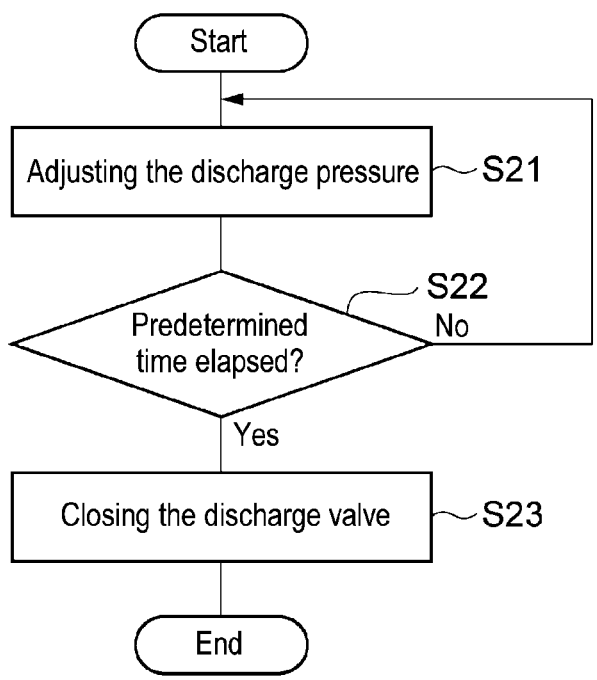
FIG. 8B is a flowchart showing an example of a discharge control procedure.

FIG. 8B is a flowchart showing the discharge procedure of step S02. For example, the control device 100 executes steps S21 and S22 as shown in FIG. 8B in a state in which the pressure difference between the inside of the liquid feeding part 60 and the inside of the discharge part 30 is reduced and the discharge valve 72 is opened by the discharge preparation part 111. In step S21, the discharge controller 112 adjusts the discharge pressure of the processing liquid fed to the nozzle 31. In step S21, the discharge controller 112 starts control of the pressure feeding part 64 (contraction part of the pump 76) so as to feed the processing liquid to the discharge part 30 at the set value Pd of the discharge pressure. As a result, the discharge controller 112 starts the discharge of the processing liquid from the nozzle 31 in a state in which the discharge valve 72 is opened. The discharge controller 112 continues to adjust the discharge pressure even after the discharge is started.

Figure 9B:
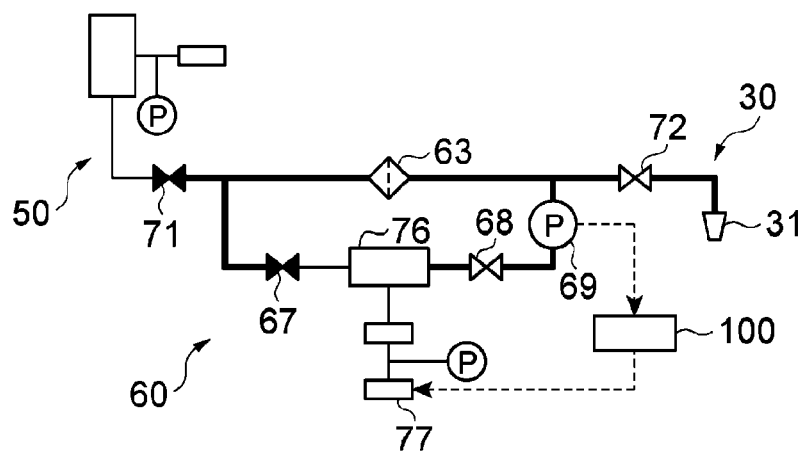
FIG. 9B is a schematic diagram for explaining an example of the discharge control procedure.

For example, as shown in FIG. 9B, the discharge controller 112 adjusts the pump driving part 77 (the pressure applied from the pump 76 to the processing liquid) based on the measurement value of the pressure measurement part 69. The discharge controller 112 may adjust the pump driving part 77 so that the discharge pressure of the processing liquid follows the set value Pd. The discharge controller 112 may adjust the driving pressure from the pump driving part 77 to the pump 76 according to a deviation between the measurement value of the pressure measurement part 69 and the set value Pd so that the deviation approaches zero. The discharge controller 112 repeats the process of steps S21 and S22 until a predetermined time has elapsed from the start of execution of step S21.

When it is determined in step S22 that the predetermined time has elapsed, the control device 100 executes step S23. In step S23, the discharge controller 112 switches the second connection valve 68 and the discharge valve 72 from the opened state to the closed state while keeping the switching valve 71 and the first connection valve 67 in the closed state. In step S23, the discharge controller 112 may switch the discharge valve 72 from the opened state to the closed state at an opening degree change rate (operation speed) smaller than that of the second connection valve 68. After the discharge valve 72 is closed, the pressure in the liquid feeding part 60 is maintained at a value close to the set value Pd. The predetermined time is set in the operation command held by the operation command holding part 102, and is set in advance, for example, according to the amount of the processing liquid used in the liquid processing per one time. The control device 100 may control the rotary holding part 20 to rotate the wafer W during execution of step S02, whereby a resist coating film may be formed on the surface Wa of the wafer W.

(Vent Preparation Procedure)

Figure 10:
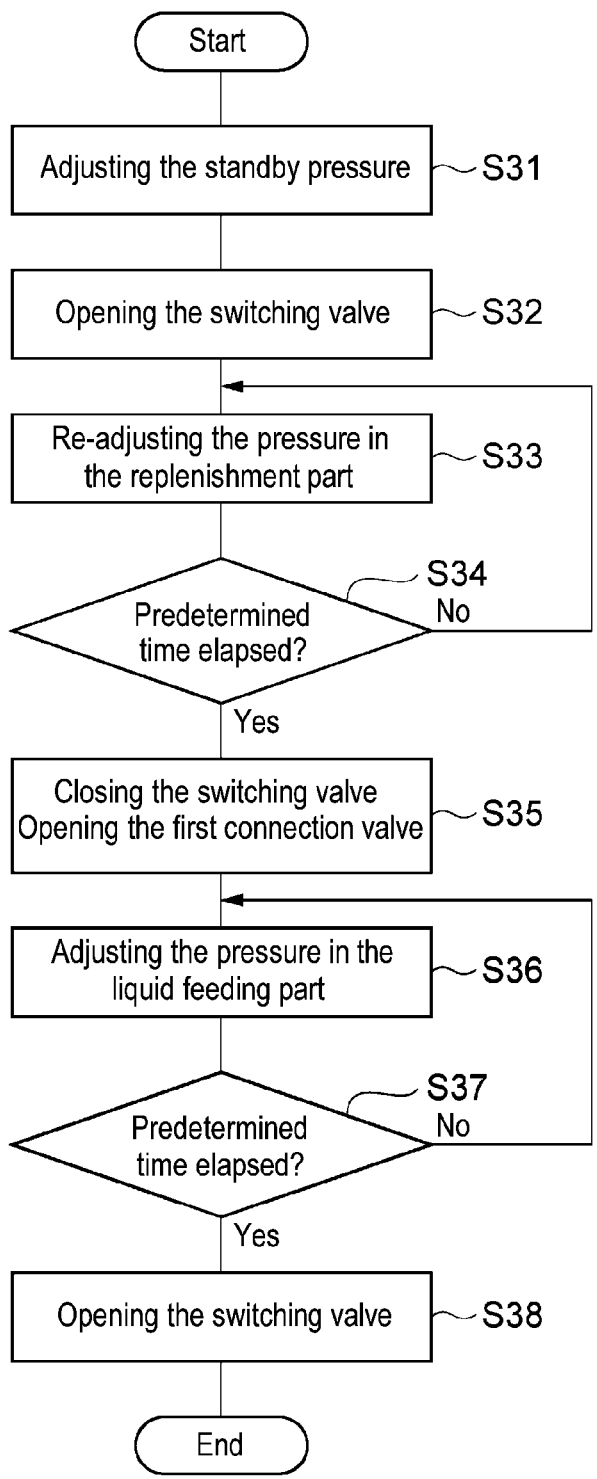
FIG. 10 is a flowchart showing an example of a vent preparation procedure.

FIG. 10 is a flowchart showing an example of the vent preparation procedure of step S03. As shown in FIG. 10, the control device 100 first executes step S31. In step S31, the vent preparation part 113 adjusts the pressure inside the replenishment part 50 so as to reduce the pressure difference between the inside of the replenishment part 50 and the inside of the liquid feeding part 60 in a state in which the switching valve 71 closed. The vent preparation part 113 controls the pump driving part 57 (the pressure in the pump 56) so that, for example, the pressure in the replenishment part 50 approaches from the standby pressure Pw1 to the set value Pd of the discharge pressure. The standby pressure Pw1 is a set value at which the pressure in the replenishment part 50 is maintained during execution of steps S01 and S02, and may be larger than the set value Pd of the discharge pressure.

Next, the control device 100 executes step S32. In step S32, the vent preparation part 113 switches the switching valve 71 from the closed state to the opened state while maintaining the first connection valve 67, the second connection valve 68, and the discharge valve 72 in the closed state. At this time, the vent preparation part 113 may switch the switching valve 71 from the closed state to the opened state at an opening degree change rate smaller than that of the second connection valve 68.

Next, the control device 100 executes steps S33 and S34. In step S33, the vent preparation part 113 readjusts the pressure in the replenishment part 50 based on the measurement value of the pressure measurement part 69. The vent preparation part 113 controls the pump driving part 57 so that, for example, the measurement value measured by the pressure measurement part 69 approaches the set value Pd. Further, in step S33, the switching valve 71 is opened and the replenishment part 50 and the liquid feeding part 60 are connected. Since the pressure feeding part 64 of the liquid feeding part 60 is disconnected from the conduit connected to the pressure measurement part 69, the pressure in the replenishment part 50 is adjusted. The vent preparation part 113 repeats the process of steps S33 and S34 until a predetermined time has elapsed from the start of execution of step S33. The predetermined time is set in advance such that the adjustment of the pressure inside the replenishment part 50 is repeated until the pressure inside the replenishment part 50 substantially matches the set value Pd, and is stored in the operation command holding part 102.

When it is determined in step S34 that the predetermined time has elapsed, the control device 100 executes step S35. In step S35, the vent preparation part 113 switches the switching valve 71 from the opened state to the closed state and switches the first connection valve 67 from the closed state to the opened state while maintaining the second connection valve 68 and the discharge valve 72 in the closed state. At this time, the vent preparation part 113 may switch the switching valve 71 from the opened state to the closed state at an opening degree change rate (operation speed) smaller than that of the first connection valve 67.

Next, the control device 100 executes steps S36 and S37. In step S36, the vent preparation part 113 adjusts the pressure inside the liquid feeding part 60 based on the measurement value of the pressure measurement part 69. The vent preparation part 113 controls the pump driving part 77 so that, for example, the measurement value measured by the pressure measurement part 69 approaches the set value Pd. The vent preparation part 113 repeats the process of steps S36 and S37 until a predetermined time has elapsed from the start of execution of step S36. The predetermined time is set in advance such that the adjustment of the pressure in the liquid feeding part 60 is repeated until the pressure in the liquid feeding part 60 substantially matches the set value Pd, and is stored in the operation command holding part 102.

When it is determined in step S37 that the predetermined time has elapsed, the vent preparation part 113 executes step S38. In step S38, the vent controller 114 switches the switching valve 71 from the closed state to the opened state while keeping the second connection valve 68 and the discharge valve 72 in the closed state and keeping the first connection valve 67 in the opened state. At this time, the vent controller 114 may switch the switching valve 71 from the closed state to the opened state at an opening degree change rate (operation speed) smaller than that of the first connection valve 67. Thus, the vent preparation part 113 terminates the vent preparation procedure.

(Vent Control)

Figure 11:
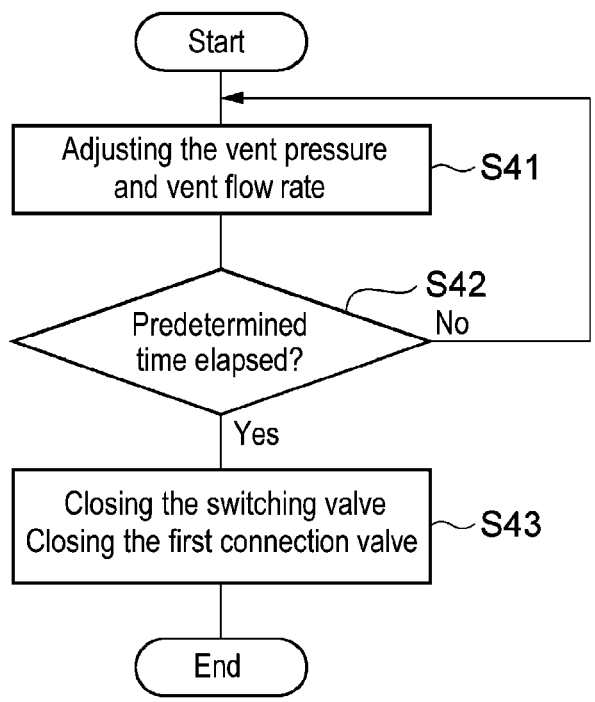
FIG. 11 is a flowchart showing an example of a vent control procedure.

FIG. 11 is a flowchart showing an example of the vent control procedure. As shown in FIG. 11, the control device 100 first executes steps S41 and S42. In step S41, the vent controller 114 adjusts the vent pressure and vent flow rate of the processing liquid fed from the pressure feeding part 64 of the liquid feeding part 60 to the pressure feeding part 53 of the replenishment part 50. In step S41, the vent controller 114 starts the vent by starting the control of the pressure feeding part 53 and the pressure feeding part 64 in order to adjust the vent pressure and the vent flow rate. The vent controller 114 continues to adjust the vent pressure and the vent flow rate even after starting the vent. The vent controller 114 controls the pump driving part 57 to reduce the pressure in the pump 56 so that, for example, the vent pressure (measurement value measured by the pressure measurement part 69) follows the target value. Further, the vent controller 114 controls the pump driving part 77 based on the measurement value of the flow rate measurement part 65 so that the vent flow rate follows the target value. The target values of the vent pressure and the vent flow rate may be set to, for example, constant values until the vent is completed. The vent controller 114 repeats the process of steps S41 and S42 until the predetermined time has elapsed from the start of execution of step S41. The predetermined time is set in advance so that the vent is completed within the predetermined time, and is stored in the operation command holding part 102.

When it is determined in step S42 that the predetermined time has elapsed, the control device 100 executes step S43. In step S43, the vent controller 114 switches the switching valve 71 and the first connection valve 67 from the opened state to the closed state while keeping the second connection valve 68 and the discharge valve 72 in the closed state. At this time, the vent controller 114 may switch the switching valve 71 from the opened state to the closed state at an opening degree change rate (operation speed) smaller than that of the first connection valve 67. Thus, the vent controller 114 terminates the vent control procedure.

(Replenishment Preparation)

Figure 12:
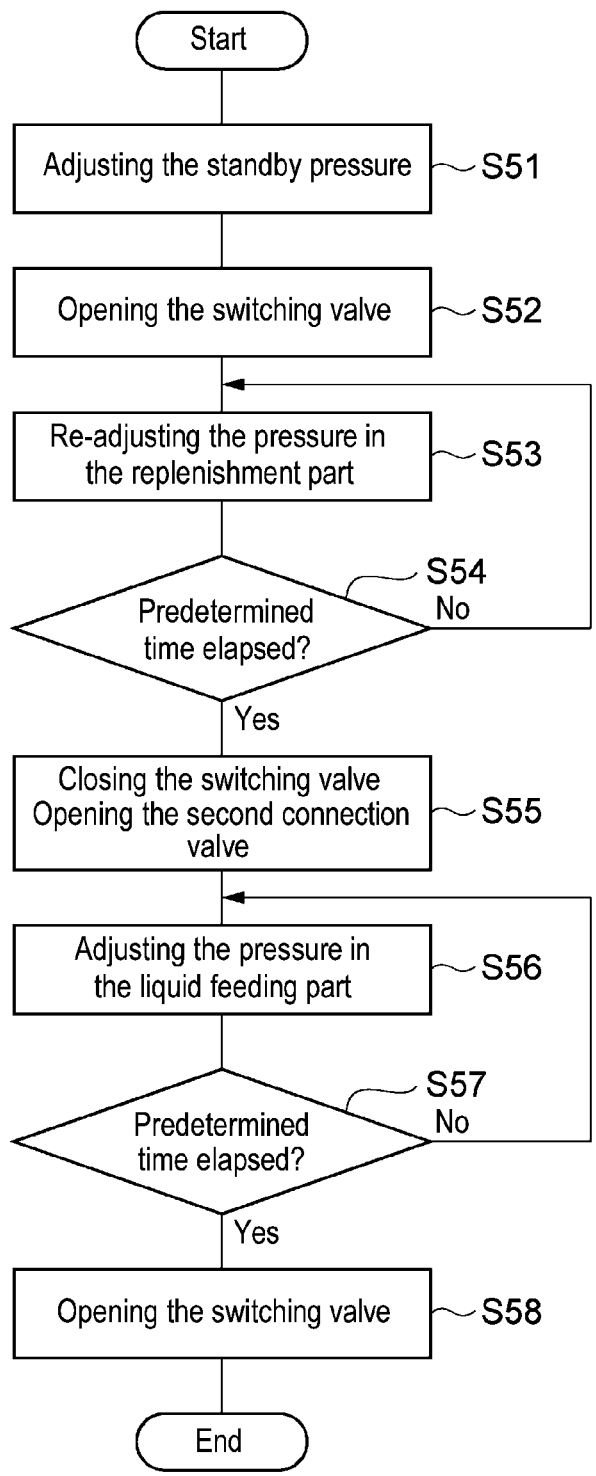
FIG. 12 is a flowchart showing an example of a replenishment preparation procedure.
Figure 14A:
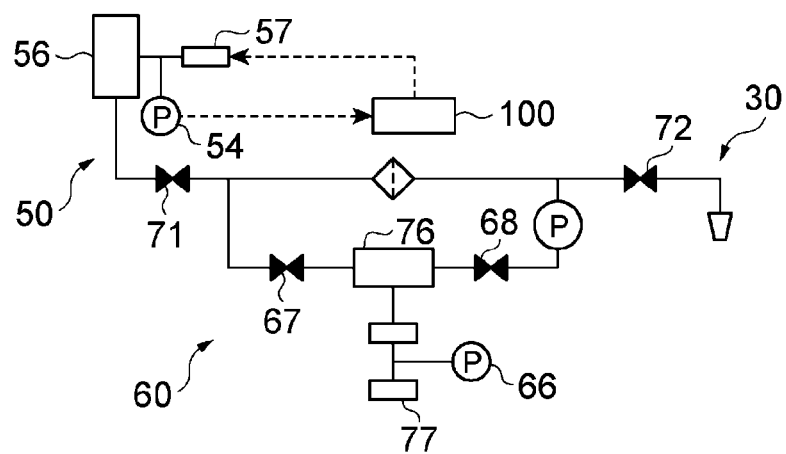
FIGS. 14A to 14C are schematic diagrams for explaining an example of the replenishment preparation procedure.

FIG. 12 is a flowchart showing an example of the replenishment preparation procedure in step S05. As shown in FIG. 12, the control device 100 first executes step S51. In step S51, the replenishment preparation part 115 adjusts the pressure in the replenishment part 50 so as to reduce the pressure difference between the inside of the replenishment part 50 and the inside of the liquid feeding part 60 in a state in which the switching valve 71 is closed. For example, as shown in FIG. 14A, the replenishment controller 116 controls the pressure feeding part 53 (the pump driving part 57) based on the measurement value of the pressure measurement part 54.

The replenishment controller 116 may control the pump driving part 57 so that the pressure in the replenishment part 50 approaches the set value Pd of the discharge pressure. For example, the replenishment controller 116 may adjust the driving pressure from the pump driving part 57 to the pump 56 according to a deviation between the measurement value of the pressure measurement part 54 and the set value Pd so that the deviation approaches zero. When the vent is not performed (when steps S03 and S04 are omitted), the inside of the replenishment part 50 is maintained at the standby pressure Pw1 before the start of step S05. Therefore, in this case, the replenishment controller 116 controls the pump driving part 57 so that the pressure in the replenishment part 50 approaches from the standby pressure Pw1 to the set value Pd.

Figure 14B:
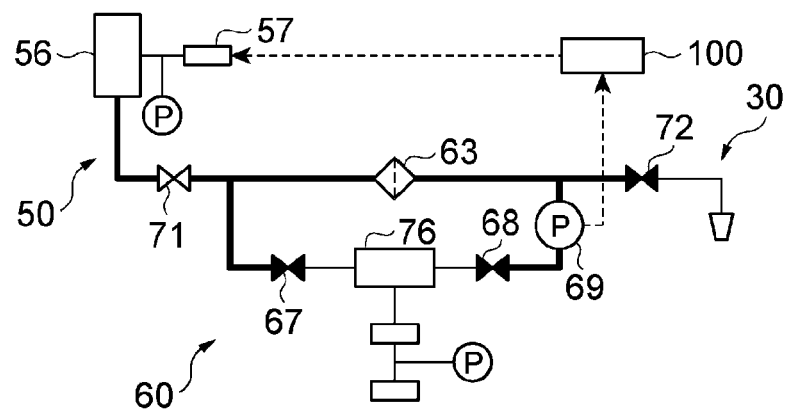

Next, the control device 100 executes step S52. In step S52, as shown in FIG. 14B, the replenishment preparation part 115 switches the switching valve 71 from the closed state to the opened state while keeping the first connection valve 67, the second connection valve 68, and the discharge valve 72 closed. At this time, the replenishment preparation part 115 may switch the switching valve 71 from the closed state to the opened state at an opening degree change rate (operation speed) smaller than that of the second connection valve 68.

Next, the control device 100 executes steps S53 and S54. In step S53, the replenishment preparation part 115 readjusts the pressure in the replenishment part 50 based on the measurement value of the pressure measurement part 69. Specifically, the replenishment preparation part 115 controls the pressure feeding part 53 so that the pressure between the pressure feeding part 53 and the pressure feeding part 64 approaches a predetermined set value. The replenishment preparation part 115 may control the pump driving part 57 so that, for example, the measurement value measured by the pressure measurement part 69 approaches the set value Pd. For example, the replenishment preparation part 115 adjusts the driving pressure from the pump driving part 57 to the pump 56 according to a deviation between the measurement value of the pressure measurement part 69 and the set value Pd so that the deviation approaches zero. The replenishment preparation part 115 repeats the process of steps S53 and S54 until a predetermined time has elapsed from the start of execution of step S53. The predetermined time is set in advance so that the pressure in the replenishment part 50 (the pressure between the pressure feeding part 53 and the pressure feeding part 64) substantially matches the set value Pd within the predetermined time, and is stored in the operation command holding part 102.

Figure 14C:
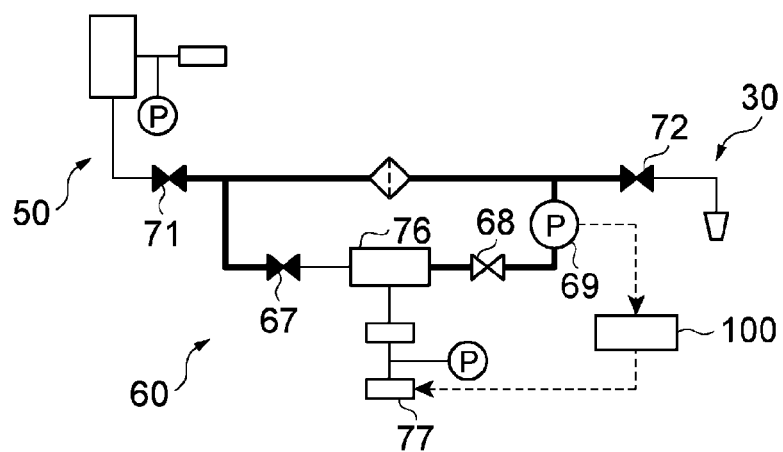

When it is determined in step S54 that the predetermined time has elapsed, the control device 100 executes step S55. In step S55, as shown in FIG. 14C, the replenishment preparation part 115 switches the switching valve 71 from the opened state to the closed state and switches the second connection valve 68 from the closed state to the opened state while keeping the first connection valve 67 and the discharge valve 72 in the closed state. At this time, the replenishment preparation part 115 may switch the switching valve 71 from the opened state to the closed state at an opening degree change rate (operation speed) smaller than that of the second connection valve 68.

Next, the control device 100 executes steps S56 and S57. In step S56, the replenishment preparation part 115 adjusts the pressure in the liquid feeding part 60 based on the measurement value of the pressure measurement part 69. Specifically, the replenishment preparation part 115 controls the pressure feeding part 64 (the pump driving part 77) based on the measurement value of the pressure measurement part 69 so that the pressure in the liquid feeding part 60 approaches the set value used in step S53. The replenishment preparation part 115 may control the pump driving part 77 so that the measurement value measured by the pressure measurement part 69 approaches the set value Pd. For example, the replenishment preparation part 115 adjusts the driving pressure from the pump driving part 77 to the pump 76 according to a deviation between the measurement value of the pressure measurement part 69 and the set value Pd so that the deviation approaches zero. The replenishment preparation part 115 repeats the process of steps S56 and S57 until a predetermined time has elapsed from the start of execution of step S56. The predetermined time is set in advance so that the pressure in the liquid feeding part 60 substantially matches the set value Pd within the predetermined time, and is stored in the operation command holding part 102.

When it is determined in step S57 that the predetermined time has elapsed, the control device 100 executes step S58. In step S58, the replenishment controller 116 switches the switching valve 71 from the closed state to the opened state while keeping the second connection valve 68 and the discharge valve 72 in the closed state and keeping the second connection valve 68 in the opened state. At this time, the replenishment controller 116 may switch the switching valve 71 from the closed state to the opened state at an opening degree change rate (operation speed) smaller than that of the second connection valve 68. Thus, the replenishment preparation part 115 terminates the replenishment preparation procedure.

(Replenishment Control)

Figure 13:
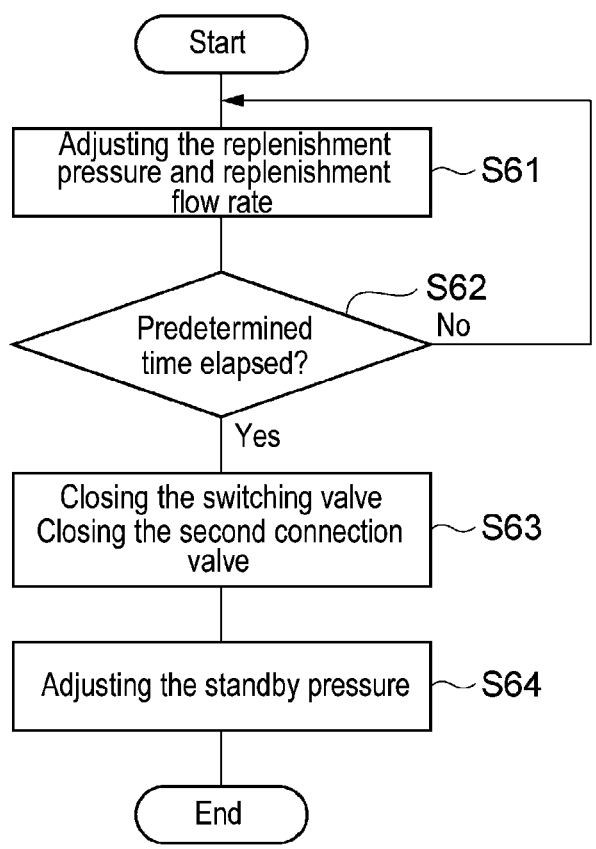
FIG. 13 is a flowchart showing an example of a replenishment control procedure.
Figure 14D:
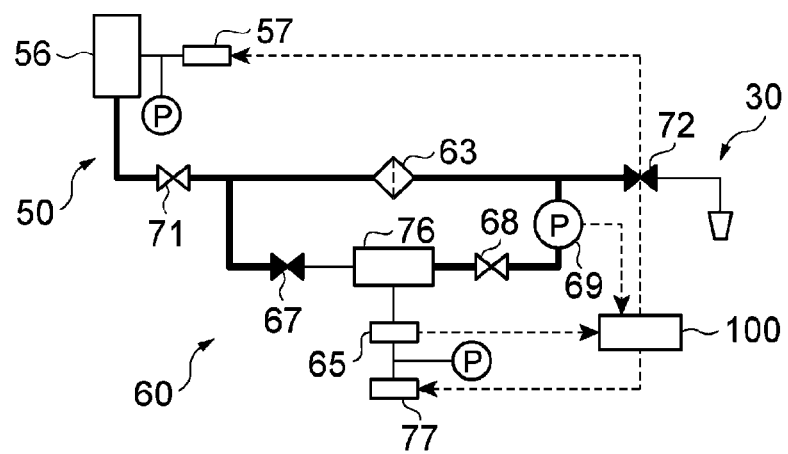
FIG. 14D is a schematic diagram for explaining an example of the replenishment control procedure.

FIG. 13 is a flowchart showing an example of the replenishment control procedure. As shown in FIG. 13, the control device 100 first executes steps S61 and S62. In step S61, the replenishment controller 116 adjusts the replenishment pressure and replenishment flow rate of the processing liquid fed from the pressure feeding part 53 of the replenishment part 50 to the pressure feeding part 64 of the liquid feeding part 60. The replenishment controller 116 starts control of the pressure feeding part 53 and the pressure feeding part 64 to adjust the replenishment pressure and the replenishment flow rate, thereby starting the replenishment of the processing liquid. The replenishment controller 116 continues to adjust the replenishment pressure and the replenishment flow rate even after the start of replenishment. Specifically, the replenishment controller 116 controls either one of the pressure feeding part 53 and the pressure feeding part 64 so that the replenishment pressure follows the target value, and controls the other of the pressure feeding part 53 and the pressure feeding part 64 so that the replenishment flow rate follows the target value. As shown in FIG. 14D, the replenishment controller 116 may control the pressure feeding part 53 (the pump driving part 57) based on, for example, the measurement value measured by the pressure measurement part 69 so that the replenishment pressure follows the target value. The replenishment controller 116 may control the pressure feeding part 64 (the pump driving part 77) based on the measurement value of the flow rate measurement part 65 so that the replenishment flow rate follows the target value.

The replenishment controller 116 repeats the process of steps S61 and S62 until a predetermined time has elapsed from the start of execution of step S61. The predetermined time is set in advance so that the replenishment of the processing liquid to the liquid feeding part 60 (the pump 76) is completed within the predetermined time, and is stored in the operation command holding part 102. In the control for causing the replenishment pressure to follow the target value, the replenishment controller 116 may set the target value of the replenishment pressure to the set value Pd of the discharge pressure (the target value of the discharge pressure) until a predetermined time elapses (until the replenishment of the processing liquid is completed). For example, from the start of replenishment to the end of replenishment, the replenishment controller 116 may control the driving pressure from the pump driving part 57 to the pump 56 so that the deviation between the measurement value of the pressure measurement part 69 and the set value Pd approaches zero and so that the state in which the deviation substantially matches zero is maintained.

When it is determined in step S62 that the predetermined time has elapsed, the control device 100 executes step S63. In step S63, the replenishment controller 116 switches the switching valve 71 and the second connection valve 68 from the opened state to the closed state while keeping the first connection valve 67 and the discharge valve 72 in the closed state. At this time, the replenishment controller 116 may switch the switching valve 71 from the opened state to the closed state at an opening degree change rate (operation speed) smaller than that of the second connection valve 68.

Next, the control device 100 executes step S64. In step S64, the control device 100 adjusts each of the pressure in the pump 56 of the replenishment part 50 and the pressure in the pump 76 of the liquid feeding part 60. The control device 100 adjusts the pressure in the pump 56 (the pressure in the replenishment part 50) to a standby pressure Pw1 by, for example, controlling the pump driving part 57 based on the measurement value measured by the pressure measurement part 54. The control device 100 adjusts the pressure in the pump 76 to a standby pressure Pw2 by, for example, controlling the pump driving part 77 based on the measurement value measured by the pressure measurement part 66. The standby pressure Pw2 may be smaller than the standby pressure Pw1. Thus, the replenishment controller 116 terminates the replenishment control procedure.

[Effects of the Embodiment]

The coating and developing apparatus 2 described above includes: the discharge part 30 having the nozzle 31 configured to discharge the processing liquid onto the wafer W; the liquid feeding part 60 configured to feed the processing liquid to the discharge part 30; the replenishment part 50 configured to replenish the liquid feeding part 60 with the processing liquid to be fed to the discharge part 30; the first connection part 80 having the switching valve 71 configured to open and close a flow path between the replenishment part 50 and the liquid feeding part 60; the filter 63 configured to remove foreign matters contained in the processing liquid replenished from the replenishment part 50 to the liquid feeding part 60; the replenishment preparation part 115 configured to open the switching valve 71 after reducing the pressure difference between the inside of the replenishment part 50 and the inside of the liquid feeding part 60; and the replenishment controller 116 configured to start replenishment of the processing liquid from the replenishment part 50 to the liquid feeding part 60 in a state in which the switching valve 71 is opened by the replenishment preparation part 115.

The control method of the coating and developing apparatus 2 described above includes: opening the switching valve 71 after reducing the pressure difference between the inside of the replenishment part 50 and the inside of the liquid feeding part 60; and starting replenishment of the processing liquid from the replenishment part 50 to the liquid feeding part 60 in a state in which the switching valve 71 is opened.

If the switching valve 71 is opened in a state in which the pressure difference between the replenishment part 50 and the liquid feeding part 60 is large, a hunting of the processing liquid may occur in the flow path for replenishing the processing liquid from the replenishment part 50 to the liquid feeding part 60. The hunting of the processing liquid means that the processing liquid reciprocates in the flow path. When the hunting of the processing liquid occurs, the processing liquid passes through the filter 63 in a reciprocating manner, whereby particles are easily generated from the filter 63. On the other hand, in the coating and developing apparatus 2 and the control method, the switching valve 71 is opened after the pressure difference between the inside of the replenishment part 50 and the inside of the liquid feeding part 60 is reduced. Therefore, the generation of particles due to the hunting of the processing liquid is suppressed. Accordingly, the coating and developing apparatus 2 and the control method described above are useful for reducing particles in the processing liquid discharged onto the wafer W.

In the above-described embodiment, the filter 63 is provided inside the liquid feeding part 60. If the switching valve 71 is opened in a state in which the pressure difference between the inside of the replenishment part 50 and the inside of the liquid feeding part 60 is large, the hunting of the processing liquid may occur in the liquid feeding part 60 to such an extent that particles are generated from the filter 63. On the other hand, in the above configuration, the switching valve 71 is opened after the pressure difference between the inside of the replenishment part 50 and the inside of the liquid feeding part 60 is reduced. Therefore, the coating and developing apparatus 2 and the control method described above are useful for suppressing the generation of particles due to the hunting of the processing liquid in the liquid feeding part 60.

In the above-described embodiment, the liquid feeding part 60 includes: the liquid feeding pipe 61 configured to connect the replenishment part 50 and the discharge part 30 via the filter 63; the pressure feeding part 64 configured to receive the processing liquid from the replenishment part 50 via the liquid feeding pipe 61 and feed the processing liquid to the discharge part 30 via the liquid feeding pipe 61; and the second connection valve 68 configured to open and close a flow path between the liquid feeding pipe 61 and the pressure feeding part 64. The replenishment part 50 includes: the liquid source 51; and the pressure feeding part 53 configured to feed the processing liquid from the liquid source 51 to the liquid feeding part 60. The replenishment controller 116 controls one of the pressure feeding part 53 and the pressure feeding part 64 so that the replenishment pressure from the pressure feeding part 53 to the pressure feeding part 64 follows the target value. The replenishment controller 116 controls the other of the pressure feeding part 53 and the pressure feeding part 64 so that the replenishment flow rate from the pressure feeding part 53 to the pressure feeding part 64 follows the target value. In this case, the pressure of the processing liquid during replenishment can be adjusted while adjusting the replenishment flow rate. As a result, it becomes possible to replenish the processing liquid at the liquid pressure suitable for reducing particles.

In the above-described embodiment, the coating and developing apparatus 2 includes: the discharge valve 72 configured to open and close a flow path between the liquid feeding part 60 and the discharge part 30; the discharge preparation part 111 configured to open the discharge valve 72 after changing the pressure inside the liquid feeding part 60 so as to reduce the pressure difference between the inside of the liquid feeding part 60 and the inside of the discharge part 30; and the discharge controller 112 configured to start discharge of the processing liquid from the nozzle 31 to the wafer W in a state in which the discharge valve 72 is opened by the discharge preparation part 111. In this case, the discharge valve 72 is opened in a state in which the pressure difference between the inside of the liquid feeding part 60 and the inside of the discharge part 30 is reduced, Therefore, the hunting of the processing liquid due to the opening of the discharge valve 72 can be suppressed. Accordingly, the coating and developing apparatus 2 and the control method described above are more useful for reducing particles in the processing liquid discharged onto the wafer W.

In the above-described embodiment, the liquid feeding part 60 includes: the liquid feeding pipe 61 configured to connect the replenishment part 50 and the discharge part 30 via the filter 63; the pressure feeding part 64 configured to receive the processing liquid from the replenishment part 50 via the liquid feeding pipe 61 and feed the processing liquid to the discharge part 30 via the liquid feeding pipe 61; and the second connection valve 68 configured to open and close a flow path between the liquid feeding pipe 61 and the pressure feeding part 64. The switching valve 71 is opened and closed at an opening degree change rate smaller than that of the second connection valve 68. Along with the opening/closing operation of the switching valve 71, the liquid pressure varies during the opening/closing operation. In the above configuration, the opening/closing operation of the switching valve 71 is performed at a small opening degree change rate so that a rapid change in the liquid pressure acting on the filter 63 is suppressed. Accordingly, the coating and developing apparatus 2 and the control method described above are more useful for reducing particles in the processing liquid discharged onto the wafer W.

In the above-described embodiment, the replenishment preparation part 115 changes the pressure inside the replenishment part 50 so as to reduce the pressure difference between the inside of the replenishment part 50 and the inside of the liquid feeding part 60 in a state in which the switching valve 71 is closed. In this case, before the switching valve 71 is opened, the pressure inside the replenishment part 50 is changed to reduce the pressure difference between the inside of the replenishment part 50 and the inside of the liquid feeding part 60. Therefore, the hunting of the processing liquid generated along with the opening of the switching valve 71 is suppressed.

In the above-described embodiment, the coating and developing apparatus 2 includes: the discharge controller 112 configured to control the pressure feeding part 64 so that the discharge pressure of the processing liquid fed to the nozzle 31 follows the target value. In controlling the replenishment pressure to follow the target value, the replenishment preparation part 115 sets the target value of the replenishment pressure to the target value of the discharge pressure until the replenishment of the processing liquid is completed. In this case, the variation of the pressure acting on the filter 63 is suppressed during the replenishment of the processing liquid, and thus the generation of particles from the filter 63 can be further suppressed.

In the above-described embodiment, the coating and developing apparatus 2 includes: the discharge valve 72 configured to open and close a flow path between the liquid feeding part 60 and the discharge part 30. The liquid feeding part 60 includes: the liquid feeding pipe 61 configured to connect the replenishment part 50 and the discharge part 30 via the filter 63; the pressure feeding part 64 configured to receive the processing liquid from the replenishment part 50 via the liquid feeding pipe 61 and feed the processing liquid to the discharge part 30 via the liquid feeding pipe 61; the second connection valve 68 configured to open and close a flow path between the liquid feeding pipe 61 and the pressure feeding part 64; and the pressure measurement part 69 configured to measure the pressure between the filter 63 and the pressure feeding part 64. The replenishment part 50 includes a liquid source 51, and a pressure feeding part 53 which feeds the processing liquid from the liquid source 51 to the liquid feeding part 60. The replenishment preparation part 115 sequentially executes: controlling the pressure feeding part 53 so as to reduce the pressure difference between the inside of the replenishment part 50 and the inside of the liquid feeding part 60 in a state in which the switching valve 71 is closed; controlling the pressure feeding part 53 based on the measurement value of the pressure measurement part 69 in a state in which the switching valve 71 is opened and the discharge valve 72 and the second connection valve 68 are closed, so that the pressure between the pressure feeding part 53 and the pressure feeding part 64 approaches the set value; and controlling the pressure feeding part 64 based on the measurement value of the pressure measurement part 69 in a state in which the switching valve 71 and the discharge valve 72 are closed and the second connection valve 68 is opened, so that the pressure inside the liquid feeding part 60 approaches the set value. In this case, in the state in which the switching valve 71 is opened, the pressure in the replenishment part 50 and the pressure in the liquid feeding part 60 can be brought close to the same set value based on the same measurement value of the pressure measurement part 69. Therefore, before the start of replenishment, the pressure difference between the inside of the replenishment part 50 and the inside of the liquid feeding part 60 is further reduced. Accordingly, the coating and developing apparatus 2 and the control method described above are more useful for reducing particles in the processing liquid discharged onto the wafer W.

Figure 15A:
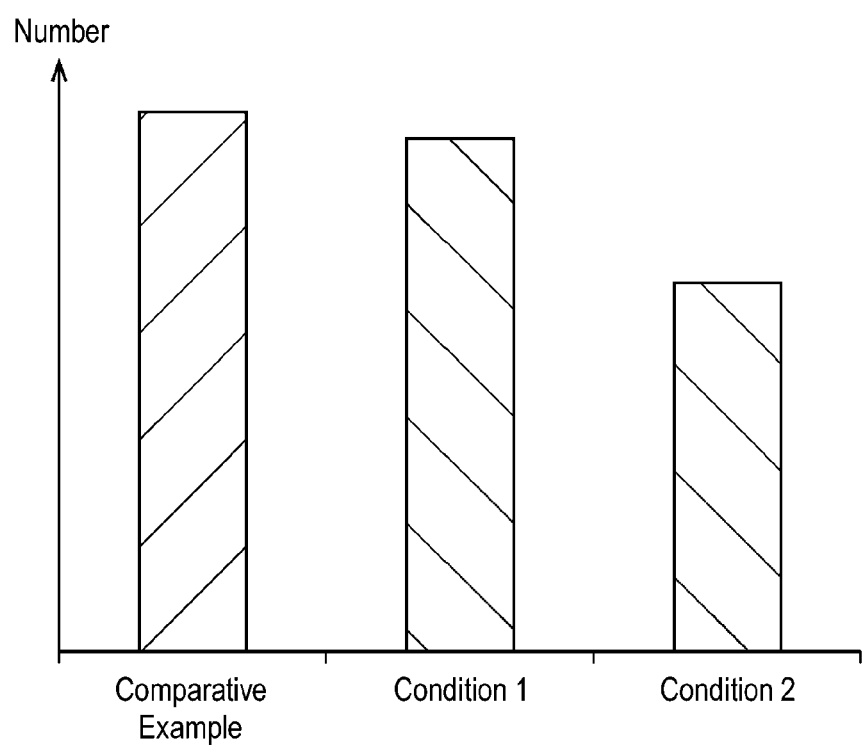
FIGS. 15A and 15B are graphs showing an example of measurement results of the number of particles contained in a discharged processing liquid.
Figure 15B:
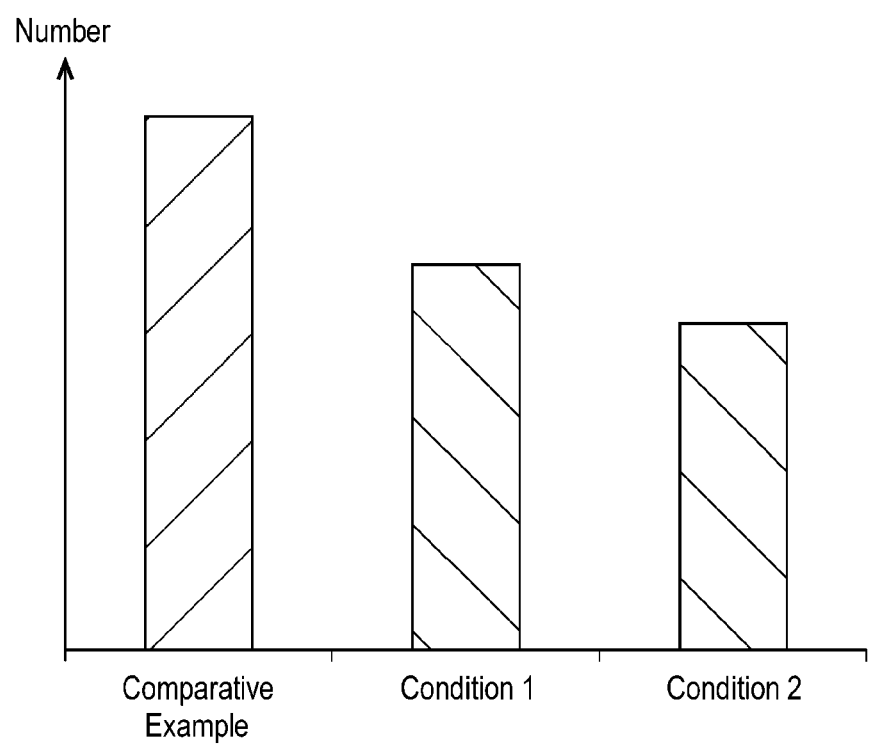

FIGS. 15A and 15B are graphs showing an example of the measurement results of the number of particles contained in the discharged processing liquid. In FIGS. 15A and 15B, the vertical axis represents the number of particles. In the measurement result shown in FIG. 15A and the measurement result shown in FIG. 15B, the minimum values of the sizes of the particles to be measured are different from each other. The minimum value in the measurement result shown in FIG. 15B is larger than the minimum value in the measurement result shown in FIG. 15A.

In the measurement of "Comparative Example," the switching valve 71 was opened without reducing the pressure difference between the inside of the replenishment part 50 and the inside of the liquid feeding part 60, and the replenishment of the processing liquid from the replenishment part 50 to the liquid feeding part 60 was started in a state in which the switching valve 71 is opened. The target value of the discharge pressure was maintained at the set value Pd, the pressure in the liquid feeding part 60 during the replenishment preparation was adjusted to approach the set value Pr, and the pressure in the replenishment part 50 in the standby state before the discharge and during the discharge was maintained at the set value Pr. The set value Pr is larger than the set value Pd.

In the measurement of "Condition 1," the liquid processing procedure was executed in the same manner as in the above-described embodiment, except that the target value of the replenishment pressure was not maintained at the set value Pd during replenishment. Under the "Condition 1," in the replenishment process of the processing liquid, the follow-up control of the replenishment pressure to the target value was not performed, and the pressure feeding part 53 (the pump driving part 57) of the replenishment part 50 was controlled so that the replenishment flow rate of the processing liquid replenished to the liquid feeding part 60 becomes substantially constant. In the measurement of "Condition 2," the liquid processing procedure was executed as in the above-described embodiment. As shown in FIGS. 15A and 15B, it was confirmed that the number of particles contained in the processing liquid is reduced by reducing the pressure difference while keeping the switching valve 71 closed. Further, comparison of the measurement results of Condition 1 and Condition 2 reveals that the number of particles is further reduced by keeping the replenishment pressure substantially constant.

Figure 16A:
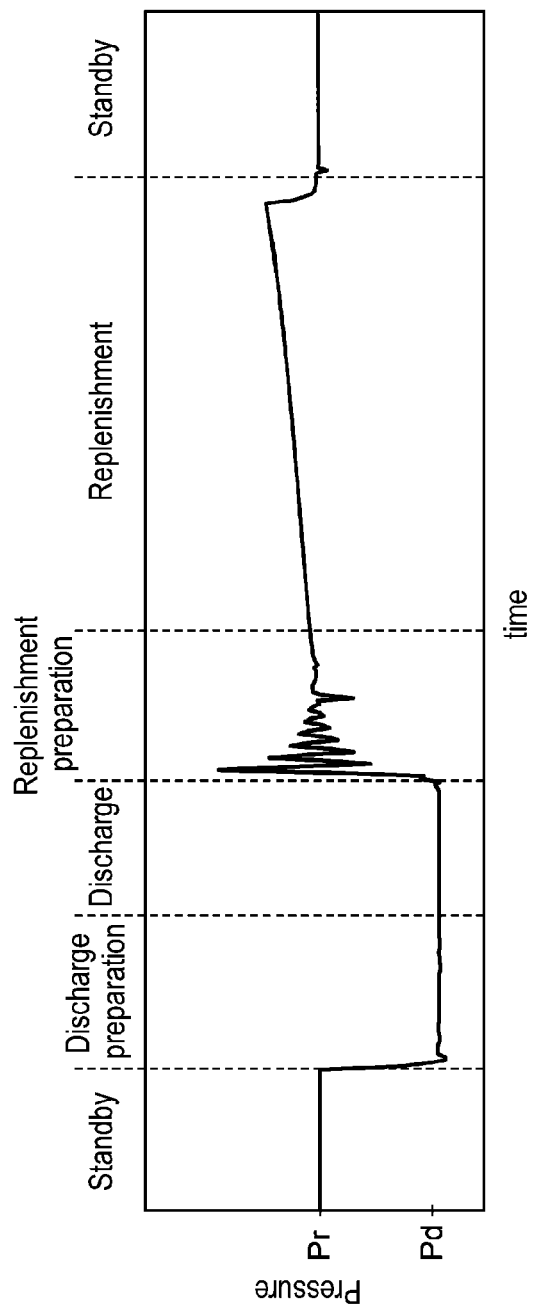

FIG. 16A shows a time-dependent variation of the measurement value (liquid pressure) of the pressure measurement part 69 in the Comparative Example. FIG. 16B shows a time-dependent variation of the measurement value (liquid pressure) of the pressure measurement part 69 under Condition 2. The time-dependent variations shown in FIGS. 16A and 16B show measurement values when the vent preparation and the vent processing are omitted. In the Comparative Example, at the stage of the replenishment preparation after the end of discharge, the switching valve 71 is opened in a state in which the pressure difference between the inside of the replenishment part 50 and the inside of the liquid feeding part 60 is large. As shown in FIG. 16A, in the replenishment preparation, the liquid pressure varies up and down around the set value Pr. This pressure variation indicates the hunting of the processing liquid described above. On the other hand, according to the measurement result of Condition 2, at the replenishment preparation stage after the end of discharge, the switching valve 71 is opened in a state in which the pressure difference between the replenishment part 50 and the liquid feeding part 60 is reduced. As shown in FIG. 16B, the hunting (pressure variation) of the processing liquid in the replenishment preparation is obviously smaller than that in the Comparative Example. It is considered that the suppression of this hunting is one of the factors that reduce particles. Furthermore, the replenishment pressure is maintained substantially constant during the replenishment of the processing liquid. Maintaining this replenishment pressure at a substantially constant level is also considered to be one of the factors for reducing particles.

Although the first embodiment has been described above, the present disclosure is not necessarily limited to the above-described embodiment, and various modifications may be made without departing from the scope of the present disclosure.

(Modification 1)

Figure 17A:
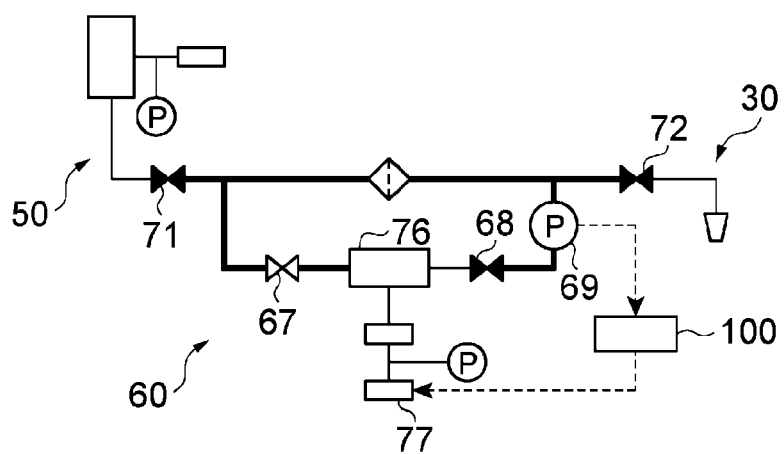
FIG. 17A is a schematic diagram for explaining another example of the discharge preparation procedure.

In the above-described example, in the discharge process, the processing liquid is fed from the liquid feeding part 60 to the discharge part 30 without passing through the filter 63. However, the discharge process is not limited thereto. For example, when the processing liquid is fed to the discharge part 30, the liquid feeding part 60 may feed the processing liquid to the discharge part 30 via the branch pipe 62*a* and the liquid feeding pipe 61 instead of the branch pipe 62*b*. In the discharge preparation procedure (in the same process as step S12), as shown in FIG. 17A, the discharge preparation part 111 may adjust the pressure in the liquid feeding part 60 by controlling the pump driving part 77 based on the measurement value of the pressure measurement part 69 while keeping the switching valve 71, the discharge valve 72, and the second connection valve 68 closed and keeping the first connection valve 67 opened.

Figure 17B:
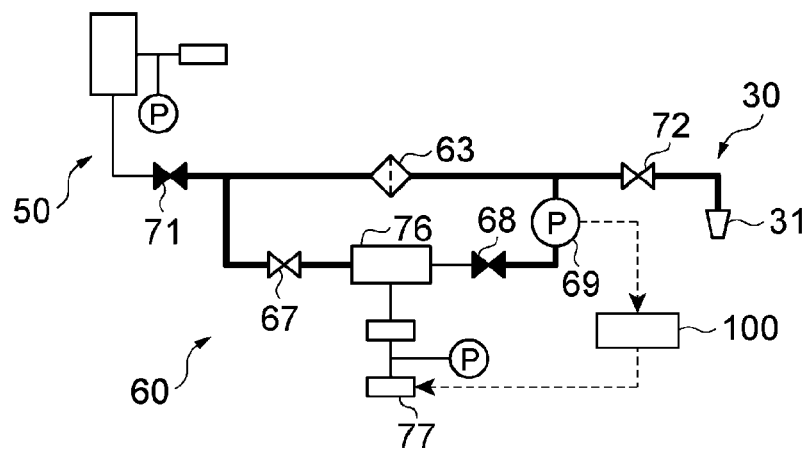
FIG. 17B is a schematic diagram for explaining another example of the discharge control procedure.

The discharge preparation part 111 may discharge the processing liquid from the nozzle 31 with the discharge valve 72 opened, by executing the same control as in steps S21 to S23. At this time, as shown in FIG. 17B, the processing liquid is fed from the pressure feeding part 64 (the pump 76) to the discharge part 30 through the filter 63. During the discharge of the processing liquid, the discharge preparation part 111 may adjust the pressure in the liquid feeding part 60 by, for example, controlling the pump driving part 77 based on the measurement value of the pressure measurement part 69 while keeping the switching valve 71 and the second connection valve 68 closed and keeping the first connection valve 67 and the discharge valve 72 opened.

(Modification 2)

In the above-described example, the replenishment pressure is maintained substantially constant at the set value Pd from the replenishment start to the replenishment end in the replenishment process. However, the target value of the replenishment pressure during replenishment is not limited thereto. For example, when the set value Pd of the discharge pressure is not suitable for the replenishment of the processing liquid, the replenishment preparation part 115 may execute the replenishment preparation so that the replenishment pressure becomes different from the set value Pd at the start of replenishment. Further, the replenishment controller 116 may execute follow-up control of the replenishment pressure to the target value so that the replenishment pressure gradually approaches the set value Pd during the replenishment of the processing liquid. FIG. 18A shows an example of the case where the pressure at the start of replenishment is set higher than the set value Pd of the discharge pressure. FIG. 18B shows an example of the case where the pressure at the start of replenishment is set lower than the set value Pd of the discharge pressure.

As shown in FIG. 18A, in the replenishment preparation process of step S05, the replenishment preparation part 115 may control the processing liquid supply part 29 so that the pressure in the replenishment part 50 and the pressure in the liquid feeding part 60 become larger than the set value Pd. The replenishment controller 116 may gradually bring the target value of the replenishment pressure from the set value larger than the set value Pd to approach the set value Pd (the target value of the discharge pressure) from the start of replenishment to the end of replenishment. As a result, in the replenishment process of step S06, the replenishment pressure gradually decreases from a value larger than the set value Pd to the set value Pd substantially equal to the discharge pressure at the time of discharge.

As shown in FIG. 18B, in the replenishment preparation process of step S05, the replenishment preparation part 115 may control the processing liquid supply part 29 so that the pressure in the replenishment part 50 and the pressure in the liquid feeding part 60 become smaller than the set value Pd. The replenishment controller 116 may gradually bring the target value of the replenishment pressure from the set value smaller than the set value Pd to approach the set value Pd (the target value of the discharge pressure) from the start of replenishment to the end of replenishment. As a result, in the replenishment process of step S06, the replenishment pressure gradually increases from a value smaller than the set value Pd to the set value Pd substantially equal to the discharge pressure at the time of discharge.

The coating and developing apparatus 2 according to modification 2 includes the discharge controller 112 configured to control the pressure feeding part 64 so that the discharge pressure of the processing liquid fed to the nozzle 31 follows the target value. In controlling the replenishment pressure to follow the target value, the replenishment controller 116 gradually brings the target value of the replenishment pressure to approach the target value of the discharge pressure (the set value Pd) until the replenishment of the processing liquid is completed. In this case, while starting the replenishment of the processing liquid in a state in which the replenishment pressure is set to a pressure suitable for replenishing the processing liquid, it is possible to bring the replenishment pressure to approach the target value of the discharge pressure during the replenishment. As a result, it becomes possible to more efficiently perform the liquid processing.

In the liquid processing procedure according to the above-described embodiment, the replenishment preparation part 115 may omit the adjustment of the pressure in the replenishment part 50 performed in step S53 and the adjustment of the pressure in the liquid feeding part 60 performed in step S56. In this case, the replenishment preparation part 115 may reduce the pressure difference by adjusting the standby pressure (perform the process of step S51), and may open the switching valve 71 immediately before the start of replenishment. Thereafter, the replenishment controller 116 may start replenishment of the processing liquid.

Second Embodiment

Next, a coating and developing apparatus 2 included in a substrate processing system according to a second embodiment will be described with reference to FIGS. 19 to 23B. The liquid processing procedure executed in the coating and developing apparatus 2 according to the second embodiment differs from that of the first embodiment in terms of the replenishment preparation procedure performed in step S05 and the replenishment control procedure performed in step S06. In this liquid processing procedure, for example, the target value of the discharge pressure is set to the set value Pd, and the pressure in the liquid feeding part 60 and the replenishment pressure before the start of discharge and before the start of replenishment are set to the set value Pr. The set value Pr is larger than the set value Pd.

For example, the replenishment preparation part 115 changes the pressure in the liquid feeding part 60 so as to reduce the pressure difference between the inside of the replenishment part 50 and the inside of the liquid feeding part 60 while keeping the switching valve 71 closed. The replenishment preparation part 115 needs only to at least reduce the pressure difference after the replenishment preparation, as compared with the pressure difference between the inside of the replenishment part 50 and the inside of the liquid feeding part 60 before the start of the replenishment preparation. As an example, the replenishment preparation part 115 changes the pressure in the liquid feeding part 60 so that the pressure in the liquid feeding part 60 substantially matches the pressure in the replenishment part 50. As described above, in the replenishment preparation according to the first embodiment, the pressure in the replenishment part 50 is changed to reduce the pressure difference, whereas in the replenishment preparation according to the second embodiment, the pressure in the liquid feeding part 60 is changed.

As an example of the replenishment preparation, the replenishment preparation part 115 first controls the pressure feeding part 64 (the pump driving part 77) based on the measurement value of the pressure measurement part 69 while keeping the switching valve 71 and the discharge valve 72 closed and keeping the second connection valve 68 opened, so that the pressure in the liquid feeding part 60 approaches the set value (e.g., the set value Pr). For example, the replenishment preparation part 115 adjusts the pressure from the pump driving part 77 to the pump 76 according to a deviation between the measurement value of the pressure measurement part 69 and the set value Pr so that the deviation approaches zero. Next, the replenishment preparation part 115 controls the pressure feeding part 53 based on the measurement value of the pressure measurement part 69 while keeping the switching valve 71 opened and keeping the discharge valve 72 and the second connection valve 68 closed, so that the pressure between the pressure feeding part 53 and the pressure feeding part 64 approaches the set value (e.g., the set value Pr). For example, the replenishment preparation part 115 adjusts the pressure from the pump driving part 57 to the pump 56 according to the deviation between the measurement value of the pressure measurement part 69 and the set value Pr so that the deviation approaches zero.

The replenishment controller 116 starts replenishment of the processing liquid to the liquid feeding part 60 from the replenishment part 50, for example, after the pressure in the liquid feeding part 60 is adjusted and the pressure in the replenishment part 50 is adjusted while keeping the switching valve 71 opened, by the replenishment preparation part 115. The replenishment controller 116 replenishes the processing liquid from the replenishment part 50 to the liquid feeding part 60 while keeping the switching valve 71 opened. Similar to the first embodiment, the replenishment controller 116 performs follow-up control of the replenishment pressure and follow-up control of the replenishment flow rate by controlling the pressure feeding part 53 and the pressure feeding part 64. The replenishment controller 116 may set the target value of the replenishment pressure to the set value Pr from the start of replenishment to the end of replenishment in controlling the replenishment pressure to follow the target value. For example, the replenishment controller 116 adjusts the driving pressure from the pump driving part 57 to the pump 56 according to a deviation between the measurement value of the pressure measurement part 69 and the set value Pr so that the deviation approaches zero.

(Replenishment Preparation)

Figure 19:
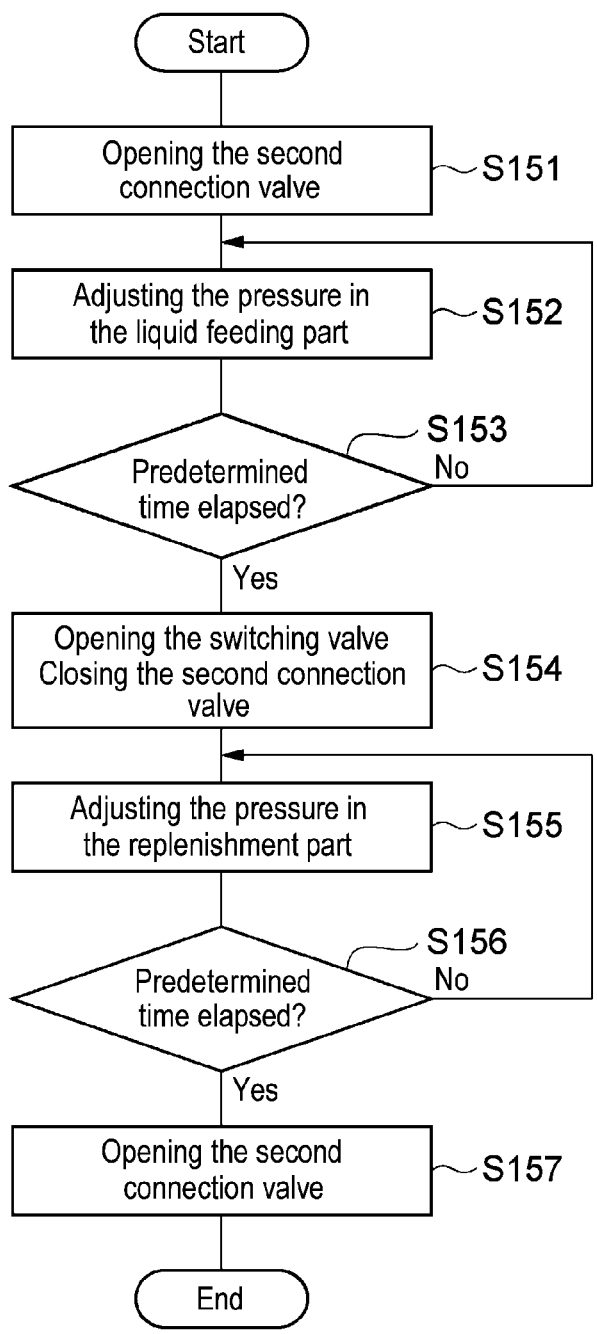
FIG. 19 is a flowchart showing an example of a replenishment preparation procedure according to a second embodiment.
Figure 21A:
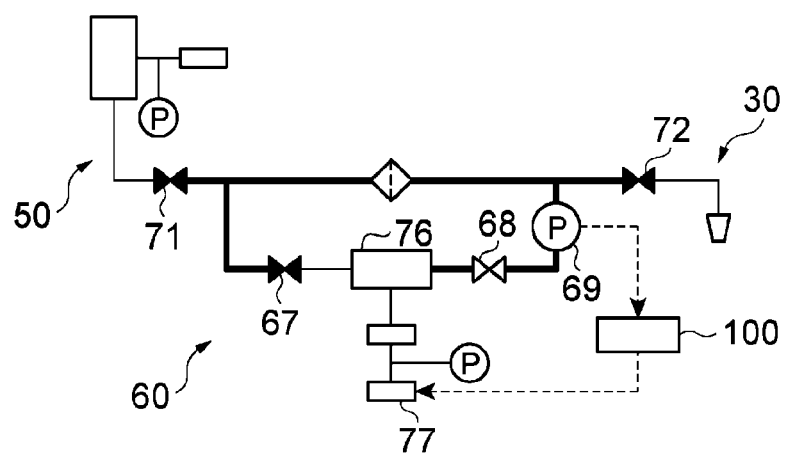
FIG. 21A and FIG. 21B are schematic diagrams for explaining an example of the replenishment preparation procedure.

FIG. 19 is a flowchart showing the replenishment preparation procedure according to the second embodiment. In this replenishment preparation procedure, for example, the control device 100 first executes step S151 in a state in which the pressure in the replenishment part 50 is maintained at the set value Pr. In step S151, for example, as shown in FIG. 21A, the replenishment controller 116 switches the second connection valve 68 from the closed state to the opened state while keeping the switching valve 71, the discharge valve 72, and the first connection valve 67 in the closed state.

Next, the control device 100 executes steps S152 and S153. In step S152, the replenishment controller 116 adjusts the pressure inside the liquid feeding part 60 so as to reduce the pressure difference between the inside of the replenishment part 50 and the inside of the liquid feeding part 60 in a state in which the switching valve 71 is closed. For example, as shown in FIG. 21A, the replenishment controller 116 controls the pressure feeding part 64 (the pump driving part 77) based on the measurement value of the pressure measurement part 69. The replenishment controller 116 may control the pump driving part 77 so that the pressure in the liquid feeding part 60 approaches the set value Pr of the replenishment pressure. For example, the replenishment controller 116 may adjust the driving pressure from the pump driving part 77 to the pump 76 according to a deviation between the measurement value of the pressure measurement part 69 and the set value Pr so that the deviation approaches zero. The replenishment controller 116 repeats the process of steps S152 and S153 until a predetermined time has elapsed from the start of execution of step S152. The predetermined time is set in advance so that the pressure in the liquid feeding part 60 substantially matches the set value Pr within the predetermined time, and is stored in the operation command holding part 102.

Figure 21B:
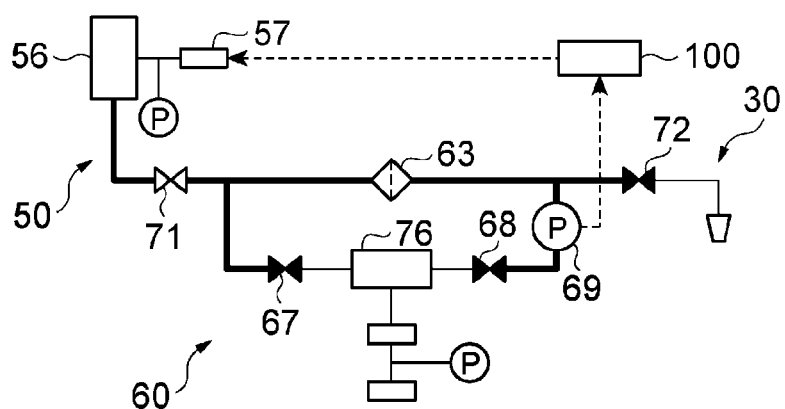

When it is determined in step S153 that the predetermined time has elapsed, the control device 100 executes step S154. In step S154, as shown in FIG. 21B, the replenishment preparation part 115 switches the switching valve 71 from the closed state to the opened state and switches the second connection valve 68 from the opened state to the closed state while keeping the first connection valve 67 and the discharge valve 72 in the closed state. At this time, the replenishment preparation part 115 may switch the switching valve 71 from the closed state to the opened state at an opening degree change rate (operation speed) smaller than that of the second connection valve 68.

Next, the control device 100 executes steps S155 and S156. In step S155, for example, the replenishment preparation part 115 adjusts the pressure in the replenishment part 50 (between the pressure feeding part 53 and the pressure feeding part 64) based on the measurement value of the pressure measurement part 69. Specifically, the replenishment preparation part 115 may control the pressure feeding part 53 such that the pressure between the pressure feeding part 53 and the pressure feeding part 64 approaches the set value used in step S152. The replenishment preparation part 115 controls the pump driving part 57 so that, for example, the measurement value measured by the pressure measurement part 69 approaches the set value Pr. As an example, the replenishment preparation part 115 adjusts the driving pressure from the pump driving part 57 to the pump 56 according to a deviation between the measurement value of the pressure measurement part 69 and the set value Pr so that the deviation approaches zero. The replenishment preparation part 115 repeats the process of steps S155 and S156 until a predetermined time has elapsed from the start of execution of step S155. The predetermined time is set in advance so that the pressure between the pressure feeding part 53 and the pressure feeding part 64 substantially matches the set value Pr within the predetermined time, and is stored in the operation command holding part 102.

When it is determined in step S156 that the predetermined time has elapsed, the replenishment preparation part 115 executes step S157. In step S157, the replenishment controller 116 switches the second connection valve 68 from the closed state to the opened state while keeping the first connection valve 67 and the discharge valve 72 in the closed state and keeping the switching valve 71 in the opened state. Thus, the replenishment preparation part 115 terminates the replenishment preparation procedure.

In the replenishment preparation procedure according to the first embodiment, the adjustment of the pressure in the replenishment part 50 with the switching valve 71 kept closed, the readjustment of the pressure in the replenishment part 50 with the switching valve 71 kept opened, and the adjustment of the pressure in the liquid feeding part 60 with the switching valve 71 kept closed are performed in this order. On the other hand, in the replenishment preparation procedure according to the above-described second embodiment, the adjustment of the pressure in the liquid feeding part 60 with the switching valve 71 kept closed and the adjustment of the pressure in the replenishment part 50 with the switching valve 71 kept opened are performed in this order.

(Replenishment Control)

Figure 20:
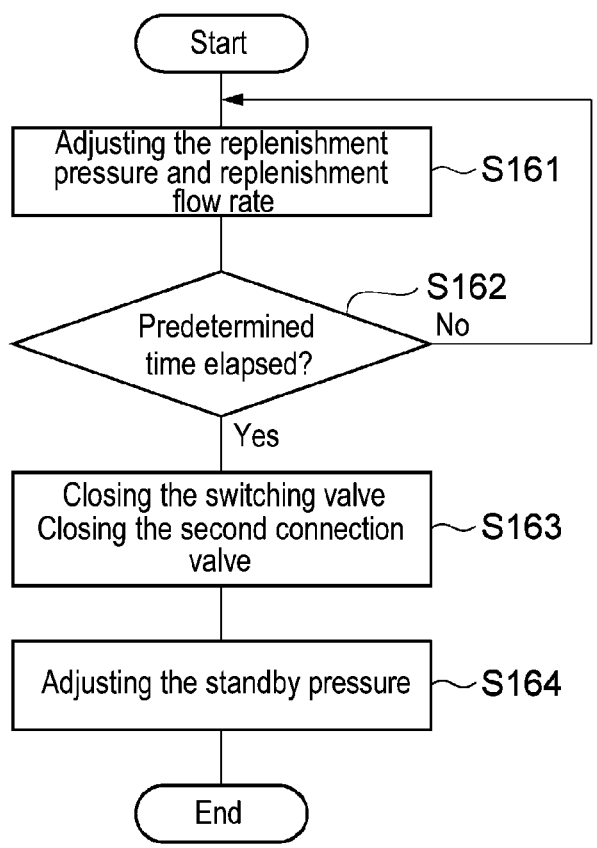
FIG. 20 is a flowchart showing an example of a replenishment control procedure.
Figure 21C:
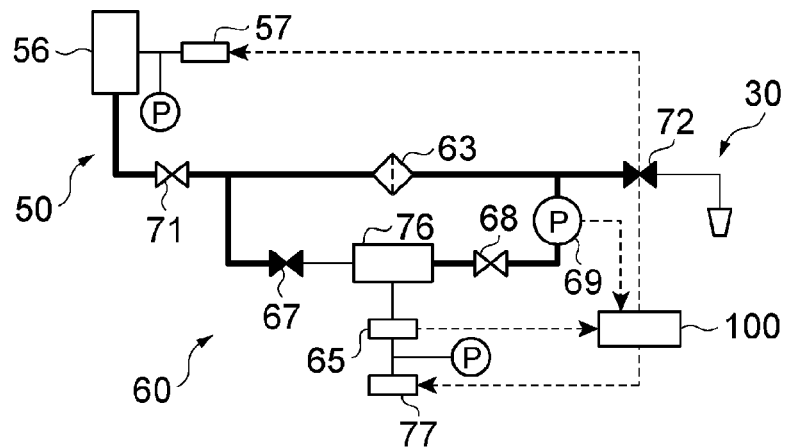
FIG. 21C is a schematic diagram for explaining an example of the replenishment control procedure.

FIG. 20 is a flowchart showing an example of the replenishment control procedure according to the second embodiment. As shown in FIG. 20, the control device 100 executes steps S161 and S162. In step S162, the replenishment controller 116 starts replenishment of the processing liquid by starting control of the pressure feeding part 53 and the pressure feeding part 64 in order to adjust the replenishment pressure and replenishment flow rate of the processing liquid fed from the pressure feeding part 53 of the replenishment part 50 to the pressure feeding part 64 of the liquid feeding part 60. For example, as shown in FIG. 21C, the replenishment controller 116 executes follow-up control of the replenishment pressure and the replenishment flow rate to the target values as in steps S61 and S62.

The replenishment controller 116 repeats the process of steps S161 and S162 until a predetermined time elapses from the start of execution of step S162. The predetermined time is set in advance so that the replenishment of the processing liquid to the liquid feeding part 60 (the pump 76) is completed within the predetermined time, and is stored in the operation command holding part 102. In controlling the replenishment pressure to follow the target value, the replenishment controller 116 may set the target value of the replenishment pressure to the set value Pr until a predetermined time elapses (until the replenishment of the processing liquid is completed). For example, the replenishment controller 116 adjusts the driving pressure from the pump driving part 57 to the pump 56 from the start of replenishment to the end of replenishment so that the deviation between the measurement value of the pressure measurement part 69 and the set value Pr approaches zero and so that the state in which the deviation substantially matches zero is maintained.

When it is determined in step S162 that the predetermined time has elapsed, the control device 100 executes step S163. In step S163, as in step S64, the replenishment controller 116 switches the switching valve 71 and the second connection valve 68 from the opened state to the closed state while keeping the first connection valve 67 and the discharge valve 72 in the closed state. At this time, the replenishment controller 116 may switch the switching valve 71 from the opened state to the closed state at an opening degree change rate (operation speed) smaller than that of the second connection valve 68.

Next, the control device 100 executes step S164. In step S164, the control device 100 adjusts the pressure in the pump 56 of the replenishment part 50 and the pressure in the pump 76 of the liquid feeding part 60. The control device 100 adjusts the pressure in the pump 56 (the pressure in the replenishment part 50) to the set value Pr (the standby pressure) by, for example, controlling the pump driving part 57 based on the measurement value measured by the pressure measurement part 54. The control device 100 adjusts the pressure in the pump 76 to a standby pressure smaller than the set value Pr by, for example, controlling the pump driving part 77 based on the measurement value measured by the pressure measurement part 66. Thus, the replenishment controller 116 terminates the replenishment control procedure.

In the processing liquid discharge control performed in the liquid processing procedure according to the second embodiment, as shown in FIG. 9B, the processing liquid may be fed from the pressure feeding part 64 (the pump 76) to the discharge part 30 without passing through the filter 63. Alternatively, as shown in FIG. 17B, the processing liquid may be fed from the pressure feeding part 64 (the pump 76) to the discharge part 30 through the filter 63.

In the vent preparation procedure performed in the liquid processing procedure according to the second embodiment, as in the above-described replenishment preparation, the adjustment of the pressure in the liquid feeding part 60 with the switching valve 71 kept closed and the adjustment of the pressure in the replenishment part 50 with the switching valve 71 kept opened may be performed in this order.

[Effects of Second Embodiment]

In the coating and developing apparatus 2 and the liquid processing procedure according to the second embodiment described above, as in the first embodiment, the switching valve 71 is opened after the pressure difference between the inside of the replenishment part 50 and the inside of the liquid feeding part 60 is reduced. For this reason, when the switching valve 71 is opened, the occurrence of hunting of the processing liquid in the flow path for replenishing the processing liquid from the replenishment part 50 to the liquid feeding part 60 is suppressed. In the above-described second embodiment, the filter 63 is provided in the liquid feeding part 60, and the occurrence of hunting of the processing liquid in the liquid feeding part 60 is suppressed. Accordingly, the coating and developing apparatus 2 and the liquid processing procedure according to the second embodiment are useful for reducing particles in the processing liquid discharged onto the wafer W.

In the above-described second embodiment, the replenishment preparation part 115 changes the pressure in the liquid feeding part 60 so as to reduce the pressure difference between the inside of the replenishment part 50 and the inside of the liquid feeding part 60 in a state in which the switching valve 71 is closed. In this case, before the switching valve 71 is opened, the pressure in the liquid feeding part 60 is changed to reduce the pressure difference between the inside of the replenishment part 50 and the inside of the liquid feeding part 60. Therefore, the hunting of the processing liquid that may occur along with the opening of the switching valve 71 is suppressed. The volume of the processing liquid in the pressure feeding part 64 (the pump 76) of the liquid feeding part 60 is often smaller than the volume of the processing liquid in the pressure feeding part 53 (the pump 56) of the replenishment part 50. Further, as for the pipe volume up to the filter 63 and the pressure measurement part 69, it is often the case that the pipe volume on the side of the liquid feeding part 60 is smaller than the pipe volume on the side of the replenishment part 50 (the distance between the pressure feeding part 64 and the pressure measurement part 69 is shorter than the distance between the pressure feeding part 53 and the pressure measurement part 69). In the above configuration, the pressure in the liquid feeding part 60 is changed. Therefore, as compared with the first embodiment, it is possible to perform pressure control with high resolution (high accuracy) and to perform pressure control in a rapid manner.

In the above-described second embodiment, the liquid feeding part 60 includes: the liquid feeding pipe 61 configured to connect the replenishment part 50 and the discharge part 30 via the filter 63; the pressure feeding part 64 configured to receive the processing liquid from the replenishment part 50 via the liquid feeding pipe 61 and feed the processing liquid to the discharge part 30 via the liquid feeding pipe 61; and the second connection valve 68 configured to open and close a flow path between the liquid feeding pipe 61 and the pressure feeding part 64. The replenishment part 50 includes: the liquid source 51; and the pressure feeding part 53 configured to feed the processing liquid from the liquid source 51 to the liquid feeding part 60. The replenishment controller 116 controls one of the pressure feeding part 53 and the pressure feeding part 64 so that the replenishment pressure from the pressure feeding part 53 to the pressure feeding part 64 follows the target value. The replenishment controller 116 controls the other of the pressure feeding part 53 and the pressure feeding part 64 so that the replenishment flow rate from the pressure feeding part 53 to the pressure feeding part 64 follows the target value. In this case, the pressure of the processing liquid during replenishment can be adjusted while adjusting the replenishment flow rate. As a result, it becomes possible to replenish the processing liquid at a liquid pressure suitable for reducing particles.

In the above-described second embodiment, the coating and developing apparatus 2 includes: the discharge valve 72 configured to open and close a flow path between the liquid feeding part 60 and the discharge part 30; the discharge preparation part 111 configured to open the discharge valve 72 after the pressure in the liquid feeding part 60 is changed so as to reduce the pressure difference between the inside of the liquid feeding part 60 and the inside of the discharge part 30; and the discharge controller 112 configured to start discharge of the processing liquid from the nozzle 31 to the wafer W in a state in which the discharge valve 72 is opened by the discharge preparation part 111. In this case, the discharge valve 72 is opened in a state in which the pressure difference between the inside of the liquid feeding part 60 and the inside of the discharge part 30 is reduced. Therefore, it is possible to suppress the hunting of the processing liquid that may occur along with the opening of the discharge valve 72. Accordingly, the coating and developing apparatus 2 according to the second embodiment is more useful for reducing particles in the processing liquid discharged onto the wafer W.

In the above-described second embodiment, the liquid feeding part 60 includes: the liquid feeding pipe 61 configured to connect the replenishment part 50 and the discharge part 30 via the filter 63; the pressure feeding part 64 configured to receive the processing liquid from the replenishment part 50 via the liquid feeding pipe 61 and feed the processing liquid to the discharge part 30 via the liquid feeding pipe 61; and the second connection valve 68 configured to open and close a flow path between the liquid feeding pipe 61 and the pressure feeding part 64. The switching valve 71 is opened and closed at an opening degree change rate smaller than that of the second connection valve 68. Along with the opening/closing operation of the switching valve 71, the liquid pressure varies during the opening/closing operation. In the above configuration, the opening/closing operation of the switching valve 71 is performed at a small opening degree change rate and thus a rapid change in the liquid pressure acting on the filter 63 is suppressed. Accordingly, it is more useful for reducing the particles in the processing liquid discharged onto the wafer W.

In the above-described second embodiment, the coating and developing apparatus 2 includes: the switching valve 71 configured to open and close a flow path between the replenishment part 50 and the liquid feeding part 60; and the discharge valve configured to open and close a flow path between the liquid feeding part 60 and the discharge part 30. The liquid feeding part 60 includes: the liquid feeding pipe 61 configured to connect the replenishment part 50 and the discharge part 30 via the filter 63; the pressure feeding part 64 configured to receive the processing liquid from the replenishment part 50 via the liquid feeding pipe 61 and feed the processing liquid to the discharge part 30 via the liquid feeding pipe 61; the second connection valve 68 configured to open and close a flow path between the liquid feeding pipe 61 and the pressure feeding part 64; and the pressure measurement part 69 configured to measure the pressure between the filter 63 and the pressure feeding part 64. The replenishment part 50 includes: the liquid source 51; and the pressure feeding part 53 configured to feed the processing liquid from the liquid source 51 to the liquid feeding part 60. The replenishment preparation part 115 sequentially executes: controlling the pressure feeding part 64 based on the measurement value of the pressure measurement part 69 while keeping the switching valve 71 and the discharge valve 72 closed and keeping the second connection valve 68 opened, so that the pressure in the liquid feeding pipe 61 approaches the set value; and controlling the pressure feeding part 53 based on the measurement value of the pressure measurement part 69 while keeping the switching valve 71 opened and keeping the discharge valve 72 and the second connection valve 68 closed, so that the pressure between the pressure feeding part 53 and the pressure feeding part 64 approaches the set value. In this case, the pressure in the replenishment part 50 and the pressure in the liquid feeding part 60 can approach the same set value based on the same measurement value of the pressure measurement part 69. Therefore, before the replenishment is started, the pressure difference between the inside of the replenishment part 50 and the inside of the liquid feeding part 60 is more reliably reduced. Accordingly, it is more useful for reducing particles in the processing liquid discharged onto the wafer W. Unlike the first embodiment, the pressure in the liquid feeding part 60 is adjusted first while keeping the switching valve 71 closed. Therefore, the adjustment range of the pressure in the replenishment part 50 is small. For this reason, even when the pressure on the liquid feeding part 60 side and the pressure on the replenishment part 50 side are adjusted to the set values before the start of replenishment of the processing liquid, it is possible to perform quicker pressure control than in the first embodiment.

Figure 22:
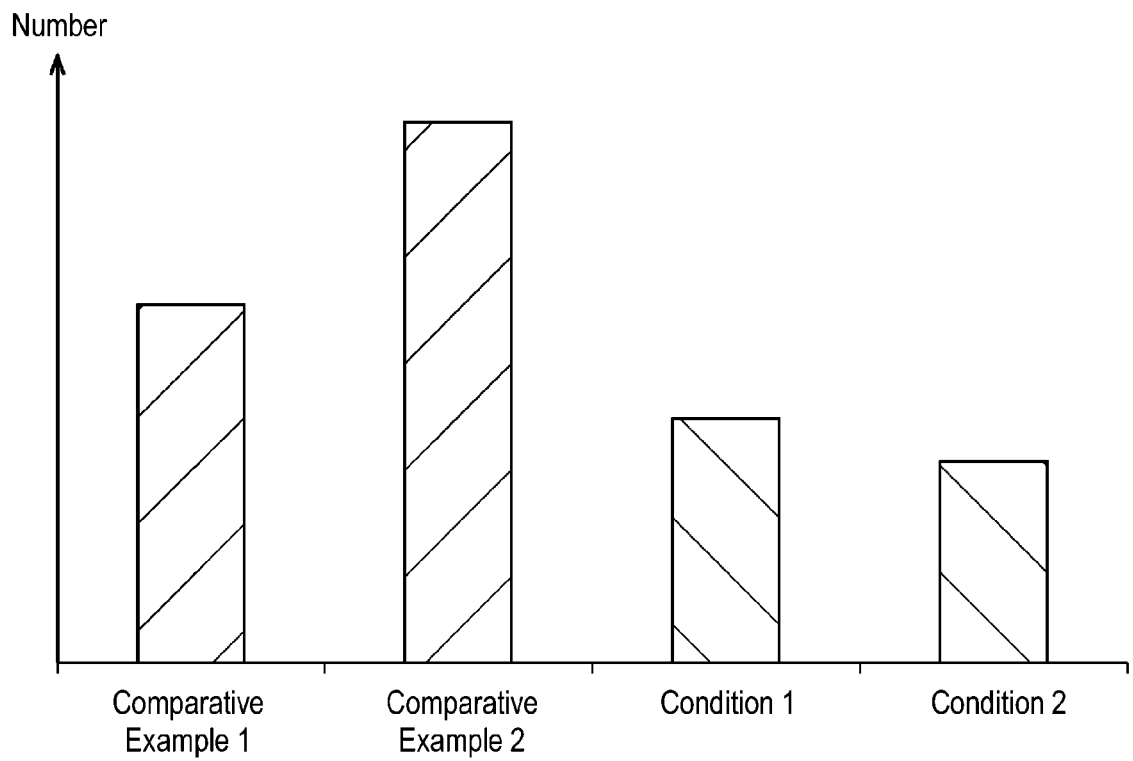
FIG. 22 is a graph showing the measurement results of the number of particles contained in a processing liquid.

FIG. 22 is a graph showing an example of a measurement result of the number of particles contained in the discharged processing liquid. In FIG. 22, the vertical axis represents the number of particles. FIG. 22 shows the measurement result in "Comparative Example 1," the measurement result in "Comparative Example 2," the measurement result in "Condition 1," and the measurement result in "Condition 2." In the measurements of Comparative Example 1 and Comparative Example 2, the switching valve 71 was opened without reducing the pressure difference between the inside of the replenishment part 50 and the inside of the liquid feeding part 60, and the replenishment of the processing liquid from the replenishment part 50 to the liquid feeding part 60 was started while keeping the switching valve 71 opened. In Comparative Example 1, the processing liquid was discharged through the filter 63 at the time of discharging the processing liquid. In Comparative Example 2, the processing liquid was discharged without passing through the filter 63 at the time of discharging the processing liquid.

Under Conditions 1 and 2, as in the above-described second embodiment, the switching valve 71 was opened after reducing the pressure difference between the inside of the replenishment part 50 and the inside of the liquid feeding part 60, and the replenishment of the processing liquid from the replenishment part 50 to the liquid feeding part 60 was started while keeping the switching valve 71 opened. Under Condition 1, the processing liquid was discharged through the filter 63 at the time of discharging the processing liquid. Under Condition 2, the processing liquid was discharged without passing through the filter 63 at the time of discharging the processing liquid. In each of Comparative Example 1, Comparative Example 2, Condition 1, and Condition 2, the pressure at the time of replenishment of the processing liquid was set to the set value Pr larger than the set value Pd of the discharge pressure.

Comparing the measurement results of Comparative Example 1 and Condition 1, it can be seen that the number of particles is reduced by opening the switching valve 71 after reducing the pressure difference. Comparison of the measurement results of Comparative Example 2 and Condition 2 reveals that the number of particles is reduced by opening the switching valve 71 after reducing the pressure difference. FIG. 23A shows a time-dependent variation of the measurement value (liquid pressure) of the pressure measurement part 69 under Condition 2. It can be noted that the hunting (pressure variation) of the processing liquid in the replenishment preparation is smaller than the time-dependent variation of the liquid pressure when the switching valve 71 is opened without reducing the pressure difference (e.g., the time-dependent variation shown in FIG. 14A). It is considered that this suppression of hunting is a factor of particle reduction. Under Condition 2, the measurement was performed in a state in which the target value of the replenishment pressure of the processing liquid under replenishment is maintained at the set value Pr.

(Modification)

Although the target value of the replenishment pressure of the processing liquid under replenishment may be maintained at the set value Pr as described above, the target value of the replenishment pressure may be gradually brought to approach the target value of the discharge pressure until the replenishment of the processing liquid is completed. FIG. 23B shows a time-dependent variation of the liquid pressure when the pressure at the start of replenishment is set to the set value Pr and the replenishment pressure approaches the set value Pd during replenishment. In the follow-up control of the target value of the replenishment pressure, the replenishment controller 116 may gradually bring the target value of the replenishment pressure from the set value Pr to approach the set value Pd (the target value of the discharge pressure) from the start of replenishment to the end of replenishment. As a result, in the replenishment process of step S06, the replenishment pressure is gradually reduced from the set value Pr to the set value Pd which is approximately equal to the discharge pressure at the time of discharge.

The coating and developing apparatus 2 according to the above modification includes the discharge controller 112 configured to control the pressure feeding part 64 so that the discharge pressure of the processing liquid fed to the nozzle 31 follows the target value. In controlling the replenishment pressure to follow the target value, the replenishment controller 116 gradually brings the target value of the replenishment pressure to approach the target value of the discharge pressure until the replenishment of the processing liquid is completed. In this case, while starting replenishment of the processing liquid in a state in which the replenishment pressure is set to a pressure suitable for replenishing the processing liquid, it is possible to bring the replenishment pressure to approach the target value of the discharge pressure during the replenishment. As a result, it becomes possible to more efficiently perform the liquid processing.

In addition, in the liquid processing procedure according to the second embodiment, the set value Pr of the replenishment pressure and the set value Pd of the discharge pressure may be set to a substantially equal value.

Third Embodiment

Next, a coating and developing apparatus 2 included in a substrate processing system according to a third embodiment will be described with reference to FIGS. 24 to 29. The liquid processing unit U1 of the coating and developing apparatus 2 according to the third embodiment includes a processing liquid supply part 29A instead of the processing liquid supply part 29. Similarly to the processing liquid supply part 29, the processing liquid supply part 29A supplies the processing liquid to the wafer W rotationally held by the rotary holding part 20. As shown in FIG. 24, the processing liquid supply part 29A includes a discharge part 30, a liquid feeding part 210, a first connection part 230 (connection part), a replenishment part 250, and a second connection part 90.

The liquid feeding part 210 feeds the processing liquid to the discharge part 30. Specifically, the liquid feeding part 210 feeds the processing liquid toward the discharge part 30 (nozzle 31) at a predetermined pressure. The liquid feeding part 210 is connected to the discharge part 30 via the second connection part 90 (discharge valve 72). The flow path between the liquid feeding part 210 and the discharge part 30 is opened or closed by a discharge valve 72. The liquid feeding part 210 includes, for example, a liquid feeding pipe 212 and a pressure feeding part 214 (a discharge pressure feeding part).

The liquid feeding pipe 212 guides the processing liquid to the discharge part 30. Specifically, the liquid feeding pipe 212 is connected to the end portion of the discharge part 30 on the upstream side of the liquid feeding pipe 32 via the discharge valve 72. The pressure feeding part 214 receives the processing liquid from the replenishment part 250, pressurizes the received processing liquid, and feeds the pressurized processing liquid toward the discharge part 30. The pressure feeding part 214 includes, for example, a pump 216, an output valve 218, a pump driving part 222, and a pressure measurement part 224.

The pump 216 includes a storage chamber that stores the processing liquid, and a contraction part that contracts the storage chamber. The pump 216 expands the storage chamber by the contraction part to receive the processing liquid, and contracts the storage chamber by the contraction part to feed the processing liquid. As the pump 216, for example, a tube diaphragm pump, a diaphragm pump, or a bellows pump may be used. The output valve 218 is provided in the liquid feeding pipe 212, and is configured to open and close the flow path in the liquid feeding pipe 212 based on the operation command of the control device 100. The output valve 218 is, for example, an air operation valve.

The pump driving part 222 drives the pump 216 based on the operation command of the control device 100. Specifically, the pump driving part 222 operates (drives) the contraction part so as to contract the storage chamber of the pump 216. For example, the pump driving part 222 is an air operation type driving part that operates the contraction part with a gas. The pump driving part 222 may contract the storage chamber of the pump 216 by adjusting the pressure (driving pressure) of the gas. The pressure measurement part 224 acquires information regarding the pressure in the pump 216. For example, the pressure measurement part 224 measures the pressure in the connection pipe between the pump 216 and the pump driving part 222. The pressure measurement part 224 outputs a measurement value to the control device 100.

The first connection part 230 connects the liquid feeding part 210 and the replenishment part 250. The liquid feeding part 210 receives the processing liquid via the first connection part 230. The first connection part 230 includes, for example, a connection pipe 232, a filter 234, a first switching valve 236 (switching valve), and a second switching valve 238.

The connection pipe 232 guides the processing liquid to the liquid feeding part 210 (the pump 216). Specifically, the downstream end of the connection pipe 232 is connected to the liquid feeding part 210, and the upstream end of the connection pipe 232 is connected to the replenishment part 250. In this way, the connection pipe 232 connects the liquid feeding part 210 (the pump 216) and the replenishment part 250, and forms a flow path for replenishing the processing liquid from the replenishment part 250 to the liquid feeding part 210. The filter 234 is provided in the connection pipe 232 to remove foreign matters contained in the processing liquid. Specifically, the filter 234 removes foreign matters contained in the processing liquid (the processing liquid replenished from the replenishment part 250 to the liquid feeding part 210) flowing through the flow path in the connection pipe 232.

The first switching valve 236 and the second switching valve 238 open and close a flow path between the liquid feeding part 210 and the replenishment part 250. The first switching valve 236 is provided in the connection pipe 232 downstream of the filter 234. The first switching valve 236 opens and closes a flow path between the filter 234 and the liquid feeding part 210 in the flow path of the connection pipe 232 based on the operation command of the control device 100. The second switching valve 238 is provided in the connection pipe 232 upstream of the filter 234. The second switching valve 238 opens and closes a flow path between the filter 234 and the replenishment part 250 in the flow path of the connection pipe 232 based on the operation command of the control device 100. The first switching valve 236 and the second switching valve 238 are, for example, air operation valves.

The replenishment part 250 replenishes the liquid feeding part 210 with the processing liquid to be fed to the discharge part 30. The replenishment part 250 includes, for example, a liquid source 252, a storage tank 254, a pressure feeding part 256 (replenishment pressure feeding part), and a liquid feeding pipe 262.

The liquid source 252 is a supply source of the processing liquid to be replenished to the liquid feeding part 210. The liquid source 252 supplies the processing liquid to the pressure feeding part 256 via the liquid feeding pipe 262. The storage tank 254 is provided in the liquid feeding pipe 262 to temporarily store the processing liquid to be supplied to the pressure feeding part 256.

The pressure feeding part 256 feeds the processing liquid from the storage tank 254 to the liquid feeding part 210 through the first connection part 230. The pressure feeding part 256 receives the processing liquid from the storage tank 254, pressurizes the received processing liquid, and feeds the pressurized processing liquid to the first connection part 230. The pressure feeding part 256 includes, for example, a pump 266, a pump driving part 272, and a pressure measurement part 274.

The pump 266 includes a storage chamber that stores the processing liquid, and a contraction part that contracts the storage chamber. The pump 266 expands the storage chamber by the contraction part to receive the processing liquid, and contracts the storage chamber by the contraction part to feed the processing liquid. As the pump 266, for example, a tube diaphragm pump, a diaphragm pump, or a bellows pump may be used.

The pump driving part 272 drives the pump 266 based on the operation command of the control device 100. Specifically, the pump driving part 272 operates (drives) the contraction part so as to contract the storage chamber of the pump 266. For example, the pump driving part 272 is an air operation type driving part that operates the contraction part with a gas. The pump driving part 272 may contract the storage chamber of the pump 266 by adjusting the pressure (driving pressure) of the gas. The pressure measurement part 274 acquires information regarding the pressure in the pump 266. For example, the pressure measurement part 274 measures the pressure in the connection pipe between the pump 266 and the pump driving part 272. The pressure measurement part 274 outputs the measurement value to the control device 100.

The processing liquid supply part 29A described above is also controlled by the control device 100, like the processing liquid supply part 29 according to the first embodiment and the second embodiment. The control device 100 is configured to execute: opening the first switching valve 236 after reducing the pressure difference between the inside of the replenishment part 250 and the inside of the liquid feeding part 210; and starting the replenishment of the processing liquid from the replenishment part 250 to the liquid feeding part 210 while keeping the first switching valve 236 opened.

The discharge preparation part 111 of the control device 100 adjusts the pressure of the processing liquid in the liquid feeding part 210 before starting the discharge of the processing liquid from the nozzle 31. The discharge preparation part 111 changes the pressure in the liquid feeding part 210 so as to reduce the pressure difference between the inside of the liquid feeding part 210 and the inside of the discharge part 30 while keeping the output valve 218 opened and keeping the discharge valve 72 closed. The discharge preparation part 111 opens the discharge valve 72 in a state in which the pressure difference between the inside of the liquid feeding part 210 and the inside of the discharge part 30 is reduced.

The replenishment preparation part 115 of the control device 100 performs preparation for replenishing the processing liquid from the replenishment part 250 to the liquid feeding part 210. Specifically, the replenishment preparation part 115 may change the pressure in the replenishment part 250 and the pressure in the liquid feeding part 210 so as to reduce the pressure difference between the inside of the replenishment part 250 and the inside of the liquid feeding part 210 while keeping the first switching valve 236 and the second switching valve 238 closed. Thereafter, the replenishment preparation unit 115 opens the second switching valve 238 while keeping the first switching valve 236 closed and then changes the pressure between the replenishment part 250 (the pump 266) and the second switching valve 238 and the pressure in the liquid feeding part 210 so as to reduce the pressure difference between the inside of the first connection part 230 and the inside of the liquid feeding part 210. By these processes, the above-described pressure difference after the replenishment preparation becomes smaller than the pressure difference between the inside of the replenishment part 250 and the inside of the liquid feeding part 210 before the start of the replenishment preparation. The replenishment preparation part 115 opens the first switching valve 236 in a state in which the pressure difference between the inside of the replenishment part 250 and the inside of the liquid feeding part 210 is reduced.

The replenishment preparation part 115 may at least reduce the pressure difference after the replenishment preparation as compared with the pressure difference between the inside of the replenishment part 250 and the inside of the liquid feeding part 210 before the start of the replenishment preparation. As an example, the replenishment preparation part 115 controls the pressure feeding part 256 so that the pressure in the replenishment part 250 (the pressure in the first connection part 230) substantially matches a first set value Pr1, and controls the pressure feeding part 214 so that the pressure in the liquid feeding part 210 substantially matches a second set value Pr2. The first set value Pr1 and the second set value Pr2 may be substantially the same, or the first set value Pr1 may be larger or smaller than the second set value Pr2. Exemplified below is a case where the first set value Pr1 is set to a value larger than the second set value Pr2. In one example, the first set value Pr1 is set to a value which is larger than the second set value Pr2 by about 1 kPa to 15 kPa.

As an example of the replenishment preparation, first, while keeping the first switching valve 236 and the second switching valve 238 closed, the replenishment preparation part 115 controls the pressure feeding part 256 so that the pressure in the replenishment part 250 approaches the first set value Pr1, and controls the pressure feeding part 214 so that the pressure in the liquid feeding part 210 approaches the second set value Pr2. The replenishment preparation part 115 opens the second switching valve 238. Thereafter, while keeping the first switching valve 236 in the closed state, the replenishment preparation part 115 controls the pressure feeding part 256 so that the pressure in the first connection part 230 (the pressure from the replenishment part 250 to the first switching valve 236) approaches the first set value Pr1, and controls the pressure feeding part 214 so that the pressure in the liquid feeding part 210 approaches the second set value Pr2. The replenishment preparation part 115 may keep the output valve 218 of the liquid feeding part 210 in the closed state during the replenishment preparation execution period.

Figure 25:
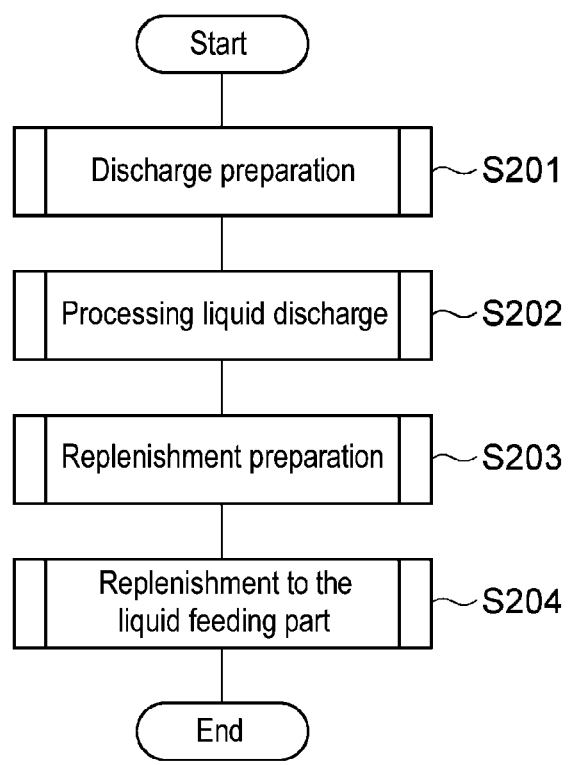
FIG. 25 is a flowchart showing an example of a liquid processing procedure.

FIG. 25 is a flowchart showing an example of the liquid processing procedure according to the third embodiment. As shown in FIG. 25, the control device 100 first executes steps S201 and S202 in order. In step S201, for example, in preparation for the discharge of the processing liquid from the nozzle 31, the discharge preparation part 111 controls the processing liquid supply part 29A so as to reduce the pressure difference between the inside of the liquid feeding part 210 and the inside of the discharge part 30. In step S202, for example, the discharge controller 112 controls the processing liquid supply part 29A so as to discharge the processing liquid from the nozzle 31 toward the wafer W in a state in which the pressure difference between the inside of the liquid feeding part 210 and the inside of the discharge part 30 is reduced. Details of the discharge preparation performed in step S201 and the discharge process performed in step S202 will be described later.

Next, the control device 100 sequentially executes steps S203 and S204. In step S203, for example, in preparation for replenishment of the processing liquid from the replenishment part 250 to the liquid feeding part 210, the replenishment preparation part 115 controls the processing liquid supply part 29A so as to reduce the pressure difference between the inside of the replenishment part 250 and the inside of the liquid feeding part 210. In step S204, for example, the replenishment controller 116 controls the processing liquid supply part 29A so as to replenish the processing liquid from the replenishment part 250 to the liquid feeding part 210 in a state in which the pressure difference between the inside of the replenishment part 250 and the inside of the liquid feeding part 210 is reduced. Details of the replenishment preparation performed in step S203 and the replenishment process performed in step S204 will be described later. Thus, a series of liquid processing procedures is completed.

Figure 26A:
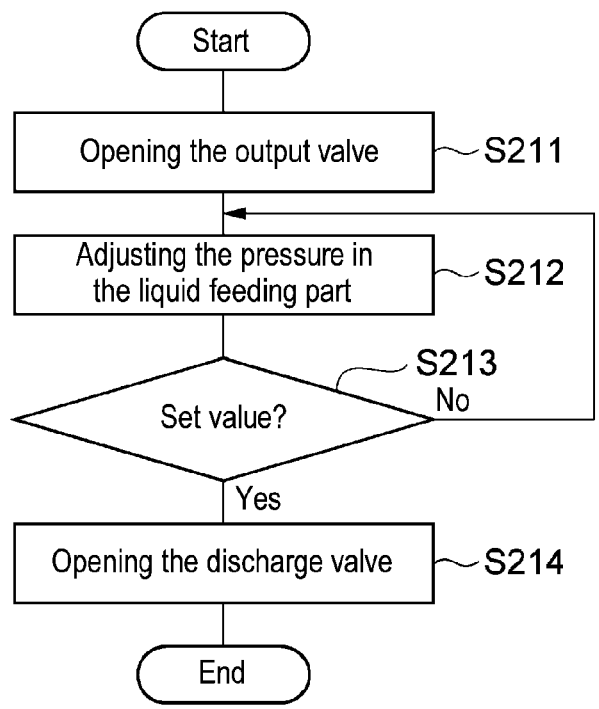
FIG. 26A is a flowchart showing an example of a discharge preparation procedure.
Figure 26B:
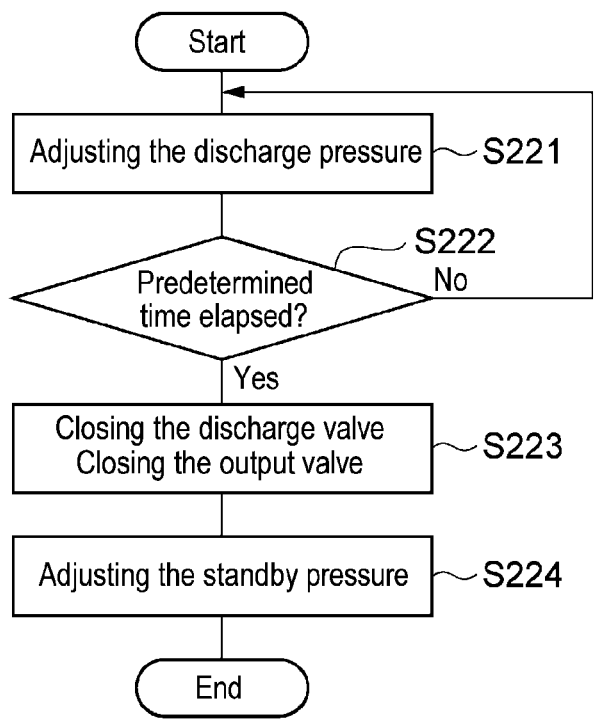
FIG. 26B is a flowchart showing an example of a discharge control procedure.

FIG. 26A is a flowchart showing an example of the discharge preparation procedure of step S201. As shown in FIG. 26A, the control device 100 first executes step S211. In step S211, for example, the discharge preparation part 111 switches the output valve 218 from the closed state to the opened state in a state in which the first switching valve 236, the second switching valve 238, and the discharge valve 72 are closed.

Next, the control device 100 executes steps S212 and S213. In step S212, for example, the discharge preparation part 111 adjusts the pressure in the liquid feeding part 210. The discharge preparation part 111 adjusts the pressure in the liquid feeding part 210 (the pressure in the liquid feeding pipe 212) based on, for example, the measurement value measured by the pressure measurement part 224. The discharge preparation part 111 may control the pump driving part 222 so that the measurement value measured by the pressure measurement part 224 follows (approaches) the set value Pd of the discharge pressure. For example, the discharge preparation part 111 may adjust the driving pressure from the pump driving part 222 to the pump 216 according to a deviation between the measurement value of the pressure measurement part 224 and the set value Pd so that the deviation approaches zero. The discharge preparation part 111 repeats the process of steps S212 and S213 until the pressure in the liquid feeding part 210 reaches the set value Pd. By performing steps S212 and S213, the discharge preparation part 111 reduces the pressure difference between the inside of the liquid feeding part 210 and the inside of the discharge part 30 in which the discharge valve 72 is closed.

Next, the control device 100 executes step S214. In step S214, for example, the discharge preparation part 111 switches the discharge valve 72 from the closed state to the opened state while keeping the first switching valve 236 and the second switching valve 238 in the closed state and keeping the output valve 218 in the opened state. Thus, the discharge preparation part 111 terminates the discharge preparation.

FIG. 25B is a flowchart showing an example of the discharge control procedure of step S202. For example, in a state in which the pressure difference between the inside of the liquid feeding part 210 and the inside of the discharge part 30 is reduced and the discharge valve 72 is opened by the discharge preparation part 111, the control device 100 executes steps S221 and S222 as shown in FIG. 25B. In step S221, the discharge controller 112 adjusts the discharge pressure of the processing liquid fed to the nozzle 31. In step S221, the discharge controller 112 starts control of the pressure feeding part 214 (the pump driving part 222) so as to feed the processing liquid to the discharge part 30 at the set value Pd of the discharge pressure. As a result, the discharge controller 112 starts the discharge of the processing liquid from the nozzle 31 with the discharge valve 72 opened. The discharge controller 112 continues to adjust the discharge pressure even after the discharge is started.

The discharge controller 112 adjusts the pump driving part 222 (the pressure applied from the pump 216 to the processing liquid) based on, for example, the measurement value of the pressure measurement part 224. The discharge controller 112 may adjust the pump driving part 222 so that the discharge pressure of the processing liquid follows the set value Pd. The discharge controller 112 may adjust the driving pressure from the pump driving part 222 to the pump 216 according to a deviation between the measurement value measured by the pressure measurement part 224 and the set value Pd so that the deviation approaches zero. The discharge controller 112 repeats the process of steps S221 and S222 until a predetermined time has elapsed from the start of execution of step S221. The predetermined time is defined in the operation command held by the operation command holding part 102, and is set in advance, for example, according to the amount of the processing liquid used in the liquid processing per one time.

Next, the control device 100 sequentially executes steps S223 and S224. In step S223, for example, the discharge controller 112 switches the output valve 218 and the discharge valve 72 from the opened state to the closed state while keeping the first switching valve 236 and the second switching valve 238 in the closed state. In step S234, for example, the discharge controller 112 controls the pump driving part 222 based on the measurement value of the pressure measurement part 224, so as to adjust the pressure in the liquid feeding part 210 (the pressure in the pump 216) to a standby pressure Ps2. While the discharge preparation and the discharge process of steps S201 and S202 are under execution, the control device 100 may cause the pressure feeding part 256 to maintain the pressure in the replenishment part 250 (the pressure in the pump 266) at the standby pressure Ps1. The standby pressure Ps1 may be higher than the standby pressure Ps2. The standby pressure Ps1 in the replenishment part 250 may be set in advance to a value larger than the first set value Pr1. The standby pressure Ps2 in the liquid feeding part 210 may be set in advance to a value larger than the second set value Pr2.

Figure 27:
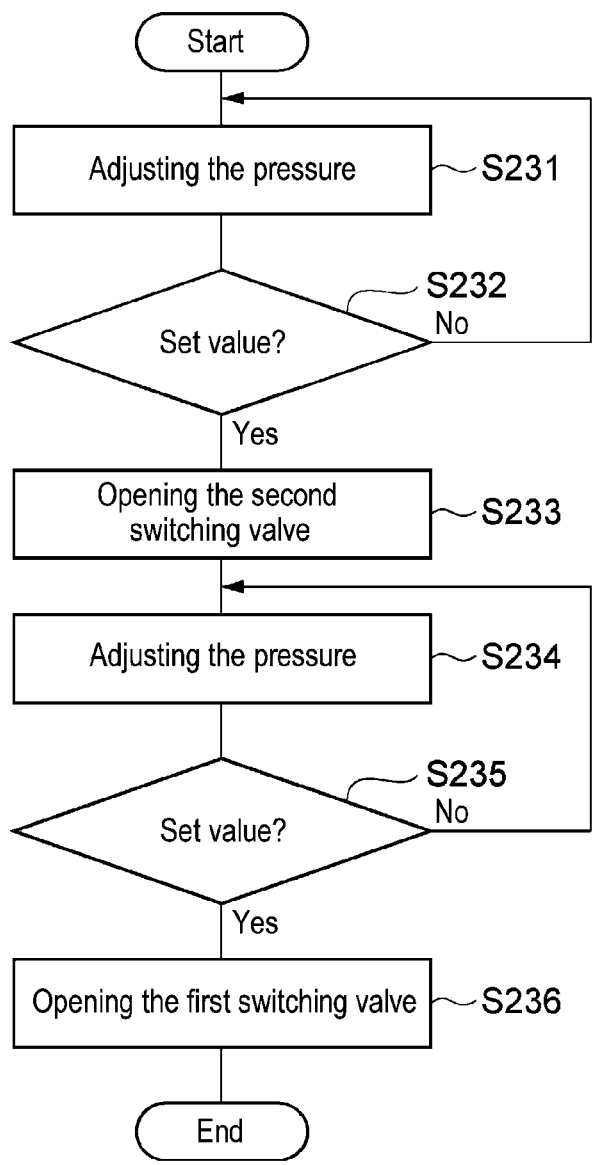
FIG. 27 is a flowchart showing an example of a replenishment preparation procedure.
Figure 28A:
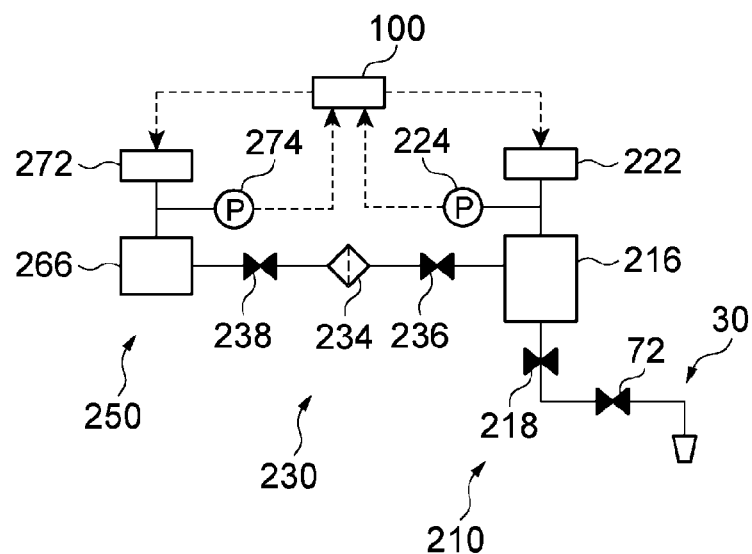
FIGS. 28A and 28B are schematic diagrams for explaining an example of a replenishment preparation procedure.

FIG. 27 is a flowchart showing an example of the replenishment preparation procedure of step S203. As shown in FIG. 27, the control device 100 first executes steps S231 and S232. In step S231, for example, the replenishment preparation part 115 adjusts the pressure in the replenishment part 250 and the pressure in the liquid feeding part 210 so as to reduce the pressure difference between the inside of the replenishment part 250 and the inside of the liquid feeding part 210 in a state in which the first switching valve 236 and the second switching valve 238 are closed. For example, as shown in FIG. 28A, the replenishment controller 116 controls the pump driving part 272 based on the measurement value of the pressure measurement part 274 in order to adjust the pressure in the replenishment part 250. Furthermore, the replenishment controller 116 controls the pump driving part 222 based on the measurement value of the pressure measurement part 224 in order to adjust the pressure in the liquid feeding part 210.

In one example, the replenishment preparation part 115 controls the pump driving part 272 so that the pressure in the replenishment part 250 approaches from the standby pressure Ps1 to the first set value Pr1, and controls the pump driving part 222 so that the pressure in the liquid feeding part 210 approaches from the standby pressure Ps2 to the second set value Pr2. The replenishment preparation part 115 repeats the process of steps S231 and S232 until the pressure in the replenishment part 250 reaches the first set value Pr1 and the pressure in the liquid feeding part 210 reaches the second set value Pr2. By performing steps S231 and S232, the replenishment preparation part 115 reduces the pressure difference between the inside of the replenishment part 250 and the inside of the liquid feeding part 210 while keeping the first switching valve 236 and the second switching valve 238 closed.

Next, the control device 100 executes step S233. In step S233, for example, the replenishment preparation part 115 switches the second switching valve 238 from the closed state to the opened state while keeping the first switching valve 236, the output valve 218, and the discharge valve 72 in the closed state.

Figure 28B:
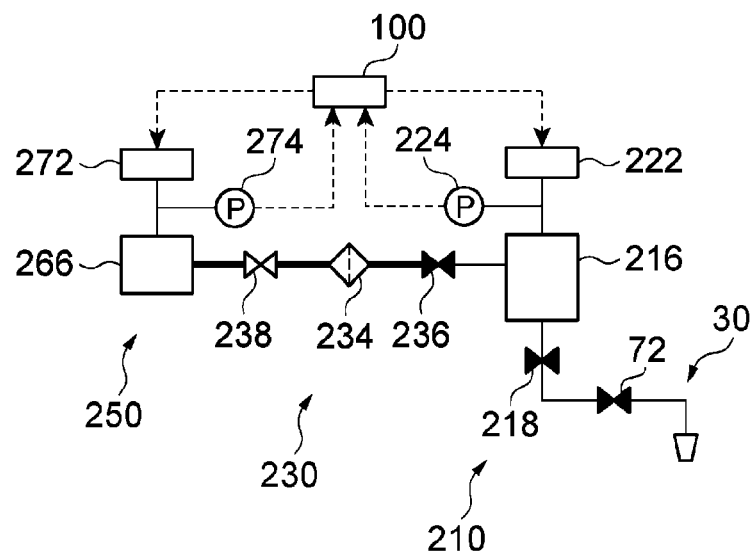

Next, the control device 100 sequentially executes steps S234 and S235. In step S234, for example, while keeping the second switching valve 238 opened and keeping the first switching valve 236 closed, the replenishment preparation part 115 adjusts the pressure in the first connection part 230 (the pressure of the pump 266) and the pressure in the liquid feeding part 210 so as to reduce the pressure difference between the inside of the first connection part 230 (between the pump 266 and the first switching valve 236) and the inside of the liquid feeding part 210. For example, as shown in FIG. 28B, the replenishment controller 116 controls the pump driving part 272 based on the measurement value of the pressure measurement part 274 in order to adjust the pressure in the first connection part 230. Further, the replenishment controller 116 controls the pump driving part 222 so as to maintain the pressure in the liquid feeding part 210 at the value adjusted by executing steps S231 and S232.

In one example, the replenishment preparation part 115 controls the pump driving part 272 so that the pressure between the pump 266 of the replenishment part 250 and the first switching valve 236 approaches the first set value Pr1. The replenishment preparation part 115 repeats the process of steps S234 and S235 until the pressure between the replenishment part 250 and the first switching valve 236 reaches the first set value Pr1. By performing steps S234 and S235, the replenishment preparation part 115 reduces the pressure difference between the inside of the first connection part 230 and the inside of the liquid feeding part 210 while keeping the second switching valve 238 opened and keeping the first switching valve 236 closed.

Next, the control device 100 executes step S236. In step S236, for example, the replenishment preparation part 115 switches the first switching valve 236 from the closed state to the opened state while keeping the second switching valve 238 opened and keeping the output valve 218 and the discharge valve 72 closed. As a result, a flow of the processing liquid from the pump 266 of the liquid feeding part 210 toward the pump 216 of the liquid feeding part 210 through the filter 234 is generated. Thus, the replenishment preparation part 115 terminates the replenishment preparation process.

Figure 29:
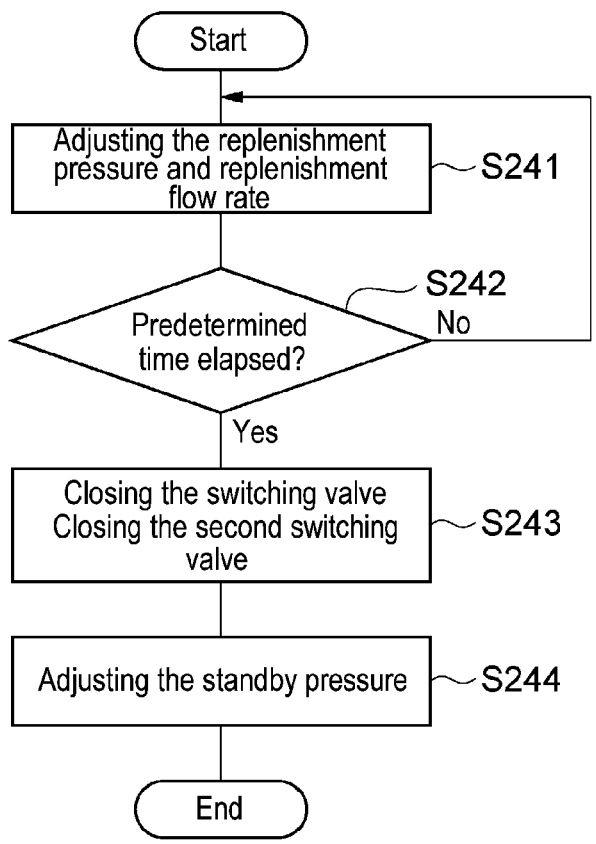
FIG. 29 is a flowchart showing an example of a replenishment control procedure.

FIG. 29 is a flowchart showing an example of the replenishment control procedure of step S204. As shown in FIG. 29, the control device 100 first executes steps S241 and S242. In step S241, for example, the replenishment controller 116 adjusts the replenishment pressure and replenishment flow rate of the processing liquid fed from the pressure feeding part 256 (the pump 266) of the replenishment part 250 to the pressure feeding part 214 (the pump 216) of the liquid feeding part 210. In one example, similarly to the adjustment of the replenishment pressure and replenishment flow rate in the first embodiment, the replenishment controller 116 controls one of the pressure feeding part 256 and the pressure feeding part 214 so that the replenishment pressure follows the target value, and controls the other of the pressure feeding part 256 and the pressure feeding part 214 so that the replenishment flow rate follows the target value.

The replenishment controller 116 repeats the process of steps S241 and S242 until a predetermined time has elapsed from the start of execution of step S241. The predetermined time is set in advance so that the replenishment of the processing liquid to the liquid feeding part 210 (the pump 216) is completed within the predetermined time, and is stored in the operation command holding part 102.

Next, the control device 100 executes step S243. In step S243, the replenishment controller 116 switches the first switching valve 236 and the second switching valve 238 from the opened state to the closed state while keeping the output valve 218 and the discharge valve 72 in the closed state. As a result, the flow of the processing liquid from the pump 266 of the replenishment part 250 toward the pump 216 of the liquid feeding part 210 is stopped.

Next, the control device 100 executes step S244. In step S244, for example, the control device 100 adjusts the pressure in the pump 266 of the replenishment part 250 and the pressure in the pump 216 of the liquid feeding part 210. In one example, the control device 100 controls the pump driving part 272 based on the measurement value measured by the pressure measurement part 274, thereby adjusting the pressure in the pump 266 (the pressure in the replenishment part 250) to the standby pressure Ps1. The control device 100 adjusts the pressure in the pump 216 (the pressure in the liquid feeding part 210) to the standby pressure Ps2 by controlling the pump driving part 222 based on the measurement value measured by the pressure measurement unit 224. Thus, the replenishment controller 116 terminates the replenishment process.

[Effects of Third Embodiment]

Also in the coating and developing apparatus 2 and the liquid processing procedure according to the third embodiment described above, as in the first and second embodiments, the first switching valve 236 is opened after the pressure difference between the inside of the replenishment part 250 and the inside of the liquid feeding part 210 is reduced. Therefore, when the first switching valve 236 is opened, the occurrence of hunting of the processing liquid in the flow path for replenishing the processing liquid from the replenishment part 250 to the liquid feeding part 210 is suppressed. Accordingly, the coating and developing apparatus 2 and the liquid processing procedure according to the third embodiment are useful for reducing particles in the processing liquid discharged onto the wafer W.

In the above-described third embodiment, the filter 234 is provided inside the first connection part 230. The first switching valve 236 opens and closes a flow path between the filter 234 and the liquid feeding part 210. When the first switching valve 236 is opened, a flow of the processing liquid to the liquid feeding part 210 through the filter 234 is generated. If the first switching valve 236 is opened in a state in which the pressure difference between the inside of the replenishment part 250 and the inside of the liquid feeding part 210 is large, the hunting of the processing liquid may occur in the first connection part 230 connecting the replenishment part 250 and the liquid feeding part 210 to such an extent that particles are generated from the filter 234. In contrast, in the above configuration, the first switching valve 236 is opened after the pressure difference between the inside of the replenishment part 250 and the inside of the liquid feeding part 210 is reduced. Therefore, the above configuration is useful for suppressing the generation of particles due to the hunting of the processing liquid in the first connection part 230.

In the above-described third embodiment, the first connection part 230 includes the second switching valve 238 that opens and closes a flow path between the replenishment part 250 and the filter 234. The replenishment preparation part 115 sequentially executes: reducing the pressure difference between the inside of the replenishment part 250 and the inside of the liquid feeding part 210 while keeping the first switching valve 236 and the second switching valve 238 closed; and reducing the pressure difference between the inside of the first connection part 230 and the inside of the liquid feeding part 210 while keeping the second switching valve 238 opened and keeping the first switching valve 236 closed. In this case, as compared with a case where the first switching valve 236 and the second switching valve 238 are switched to the opened state at substantially the same timing, the difference between the pressure upstream of the first switching valve 236 and the pressure downstream of the first switching valve 236 can be reduced with higher accuracy. Accordingly, the coating and developing apparatus 2 and the liquid processing procedure according to the third embodiment are more useful for suppressing generation of particles due to the hunting of the processing liquid in the first connection part 230. The pipe volume in the replenishment part 250 tends to be larger than the pipe volume of the processing liquid in the liquid feeding part 210. In the above configuration, the pressure difference between the inside of the replenishment part 250 and the inside of the liquid feeding part 210 can be easily adjusted by opening the switching valves step by step from the one located on the upstream side on which the pipe volume is large.

(Modification)

In the replenishment preparation procedure of step S203, the pressure in the liquid feeding part 210 and the pressure in the replenishment part 250 are changed in the above-described example. However, the replenishment preparation part 115 may reduce the pressure difference between the inside of the liquid feeding part 210 and the inside of the replenishment part 250 by changing one of the pressure in the liquid feeding part 210 and the pressure in the replenishment part 250. For example, the replenishment preparation part 115 may change the pressure in the replenishment part 250 so as to reduce the pressure difference between the inside of the replenishment part 250 and the inside of the liquid feeding part 210 without changing the pressure in the liquid feeding part 210 while keeping the first switching valve 236 and the second switching valve 238 closed. Further, the replenishment preparation part 115 may change the pressure in the first connection part 230 so as to reduce the pressure difference between the inside of the first connection part 230 and the inside of the liquid feeding part 210 without changing the pressure in the liquid feeding part 210 while keeping the second switching valve 238 opened and keeping the first switching valve 236 closed.

The replenishment preparation part 115 may change the pressure in the liquid feeding part 210 so as to reduce the pressure difference between the inside of the replenishment part 250 and the inside of the liquid feeding part 210 without changing the pressure in the replenishment part 250 while keeping the first switching valve 236 and the second switching valve 238 closed. Further, the replenishment preparation part 115 may change the pressure in the liquid feeding part 210 so as to reduce the pressure difference between the inside of the first connection part 230 and the inside of the liquid feeding part 210 without changing the pressure in the replenishment part 250 while keeping the second switching valve 238 opened and keeping the first switching valve 236 closed.

In the above example, the opened/closed state is switched in the order of the second switching valve 238 and the first switching valve 236. However, the replenishment preparation part 115 may switch the second switching valve 238 to the opened state after switching the first switching valve 236 to the opened state. Specifically, the replenishment preparation part 115 may reduce the pressure difference between the inside of the replenishment part 250 and the inside of the liquid feeding part 210 while keeping the first switching valve 236 and the second switching valve 238 closed, and then may switch the first switching valve 236 to the opened state. Then, the replenishment preparation part 115 may reduce the pressure difference between the inside of the liquid feeding part 210 (more specifically, the inside of the liquid feeding part 210 and the inside of the region of the first connection part 230 downstream of the second switching valve 238) and the inside of the replenishment part 250 while keeping the first switching valve 236 opened and keeping the second switching valve 238 (switching valve) closed. Thereafter, the replenishment preparation part 115 may switch the second switching valve 238 to the opened state in order to open the flow path between the replenishment part 250 and the liquid feeding part 210.

The first connection part 230 may not include the second switching valve 238. In this case, the replenishment preparation part 115 may reduce the pressure difference between the inside of the replenishment part 250 (more specifically, the inside of the replenishment part 250 and the inside of the region of the first connection part 230 upstream of the first switching valve 236) and the inside of the liquid feeding part 210 while keeping the first switching valve 236 closed. The first connection part 230 may not include the first switching valve 236. In this case, the replenishment preparation part 115 may reduce the pressure difference between the inside of the liquid feeding part 210 (more specifically, the inside of the liquid feeding part 210 and the inside of the region of the first connection part 230 downstream of the second switching valve 238) and the inside of the replenishment part 250 while keeping the second switching valve 238 (switching valve) closed.

According to some embodiments of the present disclosure, it is possible to provide a substrate processing apparatus, a control method, and a computer-readable storage medium, which are useful for reducing particles in a processing liquid discharged onto a substrate.

The above specific example includes the following configurations.

(Supplemental Note 1)

A substrate processing apparatus, comprising:

a discharge part including a nozzle configured to discharge a processing liquid onto a substrate;

a liquid feeder configured to feed the processing liquid to the discharge part;

a replenishment part configured to replenish the liquid feeder with the processing liquid to be fed to the discharge part;

a connector including a switching valve configured to open and close a flow path between the replenishment part and the liquid feeder;

a filter configured to remove foreign matters contained in the processing liquid replenished from the replenishment part to the liquid feeder;

a replenishment preparation part configured to open the switching valve after reducing a pressure difference between the inside of the replenishment part and the inside of the liquid feeder; and a replenishment controller configured to start replenishment of the processing liquid from the replenishment part to the liquid feeder in a state in which the switching valve is opened by the replenishment preparation part.

wherein the filter is provided in the liquid feeder, and the replenishment preparation part is configured to change the pressure in the liquid feeder so as to reduce the pressure difference between the inside of the replenishment part and the inside of the liquid feeder while keeping the switching valve closed.

(Supplemental Note 2)

The apparatus of Supplemental Note 1, wherein the liquid feeder further includes a liquid feeding pipe configured to connect the replenishment part and the discharge part via the filter, a discharge pressure feeder configured to receive the processing liquid from the replenishment part via the liquid feeding pipe and feed the processing liquid to the discharge part via the liquid feeding pipe, and a connection valve configured to open and close a flow path between the liquid feeding pipe and the discharge pressure feeder, the replenishment part includes a liquid source and a replenishment pressure feeder configured to feed the processing liquid from the liquid source to the liquid feeder, and the replenishment controller is configured to control one of the replenishment pressure feeder and the discharge pressure feeder so that a replenishment pressure from the replenishment pressure feeder to the discharge pressure feeder follows a target value, and is configured to control the other of the replenishment pressure feeder and the discharge pressure feeder so that a replenishment flow rate from the replenishment pressure feeder to the discharge pressure feeder follows the target value.

(Supplemental Note 3)

The apparatus of Supplemental Note 2, further comprising:

a discharge controller configured to control the discharge pressure feeder so that a discharge pressure of the processing liquid fed to the nozzle follows the target value, wherein in controlling the replenishment pressure to follow the target value, the replenishment controller sets the target value of the replenishment pressure to the target value of the discharge pressure until the replenishment of the processing liquid is completed.

(Supplemental Note 4)

The apparatus of Supplemental Note 2, further comprising:

a discharge controller configured to control the discharge pressure feeder so that a discharge pressure of the processing liquid fed to the nozzle follows the target value, wherein in controlling the replenishment pressure to follow the target value, the replenishment controller gradually brings the target value of the replenishment pressure to approach the target value of the discharge pressure until the replenishment of the processing liquid is completed.

(Supplemental Note 5)

The apparatus of Supplemental Note 1 or 2, further comprising:

a discharge valve configured to open and close a flow path between the liquid feeder and the discharge part;

a discharge preparation part configured to open the discharge valve after changing the pressure in the liquid feeder so as to reduce the pressure difference between the inside of the liquid feeder and the inside of the discharge part; and a discharge controller configured to start discharge of the processing liquid from the nozzle to the substrate in a state in which the discharge valve is opened by the discharge preparation part.

(Supplemental Note 6)

The apparatus of Supplemental Note 1, wherein the liquid feeder further includes a liquid feeding pipe configured to connect the replenishment part and the discharge part via the filter, a discharge pressure feeder configured to receive the processing liquid from the replenishment part via the liquid feeding pipe and feed the processing liquid to the discharge part via the liquid feeding pipe, and a connection valve configured to open and close a flow path between the liquid feeding pipe and the discharge pressure feeder, and the switching valve is opened and closed at a smaller opening degree change rate than the connection valve.

(Supplemental Note 7)

The apparatus of Supplemental Note 1, further comprising:

a discharge valve configured to open and close a flow path between the liquid feeder and the discharge part, wherein the liquid feeder further includes a liquid feeding pipe configured to connect the replenishment part and the discharge part via the filter, a discharge pressure feeder configured to receive the processing liquid from the replenishment part via the liquid feeding pipe and feed the processing liquid to the discharge part via the liquid feeding pipe, a connection valve configured to open and close a flow path between the liquid feeding pipe and the discharge pressure feeder, and a pressure measurement part configured to measure a pressure between the filter and the discharge pressure feeder, the replenishment part includes a liquid source and a replenishment pressure feeder configured to feed the processing liquid from the liquid source to the liquid feeder, and the replenishment preparation part is configured to sequentially executes: controlling the replenishment pressure feeder so as to reduce the pressure difference between the inside of the replenishment part and the inside of the liquid feeder while keeping the switching valve closed; controlling the replenishment pressure feeder based on a measurement value of the pressure measurement part while keeping the switching valve opened and keeping the discharge valve and the connection valve closed, so that the pressure between the replenishment pressure feeder and the discharge pressure feeder approaches a set value; and controlling the discharge pressure feeder based on the measurement value of the pressure measurement part while keeping the switching valve and the discharge valve closed and keeping the connection valve opened, so that the pressure in the liquid feeder approaches the set value.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:

a discharge part including a nozzle configured to discharge a processing liquid onto a substrate;

a liquid feeder configured to feed the processing liquid to the discharge part;

a replenishment part configured to replenish the liquid feeder with the processing liquid to be fed to the discharge part and including a liquid source and a replenishment pressure feeder configured to feed the processing liquid from the liquid source to the liquid feeder;

a connector including a switching valve configured to open and close a flow path between the replenishment part and the liquid feeder;

a filter configured to remove foreign matters contained in the processing liquid replenished from the replenishment part to the liquid feeder;

a replenishment preparation part configured to open the switching valve after reducing a pressure difference between the inside of the replenishment part and the inside of the liquid feeder;

a replenishment controller configured to start replenishment of the processing liquid from the replenishment part to the liquid feeder in a state in which the switching valve is opened by the replenishment preparation part; and a discharge valve configured to open and close a flow path between the liquid feeder and the discharge part, wherein the liquid feeder further includes a liquid feeding pipe configured to connect the replenishment part and the discharge part via the filter, a discharge pressure feeder configured to receive the processing liquid from the replenishment part via the liquid feeding pipe and feed the processing liquid to the discharge part via the liquid feeding pipe, a first branch pipe branching from the liquid feeding pipe on an upstream side of the filter and connecting the liquid feeding pipe and the discharge pressure feeder, a second branch pipe branching from the liquid feeding pipe on a downstream side of the filter and connecting the liquid feeding pipe and the discharge pressure feeder, a first connection valve provided in the first branch pipe and configured to open and close a flow path between the liquid feeding pipe and the discharge pressure feeder, a second connection valve provided in the second branch pipe and configured to open and close a flow path between the liquid feeding pipe and the discharge pressure feeder, and a pressure measurement part configured to measure a pressure between the filter and the discharge pressure feeder, wherein the switching valve is configured to be opened and closed at an opening degree change rate smaller than an opening degree rate of the first connection valve and an opening degree rate of the second connection valve, and wherein in a state in which the discharge valve is closed, the replenishment preparation part is further configured to control the replenishment pressure feeder so that a pressure between the replenishment pressure feeder and the discharge pressure feeder approaches a set value, based on the pressure measured by the pressure measurement part.

2. The substrate processing apparatus of claim 1, wherein the filter is provided in the liquid feeder.

3. The substrate processing apparatus of claim 2, wherein the replenishment preparation part is configured to change a pressure in the liquid feeder so as to reduce the pressure difference between the inside of the replenishment part and the inside of the liquid feeder while keeping the switching valve closed.

4. The substrate processing apparatus of claim 3, wherein the replenishment controller is configured to control one of the replenishment pressure feeder and the discharge pressure feeder so that a replenishment pressure from the replenishment pressure feeder to the discharge pressure feeder follows a target value, and is configured to control the other of the replenishment pressure feeder and the discharge pressure feeder so that a replenishment flow rate from the replenishment pressure feeder to the discharge pressure feeder follows the target value.

5. The substrate processing apparatus of claim 4, further comprising:
a discharge controller configured to control the discharge pressure feeder so that a discharge pressure of the processing liquid fed to the nozzle follows the target value,
wherein in controlling the replenishment pressure to follow the target value, the replenishment controller gradually brings the target value of the replenishment pressure to approach the target value of the discharge pressure until the replenishment of the processing liquid is completed.

6. The substrate processing apparatus of claim 3,
wherein the replenishment preparation part is configured to sequentially executes: controlling the discharge pressure feeder based on a measurement value of the pressure measurement part while keeping the switching valve and the discharge valve closed and keeping the second connection valve opened, so that the pressure in the liquid feeder approaches the set value; and controlling the replenishment pressure feeder based on the measurement value of the pressure measurement part while keeping the switching valve opened and keeping the discharge valve and the second connection valve closed, so that the pressure between the replenishment pressure feeder and the discharge pressure feeder approaches the set value.

7. The substrate processing apparatus of claim 2, wherein the replenishment controller is configured to control one of the replenishment pressure feeder and the discharge pressure feeder so that a replenishment pressure from the replenishment pressure feeder to the discharge pressure feeder follows a target value, and is configured to control the other of the replenishment pressure feeder and the discharge pressure feeder so that a replenishment flow rate from the replenishment pressure feeder to the discharge pressure feeder follows the target value.

8. The substrate processing apparatus of claim 1, further comprising:
a discharge preparation part configured to open the discharge valve after changing the pressure in the liquid feeder so as to reduce a pressure difference between the inside of the liquid feeder and the inside of the discharge part; and
a discharge controller configured to start discharge of the processing liquid from the nozzle to the substrate in a state in which the discharge valve is opened by the discharge preparation part.

9. The substrate processing apparatus of claim 1, wherein the filter is provided in the connector, and the switching valve is configured to open and close a flow path between the filter and the liquid feeder.

10. The substrate processing apparatus of claim 9, wherein the connector further includes a second switching valve configured to open and close a flow path between the replenishment part and the filter, and
the replenishment preparation part sequentially executes: reducing the pressure difference between the inside of the replenishment part and the inside of the liquid feeder while keeping the switching valve and the second switching valve closed; and reducing a pressure difference between the inside of the connector and the inside of the liquid feeder while keeping the second switching valve opened and keeping the switching valve closed.

11. A control method of a substrate processing apparatus including a discharge part including a nozzle configured to discharge a processing liquid onto a substrate, a liquid feeder configured to feed the processing liquid to the discharge part, a replenishment part configured to replenish the liquid feeder with the processing liquid to be fed to the discharge part and including a liquid source and a replenishment pressure feeder configured to feed the processing liquid from the liquid source to the liquid feeder, a connector including a switching valve configured to open and close a flow path between the replenishment part and the liquid feeder, a filter configured to remove foreign matters contained in the processing liquid replenished from the replenishment part to the liquid feeder, and a discharge valve configured to open and close a flow path between the liquid feeder and the discharge part, wherein the liquid feeder further includes a liquid feeding pipe configured to connect the replenishment part and the discharge part via the filter, a discharge pressure feeder configured to receive the processing liquid from the replenishment part via the liquid feeding pipe and feed the processing liquid to the discharge part via the liquid feeding pipe, a first branch pipe branching from the liquid feeding pipe on an upstream side of the filter and connecting the liquid feeding pipe and the discharge pressure feeder, a second branch pipe branching from the liquid feeding pipe on a downstream side of the filter and connecting the liquid feeding pipe and the discharge pressure feeder, a first connection valve provided in the first branch pipe and configured to open and close a flow path between the liquid feeding pipe and the discharge pressure feeder, a second connection valve provided in the second branch pipe and configured to open and close a flow path between the liquid feeding pipe and the discharge pressure feeder, and a pressure measurement part configured to measure a pressure between the filter and the discharge pressure feeder, the method comprising:

opening the switching valve after reducing a pressure difference between the inside of the replenishment part and the inside of the liquid feeder; and starting replenishment of the processing liquid from the replenishment part to the liquid feeder while keeping the switching valve opened, wherein the switching valve is configured to be opened and closed at an opening degree change rate smaller than an opening degree rate of the first connection valve and an opening degree rate of the second connection valve, and the method further comprising:

in a state in which the discharge valve is closed, controlling the replenishment pressure feeder so that a pressure between the replenishment pressure feeder and the discharge pressure feeder approaches a set value, based on the pressure measured by the pressure measurement part.

12. A non-transitory computer-readable storage medium storing a program that causes an apparatus to execute the control method of claim 11.

\* \* \* \* \*